US012648227B2

(12) United States Patent
　　Liaw

(10) Patent No.:　US 12,648,227 B2
(45) Date of Patent:　Jun. 2, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 408 days.

(21) Appl. No.: 18/366,287

(22) Filed: Aug. 7, 2023

(65) Prior Publication Data

US 2025/0056893 A1　　Feb. 13, 2025

(51) Int. Cl.
| | |
|---|---|
| *H01L 27/12* | (2006.01) |
| *H01L 21/84* | (2006.01) |
| *H10D 86/01* | (2025.01) |
| *H10D 87/00* | (2025.01) |
| *H10D 84/01* | (2025.01) |
| *H10D 84/03* | (2025.01) |

(52) U.S. Cl.
CPC ............. *H10D 87/00* (2025.01); *H10D 86/01* (2025.01); *H10D 84/017* (2025.01); *H10D 84/0188* (2025.01); *H10D 84/038* (2025.01)

(58) Field of Classification Search
CPC .. H10D 62/113; H10D 62/116; H10D 62/118;

H10D 62/119; H10D 62/121; H10D 30/6735; H10D 64/017; H10D 84/853; H01D 30/015; H01D 30/43

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |

(Continued)

*Primary Examiner* — John A Bodnar

(74) *Attorney, Agent, or Firm* — McClure, Qualey & Rodack, LLP

(57) ABSTRACT

A semiconductor structure includes a substrate; a well region disposed in the substrate; first nanostructures suspended over and vertically arranged over the well region; second nanostructures suspended over and vertically arranged over the well region; and a gate structure wrapped around each of the first nanostructures and each of the second nanostructures. The semiconductor structure further includes a first source/drain feature and a second source/drain feature attached to opposite sides of the first nanostructures, wherein each of the first source/drain feature and the second source/drain feature includes a first bottom dielectric layer over the well region and a first doped epitaxial layer over the first bottom dielectric layer; and a third source/drain feature and a fourth source/drain feature attached to opposite sides of the second nanostructures, wherein each of the third source/drain feature and the fourth source/drain feature includes a second doped epitaxial layer over the well region.

20 Claims, 32 Drawing Sheets

(56)     References Cited

U.S. PATENT DOCUMENTS

| | | | | |
|---|---|---|---|---|
| 9,576,814 | B2 | 2/2017 | Wu et al. | |
| 9,608,116 | B2 | 3/2017 | Ching et al. | |
| 2021/0082686 | A1* | 3/2021 | Chiang | H10D 30/6757 |
| 2021/0193836 | A1* | 6/2021 | Guha | H10D 86/60 |

* cited by examiner

20

10

300

340A    307   340B   309    340C

E     C     D

NW1

350A

348A 348D
350B

A ←                  → A 302
350C

346A 346B
322

322

306 { 306A
      306B

308A } 308
308B
350D

348C 350E
304

B ←                  → B

350F

348B 350G
348E

E      C      D 340D     307   340E   309    340F

1800

SEMICONDUCTOR STRUCTURE AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high performance and low leakage applications. A GAA transistor has a gate structure that can extend, partially or fully, around a channel region to provide access to the channel region on two or more sides. While existing GAA transistors may be generally adequate for their intended purposes, they are not entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
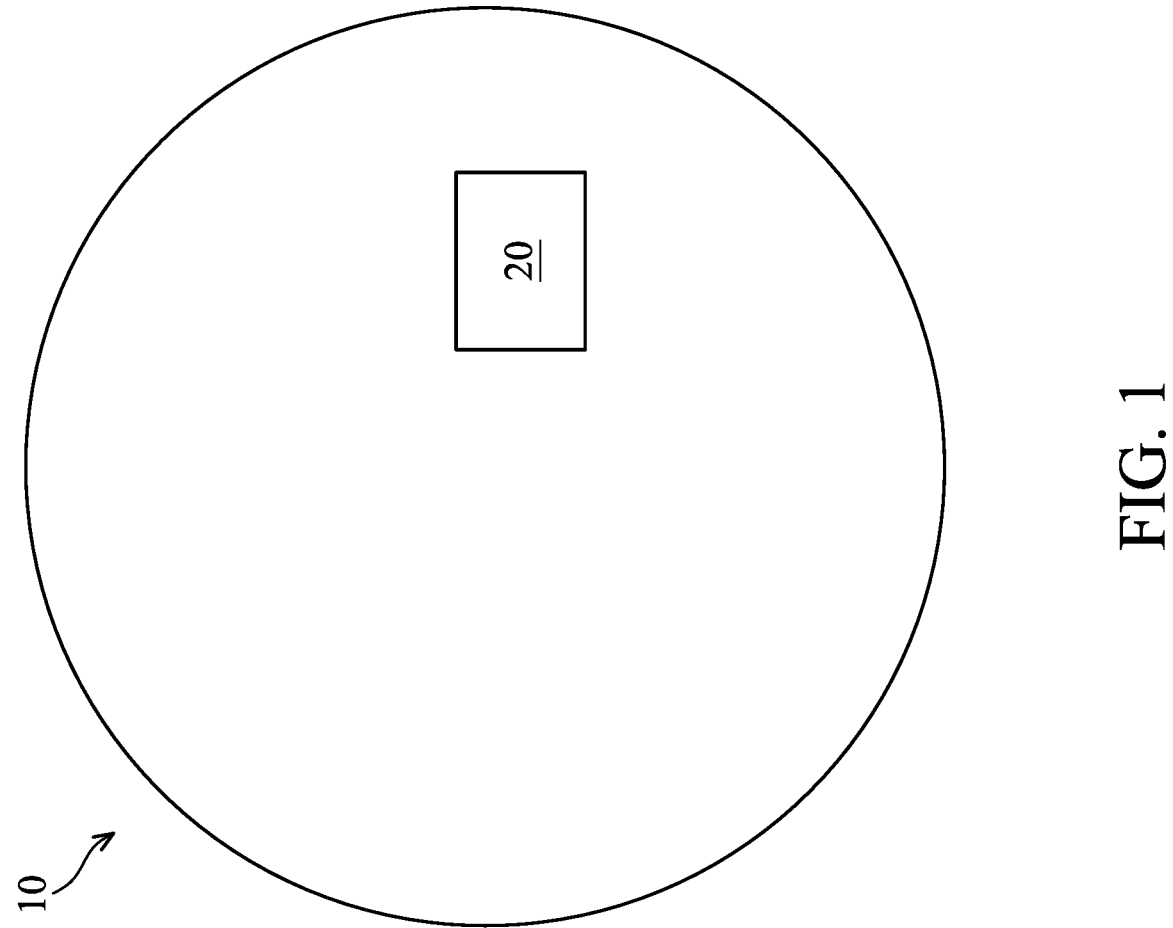
FIG. 1 is a fragmentary diagrammatic top view of an integrated circuit (IC) chip, in portion or entirety, in accordance with some embodiments of the present disclosure

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include an n-type metal-oxide-semiconductor FET (NMOSFET) and a p-type metal-oxide-semiconductor FET (PMOSFET) disposed on an n-type well region. Furthermore, the NMOSFET includes a source/drain (S/D) feature having a bottom dielectric layer disposed between an n-type doped epitaxial layer and the n-type well region. Since both NMOSFET and PMOSFET are disposed on the same n-type well region, the well isolation leakage can be prevented.

In NMOSFET, since the source/drain feature is isolated from the underlying n-type well region by the bottom dielectric layer, the off-state drain-to-bulk leakage current Iboff (also called junction leakage) and the off-state drain-to-source leakage current Isoff can be reduced. Moreover, the capacitance between source/drain feature and gate structure and the capacitance between source/drain feature and bulk (i.e., the substrate) can also be reduced. In PMOSFET, since the source/drain feature without the bottom dielectric layer is epitaxially grown from the underlying n-type well region and may optionally extend into the underlying n-type well, the strain of the source/drain feature can be enhanced and thus the DC performance (e.g., on-state current Ion) can be improved.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise excepted or described.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide-semiconductor (CMOS) transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable regions.

As shown in FIG. 1, the IC chip 10 includes a logic region 20. The logic region 20 may include an array of circuit cells having various logic cells or standard (STD) cells. The logic cells or STD cells may include transistors and interconnect structures that combine to provide a logic device and/or a logic function, such as an inverter, an AND, an NAND, an OR, an NOR, a NOT, an XOR, an XNOR, other suitable logic devices, or combinations thereof. FIG. 1 has been simplified for the sake of clarity to better understand the inventive concepts of the present disclosure. Additional features can be added in the IC chip 10, and some of the features described herein can be replaced, modified, or eliminated in other embodiments of the IC chip 10.

FIGS. 2A to 2E are circuit schematics of various STD cells in the array of circuit cells in the logic region 20 of the IC chip 10, in accordance with some embodiments of the present disclosure.

Figure 2C:
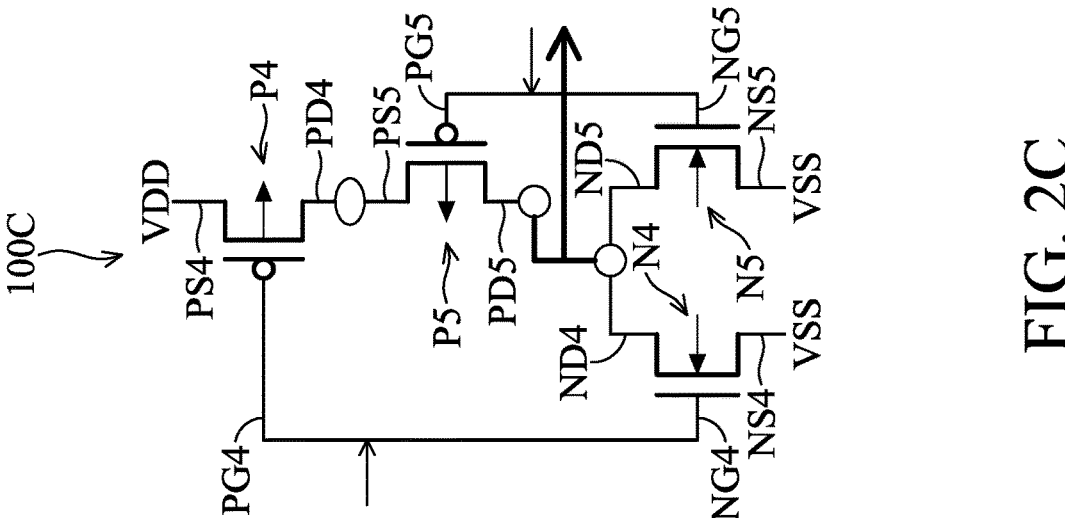
FIGS. 2A, 2B, 2C, 2D, and 2E are circuit schematics of various STD cells in the array of circuit cells in the logic region of the IC chip, in accordance with some embodiments of the present disclosure.
Figure 2B:
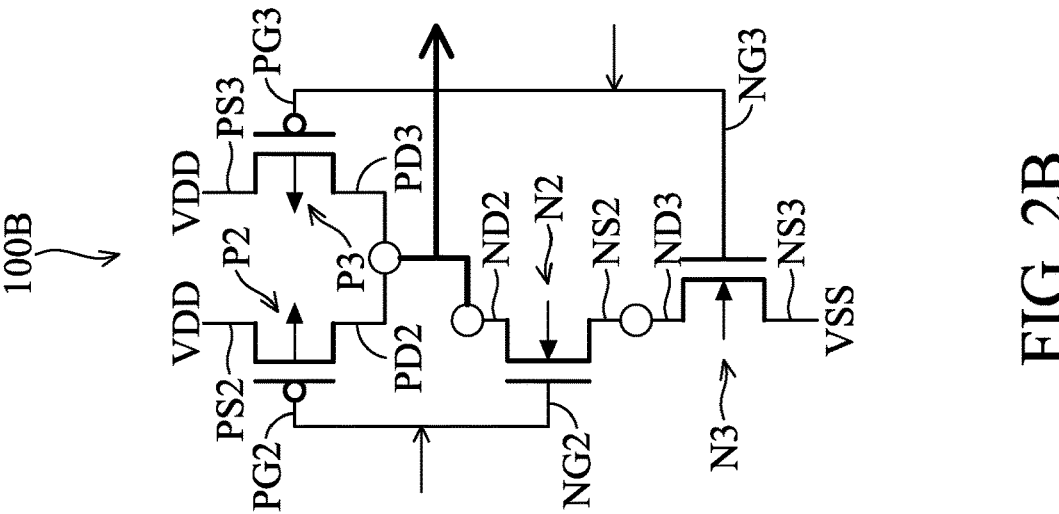
Figure 2A:
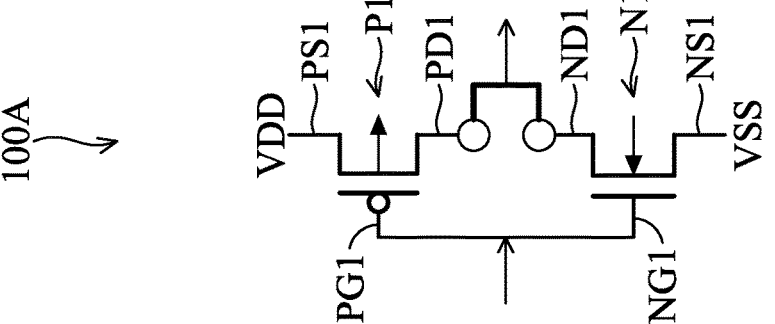

FIG. 2A illustrates an inverter 100A including an n-type transistor N1 and a P-type transistor P1. The n-type transistor N1 includes a source terminal NS1, a drain terminal ND1, and a gate terminal NG1. The P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 2B illustrates a NAND (also referred to as a NAND logic gate, a NAND device or a NAND cell) 100B including n-type transistors N2, N3 and p-type transistors P2, P3. The n-type transistor N2 includes a source terminal NS2, a drain terminal ND2, and a gate terminal NG2, and the n-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as "common drain." The source terminals PS2 and PS3 are coupled to the VDD voltage. The source terminal NS3 is coupled to VSS voltage. The source terminal NS2 and drain terminal ND3 are coupled with each other.

FIG. 2C illustrates a NOR (also referred to as a NOR logic gate, a NOR device or a NOR cell) 100C including n-type transistors N4, N5 and P-type transistors P4, P5. The n-type transistor N4 includes a source terminal NS4, a drain terminal ND4, and a gate terminal NG4, and the n-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage. The source terminal PS5 and drain terminal PD4 are coupled with each other.

Figure 2D:
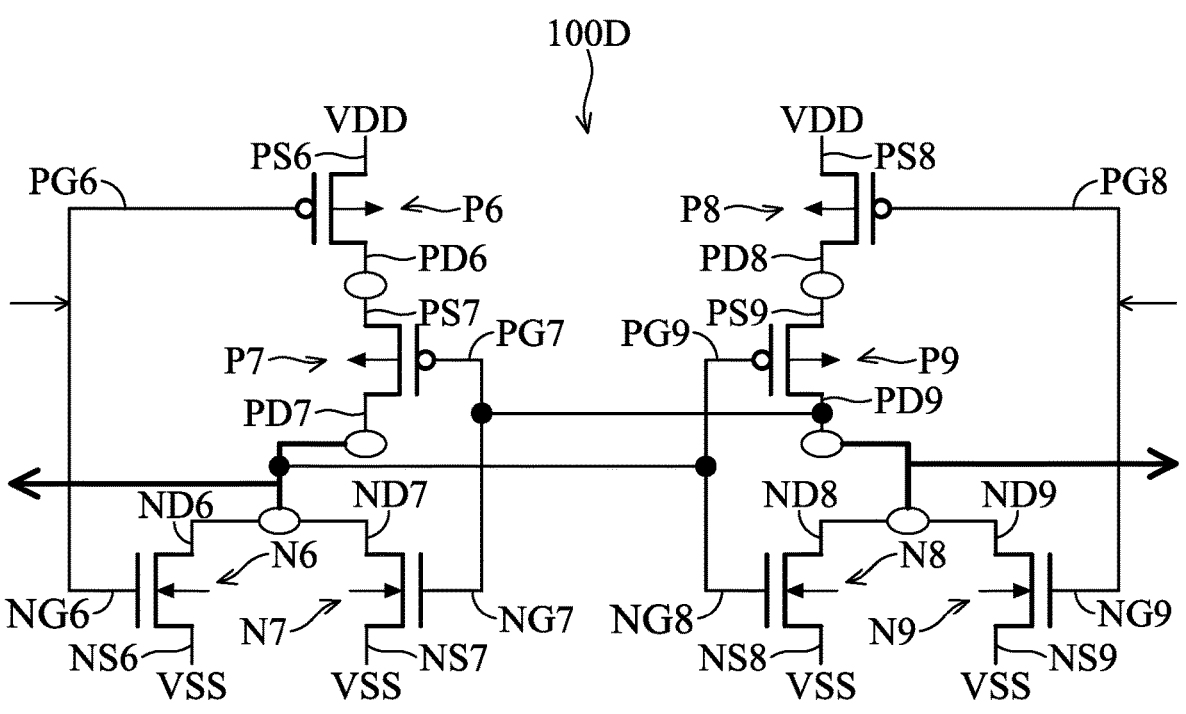

FIG. 2D illustrates a flip-flop (also referred to as a flip-flop device or a flip-flop cell) 100D including n-type transistors N6, N7, N8, N9 and P-type transistors P6, P7, P8, P9. The n-type transistor N6 includes a source terminal NS6, a drain terminal ND6, and a gate terminal NG6; the n-type transistor N7 includes a source terminal NS7, a drain terminal ND7, and a gate terminal NG7; the n-type transistor N8 includes a source terminal NS8, a drain terminal ND8, and a gate terminal NG8; and the n-type transistor N9 includes a source terminal NS9, a drain terminal ND9, and a gate terminal NG9. The P-type transistor P6 includes a source terminal PS6, a drain terminal PD6, and a gate terminal PG6; the P-type transistor P7 includes a source terminal PS7, a drain terminal PD7, and a gate terminal PG7; the P-type transistor P8 includes a source terminal PS8, a drain terminal PD8, and a gate terminal PG8; and the P-type transistor P9 includes a source terminal PS9, a drain terminal PD9, and a gate terminal PG9.

As shown in FIG. 2D, the flip-flop 100D is a set-reset (SR) NOR latch. The NOR latch may include a pair of cross-coupled NOR. Specifically, the output terminal of a first NOR is coupled to the second input terminal of a second NOR, and the output terminal of the second NOR is coupled to the second input terminal of the first NOR. The details of the other connections of the flip-flop 100D are similar to the NOR 100C, and may not be described in detail herein.

Figure 2E:
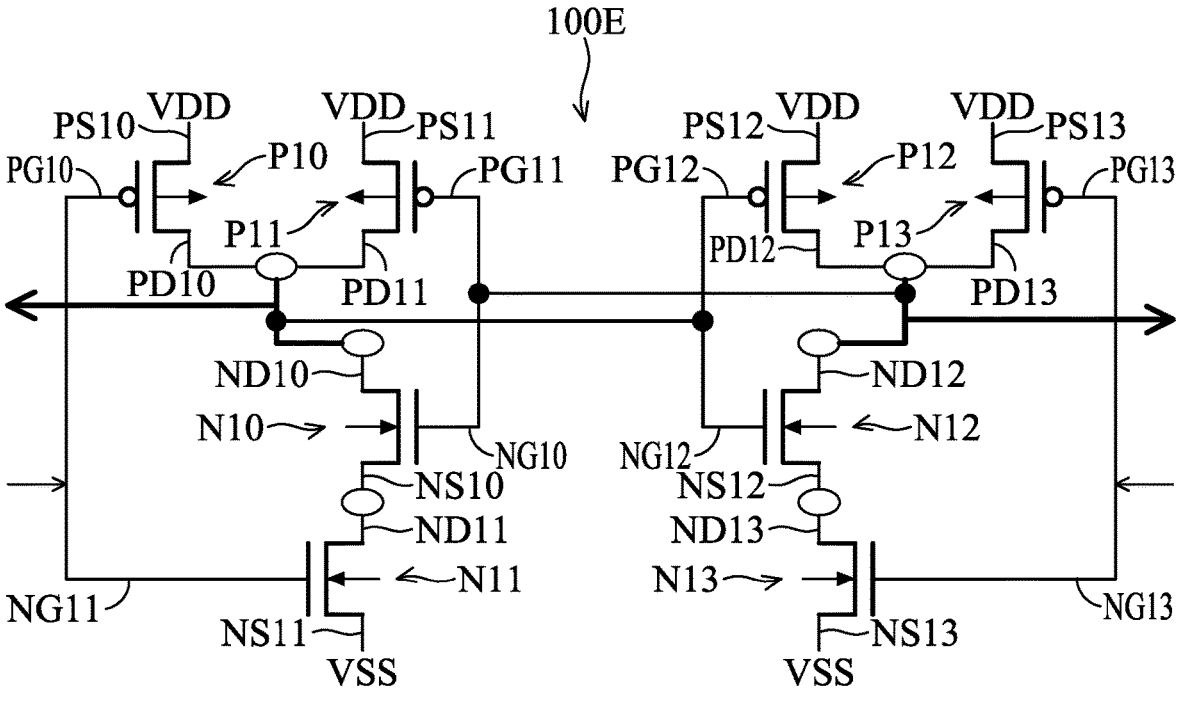

FIG. 2E illustrates a flip-flop 100E including n-type transistors N10, N11, N12, N13 and P-type transistors P10, P11, P12, P13. The n-type transistor N10 includes a source terminal NS10, a drain terminal ND10, and a gate terminal NG10; the n-type transistor N11 includes a source terminal NS11, a drain terminal ND11, and a gate terminal NG11; the n-type transistor N12 includes a source terminal NS12, a drain terminal ND12, and a gate terminal NG12; and the n-type transistor N13 includes a source terminal NS13, a drain terminal ND13, and a gate terminal NG13. The P-type transistor P10 includes a source terminal PS10, a drain terminal PD10, and a gate terminal PG10; the P-type transistor P11 includes a source terminal PS11, a drain terminal PD11, and a gate terminal PG11; the P-type transistor P12 includes a source terminal PS12, a drain terminal PD12, and a gate terminal PG12; and the P-type transistor P13 includes a source terminal PS13, a drain terminal PD13, and a gate terminal PG13.

As shown in FIG. 2E, the flip-flop 100E is a SR NAND latch. The NAND latch may include a pair of cross-coupled NAND. Specifically, the output terminal of a first NAND is coupled to the first input terminal of a second NAND, and the output terminal of the second NAND is coupled to the first input terminal of the first NAND. The details of the other connections of the flip-flop 100E are similar to the NAND 100B, and may not be described in detail herein.

Figure 3:
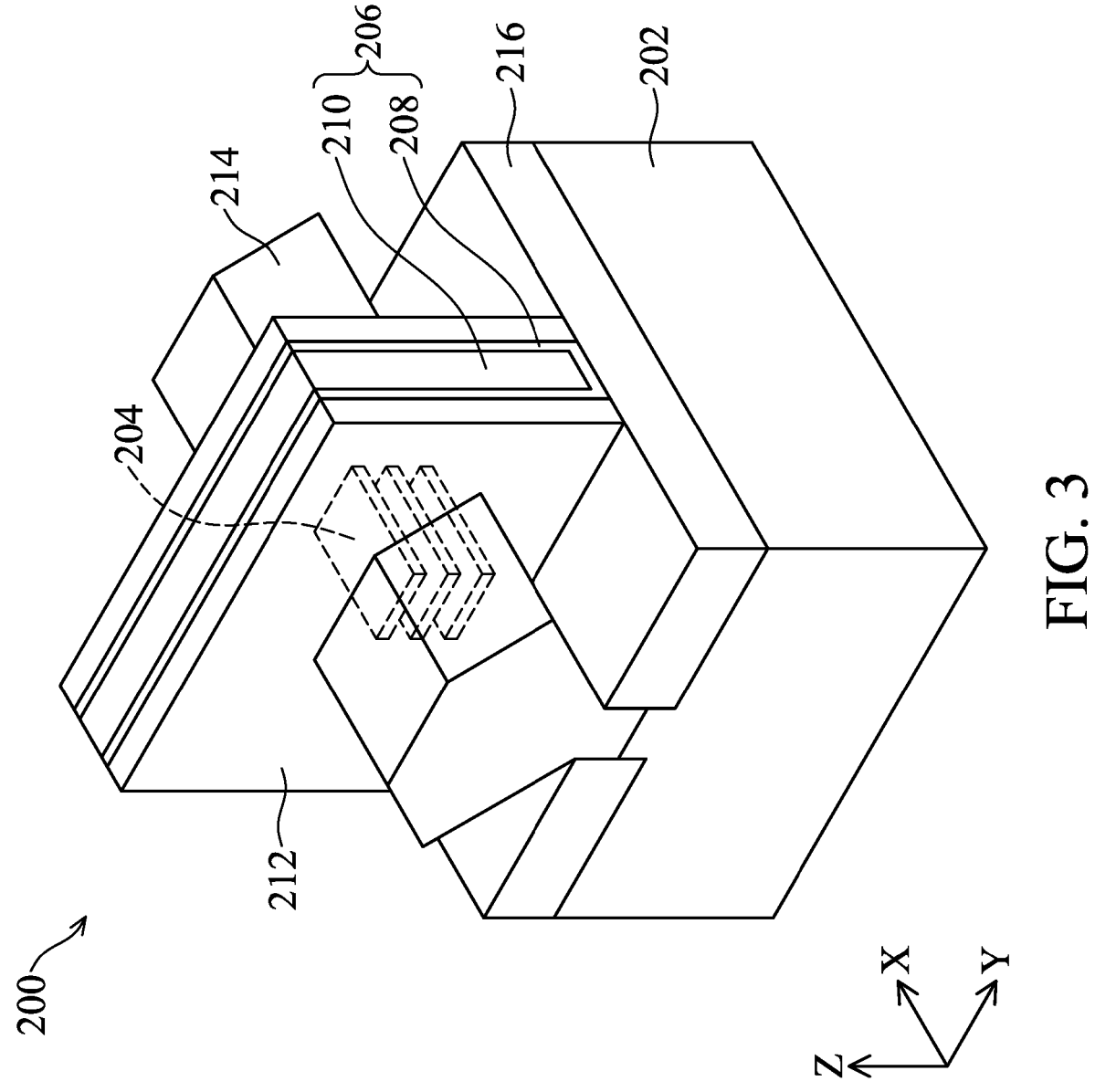
FIG. 3 is a perspective view of a GAA transistor in the array of circuit cells, in accordance with some embodiments of the present disclosure.

Each of the circuit cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 3. However, it should be understood that the application should not be limited to a particular type of device, except as specifically claimed.

Referring to FIG. 3, a perspective view of an exemplary GAA transistor 200 is illustrated. The GAA transistor 200 is formed over a substrate 202. The substrate 202 may contains a semiconductor material, such as bulk silicon (Si). The GAA transistor 200 also includes one or more nanostructures 204 (dash lines) extending in an X-direction and vertically stacked (or arranged) in a Z-direction. More specifically, the nanostructures 204 are spaced from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 3, may refer to FIGS. 5A to 5C). As shown in FIG. 3, gate spacers 212 are on sidewalls of the gate structure 206 and over the nanostructures 204 (not shown in FIG. 3, may refer to FIGS. 4, 5A, and 5B).

The GAA transistor 200 further includes source/drain features 214. As shown in FIG. 3, two source/drain features 214 are on opposite sides of the gate structure 206. The nanostructures 204 extends in the X-direction to connect one source/drain feature 214 to the other source/drain feature 214. The source/drain features 214 may also be referred to as source/drain, or source/drain regions. In some embodiments, source/drain feature(s) may refer to a source or a drain, individually or collectively dependent upon the context.

Isolation structure 216 is over the substrate 202 and under the gate dielectric layer 208, the gate electrode 210, and the gate spacers 212. The isolation structure 216 is used for isolating the GAA transistor 200 from other devices. In some embodiments, the isolation structure 216 may include different structures, such as shallow trench isolation (STI) structure, deep trench isolation (DTI) structure. Therefore, the isolation structure 216 is also referred as to as a STI feature or a DTI feature.

Figure 4:
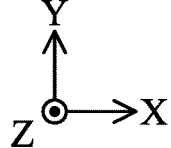
FIG. 4 illustrates a fragmentary diagrammatic top view (or layout) of a semiconductor structure in the logic region of the IC chip, in accordance with some embodiments of the present disclosure.
Figures 5A, 5B:
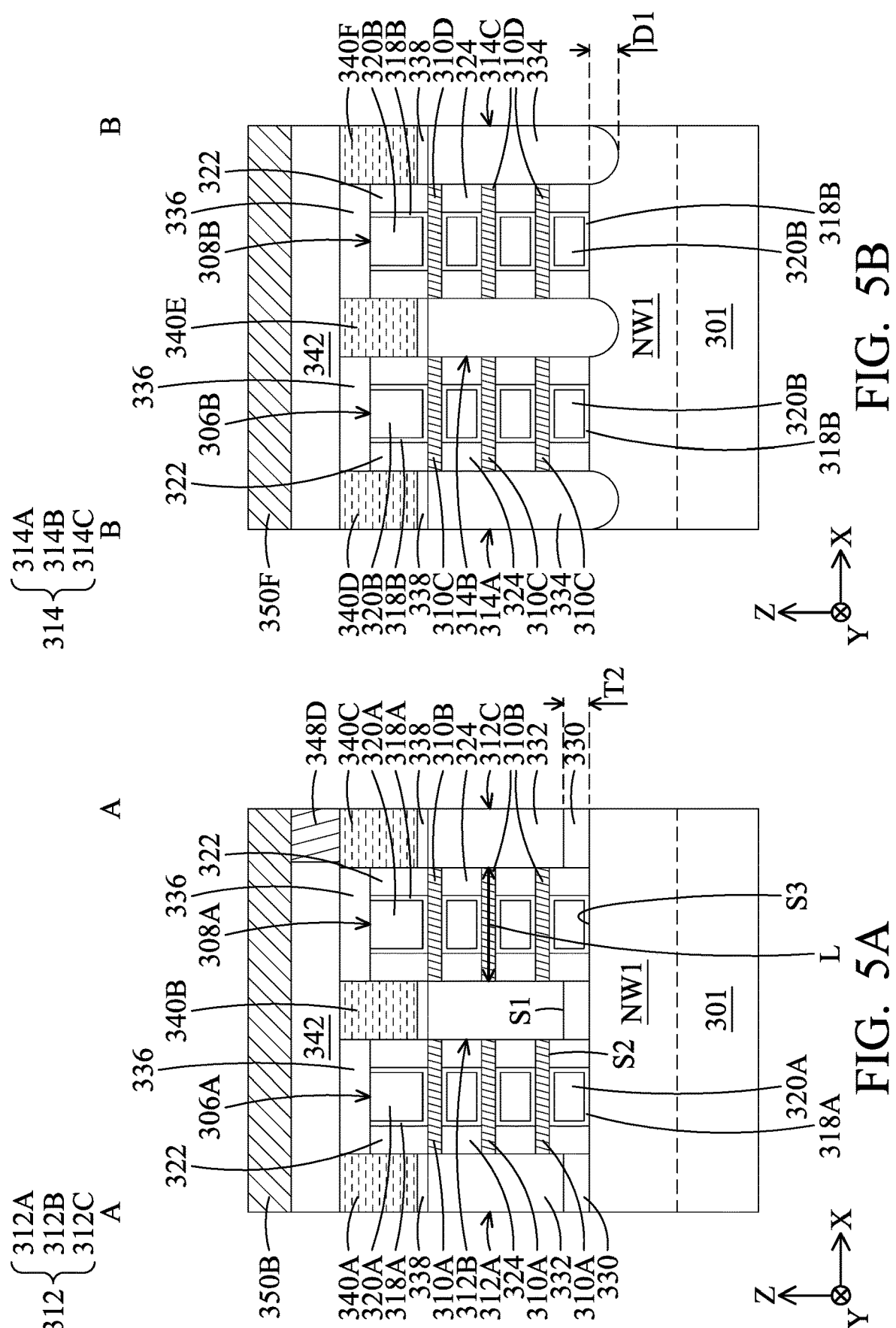
FIG. 5A illustrates a cross-sectional view of the semiconductor structure along a line A-A in FIG. 4, in accordance with some embodiments of the present disclosure.
FIG. 5B illustrates a cross-sectional view of the semiconductor structure along a line B-B in FIG. 4, in accordance with some embodiments of the present disclosure.
Figure 5C:
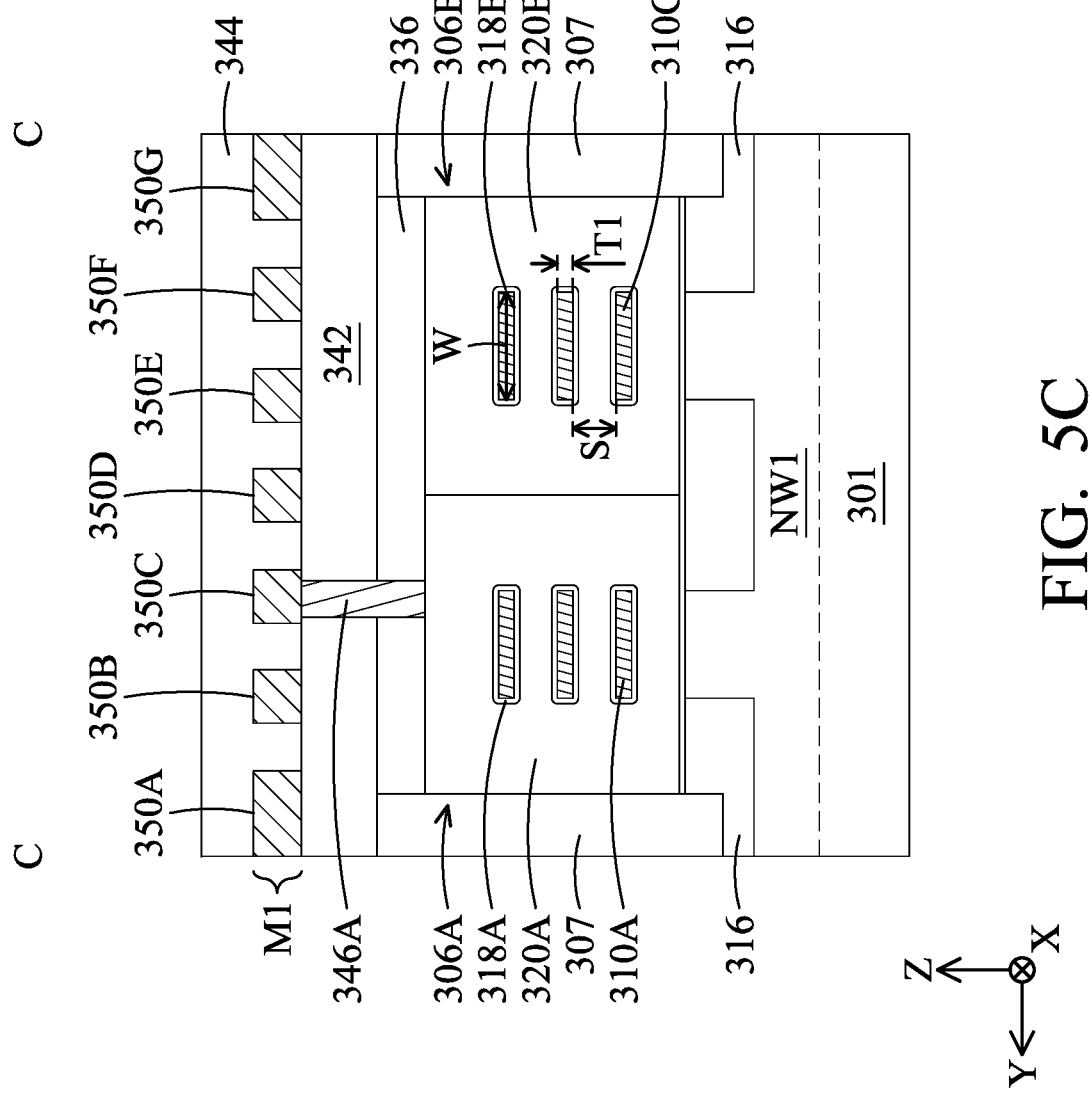
FIG. 5C illustrates a cross-sectional view of the semiconductor structure along a line C-C in FIG. 4, in accordance with some embodiments of the present disclosure.
Figures 5D, 5E:
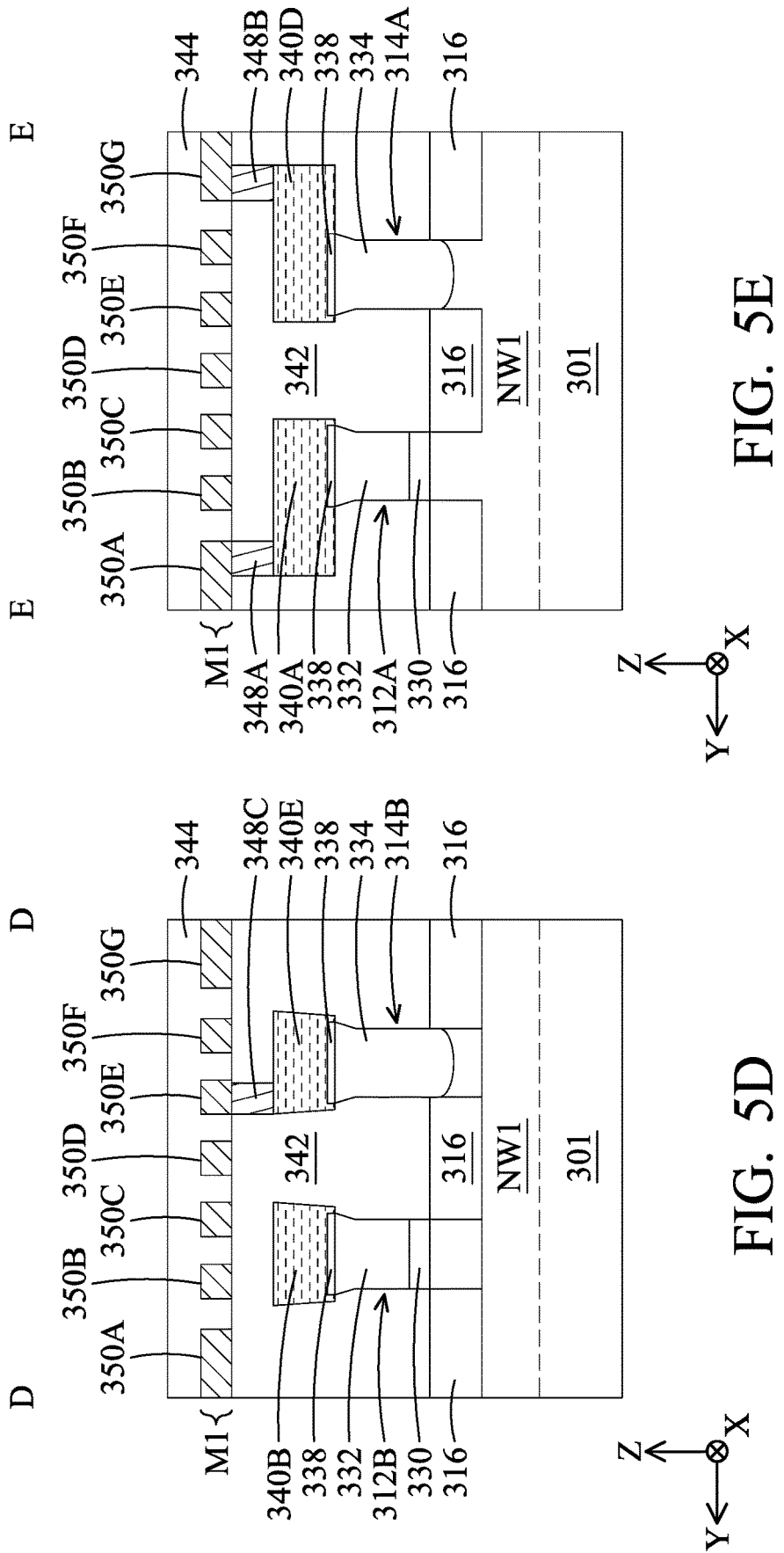
FIG. 5D illustrates a cross-sectional view of the semiconductor structure along a line D-D in FIG. 4, in accordance with some embodiments of the present disclosure.
FIG. 5E illustrates a cross-sectional view of the semiconductor structure along a line E-E in FIG. 4, in accordance with some embodiments of the present disclosure.

FIG. 4 illustrates a fragmentary diagrammatic top view (or layout) of a semiconductor structure 300 that may be disposed in the logic region 20 of the IC chip 10, in accordance with some embodiments of the present disclosure. FIG. 5A illustrates an X-Z cross-sectional view of the semiconductor structure 300 along a line A-A in FIG. 4, in accordance with some embodiments of the present disclosure. FIG. 5B illustrates an X-Z cross-sectional view of the semiconductor structure 300 along a line B-B in FIG. 4, in accordance with some embodiments of the present disclosure. FIG. 5C illustrates a Y-Z cross-sectional view of the semiconductor structure 300 along a line C-C in FIG. 4, in accordance with some embodiments of the present disclosure. FIG. 5D illustrates a Y-Z cross-sectional view of the semiconductor structure 300 along a line D-D in FIG. 4, in accordance with some embodiments of the present disclosure. FIG. 5E illustrates a Y-Z cross-sectional view of the semiconductor structure 300 along a line E-E in FIG. 4, in accordance with some embodiments of the present disclosure.

The semiconductor structure 300 may include CMOS devices, each of the CMOS devices includes an NMOSFET and a PMOSFET. Each of the NMOSFET and the PMOSFET may be an embodiment of the GAA transistor 200. The semiconductor structure 300 may be used to constitute logic circuits or logic devices, such as inverters, NANDs, NORs, flip-flops, or a combinations thereof. In the embodiment depicted in FIG. 4, the semiconductor structure 300 includes two CMOS devices that may constitute a NAND. It should be understood that the embodiment depicted in FIG. 4 is merely an example. The present disclosure can be applied to other logic circuits, such as NORs, ANDs, ORs, flip-flops, or combinations thereof.

Referring to FIGS. 4 and 5A-5E, the semiconductor structure 300 includes an active region 302 and an active region 304 that extend lengthwise in the X-direction, in accordance with some embodiments. Each of active regions 302 and 304 includes channel regions, source regions, and drain regions (where source regions and drain regions are collectively referred to as source/drain regions herein) of transistors (e.g., the GAA transistor 200) of the semiconductor structure 300. The active regions 302 and 304 may be disposed over an n-type well region (or N-Well) NW1. More specifically, the active regions 302 and the active region 304 may be over a first region and a second region of the n-type well region NW1, respectively.

The semiconductor structure 300 may include a common gate structure 306 including gate structures 306A, 306B and a common gate structure 308 including gate structures 308A, 308B. The common gate structures 306 and 308 extend substantially parallel to one another, extend lengthwise in the Y-direction perpendicular to the X-direction, and are separated from each other in the X-direction. The gate structures 306A and 308A are over respective channel regions in the active region 302 and between respective source/drain regions in the active region 302. The gate structures 306B and 308B are over respective channel regions in the active region 304 and between respective source/drain regions in the active region 304.

In some embodiments, the gate structure 306A is engaged with the gate structure 306B, and the gate structure 308A is engaged with the gate structure 308B. In other embodiments, the gate structure 306A is separated from the gate structure 306B by an isolation structure, and/or the gate structure 308A is separated from the gate structure 308B by an isolation structure.

The active regions 302, 304 and the gate structures 306A, 306B, 308A, 308B are configured to provide transistors. In some embodiments, the gate structure 306A engages the active region 302 (e.g., nanostructures 310A and source/drain features 312A, 312B described in more detailed below) to construct a first NMOSFET. In some embodiments, the gate structure 308A engages the active region 302 (e.g., nanostructures 310B and source/drain features 312B, 312C described in more detailed below) to construct a second NMOSFET. In some embodiments, the gate structure 306B engages the active region 304 (e.g., nanostructures 310C and source/drain features 314A, 314B described in more detailed below) to construct a first PMOSFET. In some embodiments, the gate structure 308B engages the active region 304 (e.g., nanostructures 310D and source/drain features 314B, 314C described in more detailed below) to construct a second PMOSFET. In some embodiments, the first NMOSFET and the first PMOSFET constitute a first CMOS device, and the second NMOSFET and the second PMOSFET constitute a second CMOS device. In some embodiments, the first CMOS device and the second CMOS device are interconnected with each other to form a NAND device as NAND 100B described above.

The semiconductor structure 300 may include a substrate 301, over which the various features are formed, such as the common gate structures 306 and 308, nanostructures 310A-310D, and source/drain features 312A-312C and 314A-314C. In some embodiments, the substrate 301 is a p-type substrate. The substrate 301 may contains a semiconductor material, such as bulk silicon (Si). In other embodiments, the substrate 301 may include other semiconductors, such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (Al-GaAs), gallium indium phosphide (GaInP), and indium gallium arsenide (InGaAs). Alternatively, the substrate 301 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

In some embodiments, the n-type well region NW1 is formed in or on the substrate 301. In the embodiment depicted in FIGS. 4 and 5A-5E, the n-type well region NW1 is configured for both n-type and p-type transistors. For example, the first PMOSFET constructed by the gate structure 306B and the active region 304 and the second PMOSFET constructed by the gate structure 308B and the active region 304 are formed on the n-type well region NW1. For example, the first NMOSFET constructed by the gate structure 306A and the active region 302 and the second NMOSFET constructed by the gate structure 308A and the active region 302 are also formed on the n-type well region NW1. The n-type well region NW1 may be doped with n-type dopants, such as phosphorus, arsenic, other n-type dopant, or a combination thereof.

In some embodiments, the substrate 301 further includes other doped regions formed with a combination of p-type dopants and n-type dopants. The p-type dopants may include boron, indium, other p-type dopant, or a combination thereof. The various n-type and p-type wells can be formed directly on or in the substrate 301, for example, providing a p-well structure, an n-well structure, a dual-well structure, a raised structure, or combinations thereof. An ion implantation process, a diffusion process, and/or other suitable doping process may be performed to form the various wells.

Similar to the isolation structure 216 discussed above, the semiconductor structure 300 may further include isolation structures (or isolation features) 316. In some embodiments, the isolation structures 316 are over the substrate 301 and between the active regions 302 and 304. The isolation structures 316 also isolate the adjacent active regions (e.g., the active regions 302 and 304). The isolation structures 316 may include silicon oxide, silicon nitride, silicon oxynitride, other suitable isolation material (for example, including silicon, oxygen, nitrogen, carbon, or other suitable isolation constituent), or combinations thereof. The isolation structures 316 may include different structures, such as STI structures, DTI structures, and/or local oxidation of silicon (LOCOS) structures. In some embodiments, STI features include a multi-layer structure that fills the trenches, such as a silicon nitride comprising layer disposed over a thermal oxide comprising liner layer. In other embodiments, STI features include a dielectric layer disposed over a doped liner layer (including, for example, boron silicate glass (BSG) or phosphosilicate glass (PSG)). In certain embodiments, STI features include a bulk dielectric layer disposed over a liner dielectric layer, where the bulk dielectric layer and the liner dielectric layer include materials depending on design requirements.

Each transistor in the semiconductor structure 300 includes nanostructures similar to the nanostructures 204 discussed above. In some embodiments, the nanostructures 310A constituting a vertical stack are suspended and vertically arranged over the n-type well region NW1 and in the active region 302, as shown in FIG. 5A. In some embodiments, the nanostructures 310B constituting a vertical stack are suspended and vertically arranged over the n-type well region NW1 and in the active region 302, as shown in FIG. 5A. In some embodiments, the nanostructures 310C constituting a vertical stack are suspended and vertically arranged over the n-type well region NW1 and in the active region 304, as shown in FIG. 5B. In some embodiments, the nanostructures 310D constituting a vertical stack are suspended and vertically arranged over the n-type well region NW1 and in the active region 304, as shown in FIG. 5B. For the purpose of simplicity, the nanostructures 310A, 310B, 310C, and 310D may be collectively referred to as nanostructures 310. In the depicted embodiments, three nanostructures 310 are vertically stacked (or vertically arranged) from each other in the Z-direction for one transistor. However, there may be another appropriate number of nanostructures in one transistor. For example, there may be from 2 to 10 nanostructures 310 in one transistor.

In some embodiments, the nanostructures 310 extend lengthwise in the X-direction (see FIGS. 5A and 5B) and widthwise in the Y-direction (see FIG. 5C). In some embodiments, each of the nanostructures 310 has a length L in the X-direction, the length L is in a range from about 6 nm to about 30 nm, as shown in FIG. 5A. In some embodiments, each of the nanostructures 310 has a width W in the Y-direction, the width W is in a range from about 4 nm to about 70 nm, as shown in FIG. 5C. In some embodiments, each of the nanostructures 310 has a thickness T1 in the Z-direction, the thickness T1 is in a range from about 4 nm to about 10 nm, as shown in FIG. 5C. In some embodiments, nanostructures 310 are spaced from each other in the Z-direction by a spacing S in a range from about 6 nm to about 16 nm, as shown in FIG. 5C. In some embodiments, the nanostructures 310 has vertically a pitch P (P=T1+S) in the Z-direction, the pitch P is in a range from about 8 nm to about 20 nm.

The nanostructures 310 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 310A and 310B include silicon for n-type transistors. In other embodiments, the nanostructures 310C and 310D include silicon germanium for p-type transistors. In some embodiments, the nanostructures 310 are all made of silicon, and the type of the transistors depends on the work function metal layer that is wrapped around the nanostructures 310. In some embodiments, the nanostructures 310 are epitaxially grown using an epitaxial growth such as vapor-phase epitaxy (VPE), metal-organic CVD (MOCVD), molecular beam epitaxy (MBE), although other deposition processes, such as chemical vapor deposition (CVD), low pressure CVD (LPCVD), plasma-enhanced CVD (PECVD), atomic layer deposition (ALD), ultrahigh vacuum CVD (UHVCVD), reduced pressure CVD (RPCVD), a combination thereof, or the like, may also be utilized.

In some embodiments, the semiconductor structure 300 further includes gate end dielectrics 307 and gate end dielectrics 309. In some embodiments, the gate end dielectrics 307 and 309 are disposed on the opposite sides of the common gate structure 306 and 308 in the Y direction, respectively, as shown in FIGS. 4 and 5C. In some embodiments, the gate end dielectrics 307 and 309 may include a dielectric material such as silicon oxide, silicon nitride, silicon oxynitride, SiCN, the like, or a combination thereof. The methods of forming gate end dielectrics 307 and 309 may include forming dielectric material using a deposition process such as ALD, CVD, or the like, and then performing an etching process such as an anisotropic etching process, although any suitable processes may be used.

In some embodiments, the gate structure 306A wraps around each of nanostructures 310A, the gate structure 308A wraps around each of nanostructures 3101B, the gate structure 306B wraps around each of nanostructures 310C, and the gate structure 308B wraps around each of nanostructures 310D.

In some embodiments, the gate structures 306A and 308A each has a gate dielectric layer 318A and a gate electrode layer 320A, as shown in FIGS. 5A and 5C. The gate dielectric layers 318A wrap around each of the nanostructures 310A and 3101B, and the gate electrode layers 320A wrap around the gate dielectric layers 318A. In some embodiments, the gate structures 306B and 308B each has a gate dielectric layer 318B and a gate electrode layer 320B, as shown in FIGS. 5B and 5C. The gate dielectric layers 318B wrap around each of the nanostructures 310C and 310D, and the gate electrode layers 320B wrap around the gate dielectric layers 318B. In some embodiments, each of the gate structures 306A, 306B, 308A, 308B further includes an interfacial layer (such as silicon dioxide, silicon oxynitride, or other suitable material layers) between the gate dielectric layer (e.g., gate dielectric layers 318A and 318B) and the nanostructures (e.g., nanostructures 310A, 310B, and 310C, 310D).

In some embodiments, the gate dielectric layers 318A and 318B may include oxide with nitrogen doped dielectric material (initial layer) combined with metal content high-k dielectric material (k value (dielectric constant)>7.9). For example, the gate dielectric layers 318A and 318B may include hafnium oxide ($HfO_2$), which has a dielectric constant in a range from about 18 to about 40. Alternatively, the gate dielectric layers 318A and 318B may include other high-k dielectric materials, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable materials. The gate dielectric layers 318A and 318B may include the same or different material compositions. The gate dielectric layers 318A and 318B may be formed by chemical oxidation, thermal oxidation, ALD, CVD, and/or other suitable methods.

In some embodiments, the gate electrode layers 320A are formed to wrap around the gate dielectric layers 318A and the center portions of the nanostructures 310A and 3101B, as shown in FIGS. 5A and 5C. In some embodiments, the gate electrode layers 320B are formed to wrap around the gate dielectric layers 318B and the center portions of the nanostructures 310C and 310D, as shown in FIGS. 5B and 5C. In some embodiments, the gate electrode layers 320A may include one or more n-type work function metal layers for n-type transistors. In some embodiments, the n-type work function metal layer may include a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. In some embodiments, the gate electrode layers 320B may include one or more p-type work function metal layers for p-type transistors. In some embodiments, the p-type work function metal layer may include a material such as such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other suitable p-type work function materials, or combinations thereof. The n-type work function metal layer and the p-type work function metal layer may be deposited utilizing ALD, CVD, or the like. However, any suitable materials and processes may be utilized to form the n-type work function metal layer and the p-type work function metal layer.

In some embodiments, each of the gate electrode layers 320A and 320B may include a single layer or alternatively a multi-layer structure. In some embodiments, each of the gate electrode layers 320A and 320B may further include a capping layer, a barrier layer, and a fill material (not shown). The capping layer may be formed adjacent to the gate dielectric layers 318A, 318B and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a different material than the capping layer. For example, the barrier layer may be formed of one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as ALD, CVD, or the like, although any suitable deposition process may be used. In some embodiments, the fill material may include a suitable conductive material, such as Al, W, and/or Cu. In some embodiments, the fill material may be deposited using a deposition process such as ALD, CVD, or the like, although any suitable deposition process may be used.

Similar to the gate spacers 212 discussed above, the semiconductor structure 300 may further include gate spacers 322 on sidewalls of the gate structures 306A, 306B, 308A, and 308B, and over the nanostructures 310, as shown in FIGS. 4, 5A, and 5B. Furthermore, the gate spacers 322 extend lengthwise in the Y-direction (e.g., parallel to the common gate structures 306 and 308), and are on opposite sides (or on opposite sidewalls) of the common gate structures 306 and 308 in the X-direction, as shown in FIG. 4. The gate spacers 322 are over the nanostructures 310 and on top sidewalls of the gate structures 30 A, 306B, 308A, and 308B, and thus are also referred to as gate top spacers or top spacers. The gate spacers 322 may include one or more dielectric materials selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 322 may include a single layer or a multi-layer structure.

In some embodiments, the semiconductor structure 300 further includes inner spacers 324 on the sidewalls of the gate structures 306A, 306B, 308A, and 308B, and below the topmost nanostructures 310 and the gate spacers 322. Furthermore, the inner spacers 324 are laterally between source/drain features and gate structures, such as between the source/drain features 312A/312B and the gate structure 306A, between the source/drain features 312B/312C and the gate structure 308A, between the source/drain features 314A/314B and the gate structure 306B, and between the source/drain features 314B/314C and the gate structure 308B. The inner spacers 324 are also vertically between adjacent nanostructures 310 and between bottommost nanostructures 310 and the substrate 301.

In some embodiments, the inner spacers 324 may include one or more dielectric materials selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or combinations thereof. In some embodiments, the inner spacers 324 include a dielectric material having higher k value (dielectric constant) than the gate spacers 322. In other embodiments, the inner spacers 324 include a dielectric material having lower k value than the gate spacers 322.

In some embodiments, the gate spacers 322 have a thickness in the X-direction that is in a range from about 3 nm to about 15 nm, and the inner spacers 324 have a thickness in the X-direction that is in a range from about 2 nm to about 12 nm. In some embodiments, the thickness of the gate spacers 322 in the X-direction and the thickness of the inner spacers 324 in the X-direction are the same. In other embodiments, the thickness of the gate spacers 322 in the X-direction is greater than the thickness of the inner spacers 324 in the X-direction, and the difference between the thicknesses of the gate spacer 322 and the inner spacers 324 is in a range from about 0.5 nm to about 3 nm.

In some embodiments, the semiconductor structure 300 further includes the source/drain features 312A-312C (may be collectively referred to as source/drain features 312) over the substrate 301 and in the source/drain regions of the active region 302, as shown in FIGS. 5A, 5D, and 5E. More specifically, the source/drain features 312A and 312B are attached to opposite sides of the nanostructures 310A, and the gate structure 306A is between the source/drain features 312A and 312B. The source/drain features 312B and 312C are attached to opposite sides of the nanostructures 3101B, and the gate structure 308A is between the source/drain features 312B and 312C.

In some embodiments, the semiconductor structure 300 further includes the source/drain features 314A-314C (may be collectively referred to as source/drain features 314) over the substrate 301 and in the source/drain regions of the active region 304, as shown in FIGS. 5B, 5D, and 5E. More specifically, the source/drain features 314A and 314B are attached to opposite sides of the nanostructures 310C, and the gate structure 306B is between the source/drain features 314A and 314B. The source/drain features 314B and 314C are attached to opposite sides of the nanostructures 3101D, and the gate structure 308B is between the source/drain features 314B and 314C.

In some embodiments, each of the source/drain features 312A-312C includes a bottom dielectric layer 330 over the n-type well region NW1 and a doped epitaxial layer 332 over the bottom dielectric layer 330, such that the bottom dielectric layer 330 is between the doped epitaxial layer 332 and the n-type well region NW1, as shown in FIGS. 5A, 5D, and 5E. In some embodiments, the bottom dielectric layer 330 may be a single dielectric layer or a multiple dielectric layers structure, and may include one or more dielectric materials, such as silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In other embodiments, the bottom dielectric layer 330 includes high-k dielectric materials, such as $HfO_2$, $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfLaO$, $HfSiO$, $LaSiO$, $AlSiO$, $HfTaO$, $HfTiO$, $(Ba,Sr)TiO_3$ (BST), $Al_2O_3$, combinations thereof, or other suitable materials. In some embodiments, the bottom dielectric layer 330 may be formed using a deposition process such as ALD, CVD, or the like, although any suitable deposition process may be used.

In some embodiments, the bottom dielectric layer 330 is indirect contact with the n-type well region NW1, and is sandwiched between the n-type well region NW1 and the doped epitaxial layer 332, as shown in FIGS. 5A, 5D, and 5E. In some embodiments, the bottom dielectric layer 330 has a top surface S1 that is lower than a bottom surface S2 of the bottommost one of the nanostructures 310A (and also lower than the bottom surface of the bottommost one of the nanostructures 310B). In some embodiments, the top surface S1 is lower than the bottom surface S2 by a distance in a range from about 1 nm to about 5 nm, such as from about 1 nm to about 2 nm. In some embodiments, the top surface S1 of the bottom dielectric layer 330 is higher than a top surface S3 of the n-type well region NW1, the top surface S3 is an interface between the gate structure 306A/308A and the n-type well region NW1 (substrate 301). In other words, the bottom surface of the doped epitaxial layer 332 is lower than the bottom surface S2 of the bottommost one of the nano-structures 310A, and is higher than the top surface S3 of the n-type well region NW1. In some embodiments, the bottom dielectric layer 330 has a thickness T2 in the Z-direction, the thickness T2 is in a range from about 2 nm to about 30 nm, as shown in FIG. 5A.

In some embodiments, the doped epitaxial layer 332 may be formed by using epitaxial growth. In some embodiments, the doped epitaxial layer 332 may include epitaxially-grown material selected from a group consisting of SiP, SiC, SiPC, SiAs, Si, or a combination thereof. In some embodiments, the doped epitaxial layer 332 is an n-type doped epitaxial layer, and the epitaxially-grown material of the doped epitaxial layer 332 may be doped with n-type dopants (such as phosphorus, arsenic, other n-type dopant, or combinations thereof) and have a doping concentration in a range from about $2 \times 10^{19}/cm^3$ to $3 \times 10^{21}/cm^3$.

As described above, in some embodiments, the gate structures 306A/308A and the active region 302 including the source/drain features 312A-312C may constitute NMOSFETs. Therefore, in these embodiments, the source/drain features 312A-312C are applied for NMOSFET. For the NMOSFET, the short circuit between the n-type source/drain (e.g., the doped epitaxial layer 332) and the underlying n-well (e.g., the n-type well region NW1) can be avoided by forming the bottom dielectric layer 330 between the doped epitaxial layer 332 and the n-type well region NW1. Therefore, the NMOSFET can be formed over the n-type well region, and thus the NMOSFET and PMOSFET can be formed over the same single n-type well region. Since the NMOSFET and PMOSFET are formed over a single n-type well region instead of two well regions (i.e., a p-type and an n-type well regions), the well process can be simplified and the well isolation leakage can be prevented.

Moreover, since the n-type source/drain (e.g., the doped epitaxial layer 332) is isolated from the underlying n-well (e.g., n-type well region NW1) by the bottom dielectric layer 330, the off-state drain-to-bulk leakage current Iboff (also called junction leakage) and the off-state drain-to-source leakage current Isoff can be reduced. Furthermore, the capacitance between source/drain feature and gate structure and the capacitance between source/drain feature and bulk (i.e., the substrate) can also be reduced.

In some embodiments, each of the source/drain features 314A-314C includes a doped epitaxial layer 334 over the n-type well region NW1, as shown in FIGS. 5B, 5D, and 5E. In some embodiments, the doped epitaxial layer 334 may be formed by using epitaxial growth. In some embodiments, the doped epitaxial layer 334 may include epitaxially-grown material selected from a group consisting of boron-doped SiGe, boron-doped SiGeC, boron-doped Ge, boron-doped Si, boron and carbon doped SiGe, or combinations thereof. In some embodiments, the doped epitaxial layer 334 is an p-type doped epitaxial layer, and the epitaxially-grown material of the doped epitaxial layer 334 may be doped with p-type dopants (such as boron, indium, other p-type dopant, or combinations thereof) and have a doping concentration in a range from about $1 \times 10^{19}/cm^3$ to $6 \times 10^{20}/cm^3$. In some embodiments, the doped epitaxial layer 334 extend into the n-type well region NW1, and is in direct contact with the n-type well region NW1. In some embodiments, the doped epitaxial layer 334 extend into the n-type well region NW1 in the Z-direction by a depth D1 that is in a range from about 5 nm to about 50 nm. In some embodiments, one or more annealing processes may be performed to activate the dopants in the doped epitaxial layers 332 and 334. The annealing processes may include rapid thermal annealing (RTA) and/or laser annealing processes.

As described above, in some embodiments, the gate structures 306B/308B and the active region 304 including the source/drain features 314A-314C may constitute PMOS-FETs. Therefore, in these embodiments, the source/drain features 314A-314C are applied for PMOSFET. For the PMOSFET, compared to the NMOSFET described above, the source/drain features 314A-314C are free of bottom dielectric layer. Therefore, the source/drain features 314A-314C (i.e., the doped epitaxial layer 334) can be epitaxially grown form the underlying n-type well region NW1, and may optionally extend into the underlying n-type well region NW1. Which can enlarge the volume of the source/drain features 314A-314C and enhance the strain of the source/drain features 314A-314C. Therefore, the channel mobility and the DC performance (e.g., on-state current Ion) of the PMOSFET can be improved.

In some embodiments, the semiconductor structure 300 further includes gate top dielectrics 336 over the gate structures 306A, 306B, 308A, and 308B, as shown in FIGS. 5A-5C. In some embodiments, the gate top dielectrics 336 are also over the gate spacers 322. In some embodiments, the gate top dielectrics 336 may include dielectric materials, such as $SiO_2$, SiOC, SiON, SiOCN, carbon doped oxide, nitrogen doped oxide, carbon and nitrogen doped oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, and a combination thereof. In some embodiments, the gate top dielectrics 336 may each include a single layer or a multi-layer structure. In some embodiments, the gate top dielectrics 336 has a thickness in the Z-direction that is in a range from about 2 nm to about 60 nm.

In some embodiments, the semiconductor structure 300 further includes source/drain contacts 340A-340F (may be collectively referred to as source/drain contacts 340) that extend in the Y-direction, as shown in FIGS. 4, 5A, 5B, 5D, and 5E. In some embodiments, the source/drain contacts 340A, 340B, and 340C are over and electrically connected to the source/drain features 312A, 312B, and 312C, respectively. In some embodiments, the source/drain contacts 340A and 340B are on the opposite sides of the gate structure 306A, and the source/drain contacts 340B and 340C are on the opposite sides of the gate structure 308A. In some embodiments, the source/drain contacts 340D, 340E, and 340F are over and electrically connected to the source/drain features 314A, 314B, and 314C, respectively. In some embodiments, the source/drain contacts 340D and 340E are on the opposite sides of the gate structure 306B, and the source/drain contacts 340E and 340F are on the opposite sides of the gate structure 308B.

Each of the source/drain contacts 340 may include a conductive material, such as Al, Cu, W, Co, Ru, Mo, Ti, Ta, Ru, Rh, Ir, Pt, TiN, TiAl, TiAlN, TaN, TaC, combinations thereof, or the like, and may be deposited using a deposition process such as sputtering, physical vapor deposition (PVD), CVD, ALD, electroplating, electroless plating, or the like. However, any suitable materials and processes may be utilized to form source/drain contacts 340. In some embodiments, the source/drain contacts 340 may each include single conductive material layer or multiple conductive material layers.

In some embodiments, the top surfaces of the source/drain contacts 340 are substantially coplanar with the top surfaces of the gate top dielectrics 336. In the embodiments where the gate top dielectrics 336 are omitted, the top surfaces of the source/drain contacts 340 are substantially coplanar with the top surfaces of the gate structures (e.g., the gate structures 306A, 306B, 308A, and 308B). In other embodiments, the top surfaces of the source/drain contacts 340 are higher than the top surfaces of the gate top dielectrics 336.

In some embodiments, the semiconductor structure 300 further includes silicide layers 338, as shown in FIGS. 5A, 5B, 5D, and 5E. In some embodiments, the silicide layers 338 are between source/drain features 312A-312C, 314A-314C and the source/drain contacts 340. In some embodiments, the silicide layers 338 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In some embodiments, the semiconductor structure 300 further includes an inter-layer dielectric (ILD) layer 342 that is over the substrate 301, over the isolation structure 316, over the gate structures 306A/306B/308A/308B, between the source/drain features 312/314, and between the source/drain contacts 340, as shown in FIGS. 5A-5E. In some embodiments, the semiconductor structure 300 further includes an inter-metal dielectric (IMD) layer 344 over the ILD layer 342, the source/drain contacts 340, and the gate structures 306A/306B/308A/308B, as shown in FIGS. 5C-5E.

The ILD layer 342 and the IMD layer 344 may include a dielectric material including, for example, silicon oxide, silicon nitride, silicon oxynitride, TEOS-formed oxide, PSG, borophosphosilicate glass (BPSG), low-k dielectric material, other suitable dielectric material, or combinations thereof. Exemplary low-k dielectric materials include fluoride-doped silica glass (FSG), carbon doped silicon oxide, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other low-k dielectric material, or combinations thereof. In some embodiments, the ILD layer 342 and the IMD layer 344 are a dielectric layer that includes a low-k dielectric material (generally referred to as a low-k dielectric layer). The ILD layer 342 and the IMD layer 344 may include a multi-layer structure having multiple dielectric materials.

In some embodiments, the semiconductor structure 300 further includes gate vias 346A-346B, source/drain vias 348A-348E, and a metal layer M1, as shown in FIGS. 4 and 5A-5E. The gate vias 346A-346B and the source/drain vias 348A-348E are in the ILD layer 342, and the metal layer M1 is in the IMD layer 344. The materials of the gate vias 346A-346B, the source/drain vias 348A-348E, and the metal layer M1 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or combinations thereof.

In some embodiments, the metal layer M1 includes metal conductors 350A-350G that extend in the X-direction, and are over and electrically connected to the respective gate structures and the respective source/drain contacts, as shown in FIGS. 4 and 5A-5E. For example, the gate via 346A is on the common gate structure 306 and the metal conductor 350C is on the gate via 346A, such that the metal conductor 350C is electrically coupled to the common gate structure 306 through the gate via 346A. For example, the gate via 346B is on the common gate structure 308 and the metal conductor 350D is on the gate via 346B, such that the metal conductor 350D is electrically coupled to the common gate structure 308 through the gate via 346B.

For example, the source/drain via 348A is on the source/drain contact 340A and the metal conductor 350A is on the source/drain via 348A, such that the metal conductor 350A is electrically coupled to the source/drain contact 340A through the source/drain via 348A. For example, the source/drain via 348B is on the source/drain contact 340D and the metal conductor 350G is on the source/drain via 348B, such that the metal conductor 350G is electrically coupled to the source/drain contact 340D through the source/drain via 348B. For example, the source/drain via 348C is on the source/drain contact 340E and the metal conductor 350E is on the source/drain via 348C, such that the metal conductor 350E is electrically coupled to the source/drain contact 340E through the source/drain via 348C. For example, the source/drain via 348D is on the source/drain contact 340C and the metal conductor 350B is on the source/drain via 348D, such that the metal conductor 350B is electrically coupled to the source/drain contact 340C through the source/drain via 348D. For example, the source/drain via 348E is on the source/drain contact 340F and the metal conductor 350G is on the source/drain via 348E, such that the metal conductor 350G is electrically coupled to the source/drain contact 340F through the source/drain via 348E.

As described above, in some embodiments, the semiconductor structure 300 includes a first CMOS device and a second CMOS device that collectively form a NAND device. In these embodiments, the metal conductor 350A may be a low voltage power line, such as a VSS power line, and the metal conductor 350G may be a high voltage power line, such as a VDD power line. In these embodiments, the source/drain contact 340A (i.e., a source terminal of first NMOSFET) is couple to the metal conductor 350A (i.e., the VSS power line) through the source/drain via 348A. The source/drain contact 340D (i.e., a source terminal of first PMOSFET) and the source/drain contact 340F (i.e., a source terminal of second PMOSFET) are couple to the metal conductor 350G (i.e., the VDD power line) through the source/drain via 348B and the source/drain via 348E, respectively. In these embodiments, the first and second NMOSFETs share the source/drain feature 312B and the source/drain contact 340B (i.e., a drain terminal of first NMOSFET and a source terminal of second NMOSFET). The first and second PMOSFETs share the source/drain feature 314B and the source/drain contact 340E (i.e., drain terminals of first and second PMOSFET) that is coupled to the source/drain contact 340C (i.e., a drain terminal of second NMOSFET). The source/drain contact 340E is coupled to the source/drain contact 340C through the source/drain vias 348C-348D, metal layer M1, and other metal layer overlying the metal layer M1 (not shown).

Figures 6, 7A:
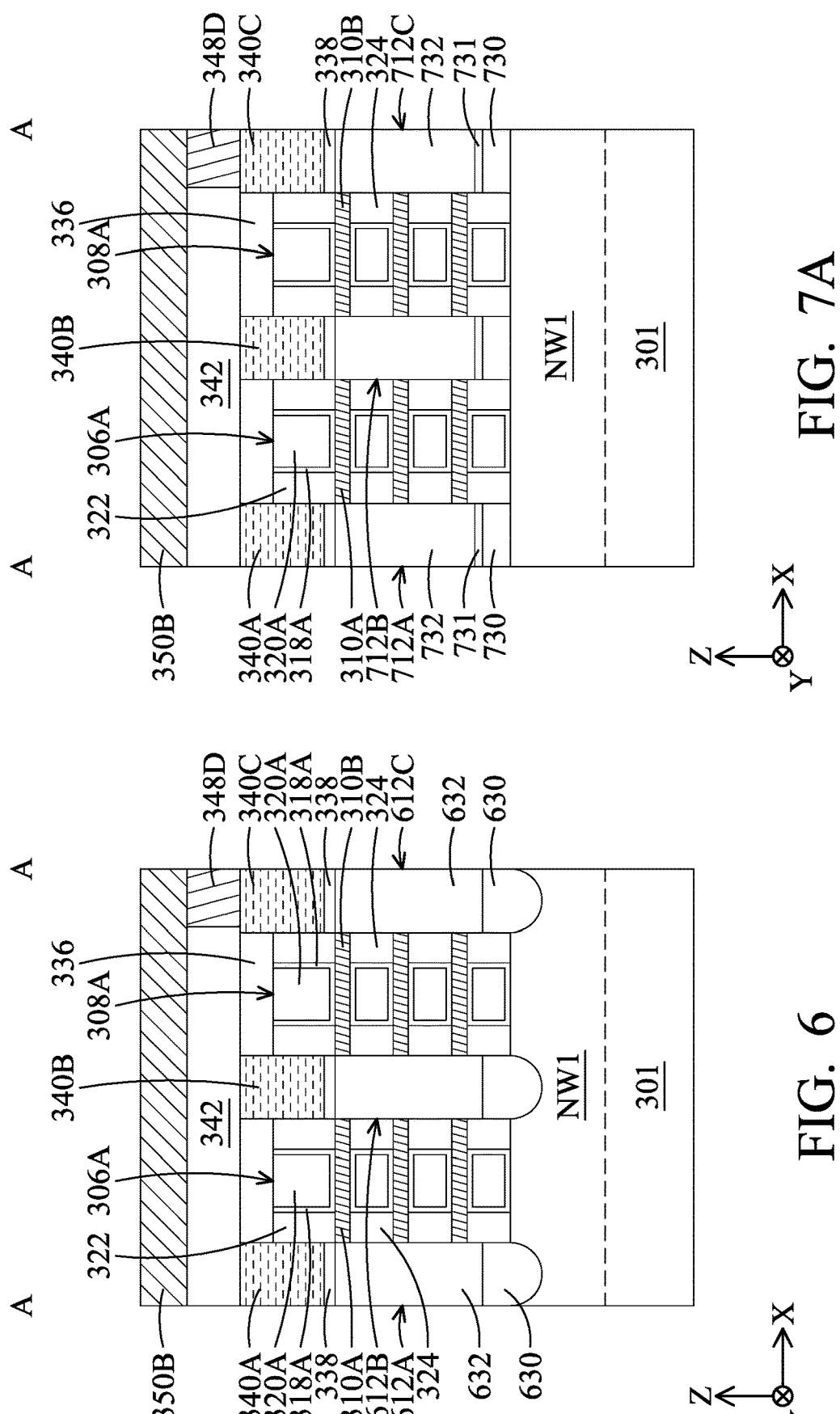
FIG. 6 illustrates a cross-sectional view of the semiconductor structure along a line A-A in FIG. 4, in accordance with some alternative embodiments of the present disclosure.
FIG. 7A illustrates a cross-sectional view of the semiconductor structure along a line A-A in FIG. 4, in accordance with some alternative embodiments of the present disclosure.

FIG. 6 is an X-Z cross-sectional view of the semiconductor structure 300 along the line A-A in FIG. 4 to illustrate alternative embodiments of the semiconductor structure 300. The structure shown in FIG. 6 may be similar to the structure shown in FIG. 5A described above, except the source/drain features 312A-312C shown in FIG. 5A are replaced by source/drain features 612A-612C shown in FIG. 6.

In some embodiments, each of the source/drain features 612A-612C includes a bottom dielectric layer 630 over the n-type well region NW1 and a doped epitaxial layer 632 over the bottom dielectric layer 630, such that the bottom dielectric layer 630 is between the doped epitaxial layer 632 and the n-type well region NW1, as shown in FIG. 6. In some embodiments, the materials and methods used in forming the bottom dielectric layer 630 and the doped epitaxial layer 632 are the same as or similar to that of the bottom dielectric layer 330 and the doped epitaxial layer 332, respectively. In some embodiments, the bottom dielectric layer 630 extends into the n-type well region NW1 and is in direct contact with the n-type well region NW1. In these embodiments, the top surface of the bottom dielectric layer 630 is lower than the bottom surface of the bottommost one of the nanostructures 310A/310B, and is higher than the top surface of the n-type well region NW1 that is an interface between the gate structure 306A/308A and the n-type well region NW1.

Figures 7B, 7C:
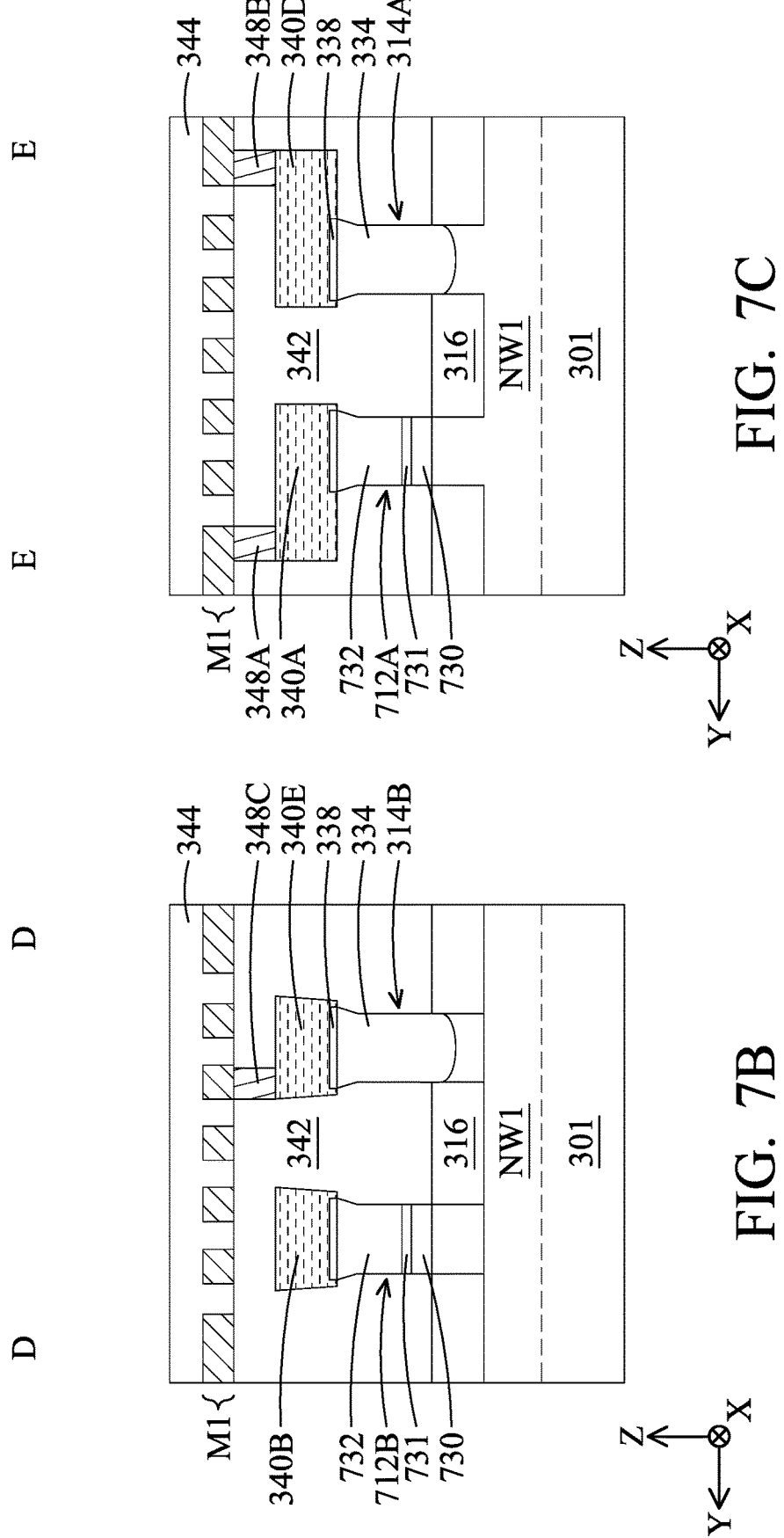
FIG. 7B illustrates a cross-sectional view of the semiconductor structure along a line D-D in FIG. 4, in accordance with some alternative embodiments of the present disclosure.
FIG. 7C illustrates a cross-sectional view of the semiconductor structure along a line E-E in FIG. 4, in accordance with some alternative embodiments of the present disclosure.

FIGS. 7A-7C are cross-sectional views of the semiconductor structure 300 in FIG. 4 to illustrate alternative embodiments of the semiconductor structure 300. FIGS. 7A, 7B, and 7C are taken along the lines A-A, D-D, and E-E in FIG. 4, respectively. The structure shown in FIGS. 7A-7C may be similar to the structure shown in FIGS. 5A, 5D, and 5E described above, except the source/drain features 312A-312C shown in FIGS. 5A, 5D, and 5E are replaced by source/drain features 712A-712C shown in FIGS. 7A-7C.

In some embodiments, each of the source/drain features 712A-712C includes a bottom dielectric layer 730 over the n-type well region NW1, a doped epitaxial layer 732 over the bottom dielectric layer 730, and an air gap 731 sandwiched between the bottom dielectric layer 730 and the doped epitaxial layer 732, such that the bottom dielectric layer 730 and the air gap 731 are between the doped epitaxial layer 732 and the n-type well region NW1, as shown in FIGS. 7A-7C. In some embodiments, the materials and methods used in forming the bottom dielectric layer 730 and the doped epitaxial layer 732 are the same as or similar to that of the bottom dielectric layer 330 and the doped epitaxial layer 332, respectively. In some embodiments, the top surface of the air gap 731 is lower than the bottom surface of the bottommost one of the nanostructures 310A/310B, and the top surface of the bottom dielectric layer 730 is higher than the top surface of the n-type well region NW1 that is an interface between the gate structure 306A/308A and the n-type well region NW1.

Figures 8, 9:
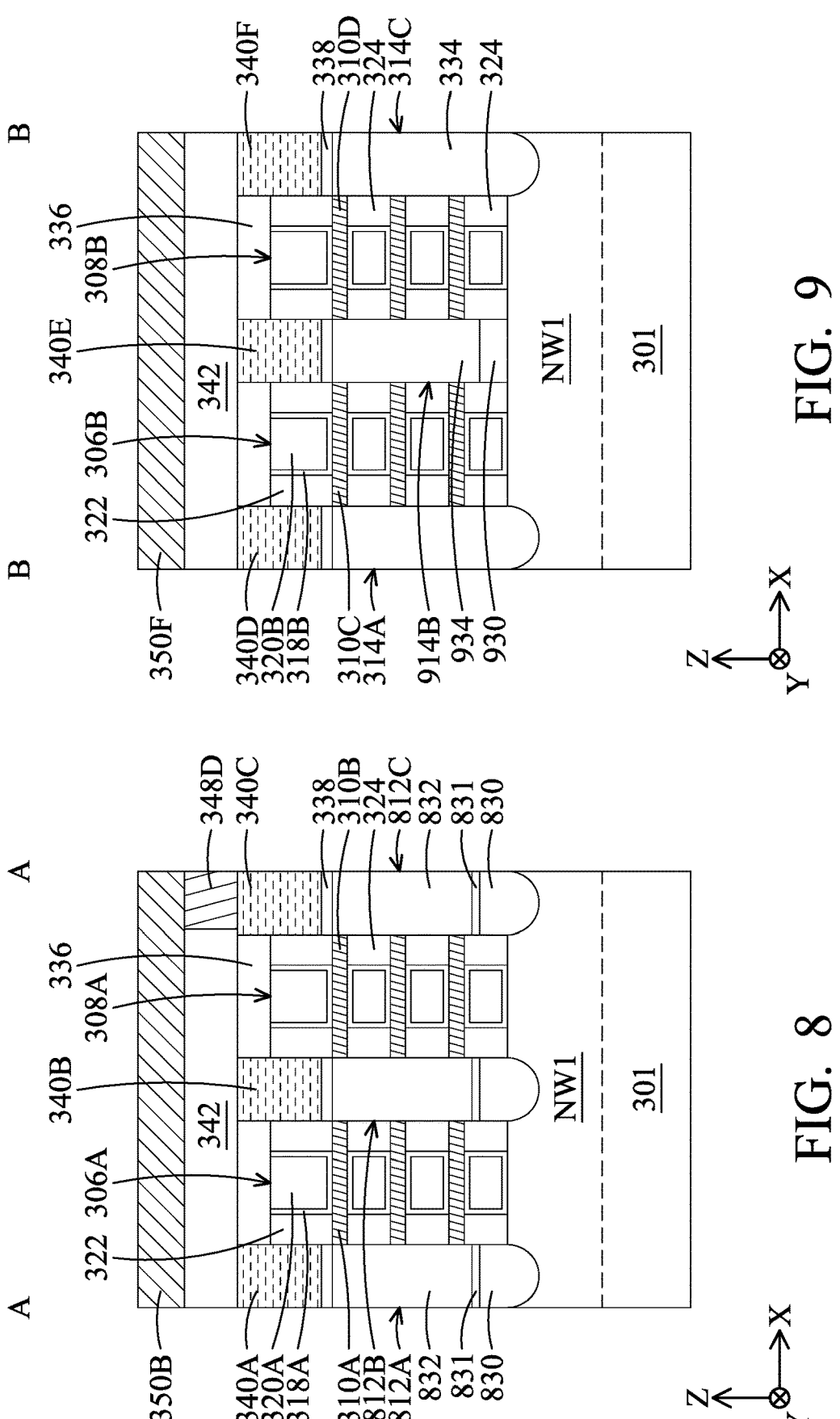
FIG. 8 illustrates a cross-sectional view of the semiconductor structure along a line A-A in FIG. 4, in accordance with some alternative embodiments of the present disclosure.
FIG. 9 illustrates a cross-sectional view of the semiconductor structure along a line B-B in FIG. 4, in accordance with some alternative embodiments of the present disclosure.

FIG. 8 is a cross-sectional view of the semiconductor structure 300 along the line A-A in FIG. 4 to illustrate alternative embodiments of the semiconductor structure 300. The structure shown in FIG. 8 may be similar to the structure shown in FIG. 5A described above, except the source/drain features 312A-312C shown in FIG. 5A are replaced by source/drain features 812A-812C shown in FIG. 8.

In some embodiments, each of the source/drain features 812A-812C includes a bottom dielectric layer 830 over the n-type well region NW1, a doped epitaxial layer 832 over the bottom dielectric layer 830, and an air gap 831 sandwiched between the bottom dielectric layer 830 and the doped epitaxial layer 832, such that the bottom dielectric layer 830 and the air gap 831 are between the doped epitaxial layer 832 and the n-type well region NW1, as shown in FIG. 8. In some embodiments, the materials and methods used in forming the bottom dielectric layer 830 and the doped epitaxial layer 832 are the same as or similar to that of the bottom dielectric layer 330 and the doped epitaxial layer 332, respectively. In some embodiments, the bottom dielectric layer 830 extends into the n-type well region NW1 and is in direct contact with the n-type well region NW1. In these embodiments, the top surface of the air gap 831 is lower than the bottom surface of the bottommost one of the nanostructures 310A/310B, and the top surface of the bottom dielectric layer 830 is higher than the top surface of the n-type well region NW1 that is an interface between the gate structure 306A/308A and the n-type well region NW1.

FIG. 9 is a cross-sectional view of the semiconductor structure 300 along the line B-B in FIG. 4 to illustrate alternative embodiments of the semiconductor structure 300. The structure shown in FIG. 9 may be similar to the structure shown in FIG. 5B described above, except the source/drain feature 314B shown in FIG. 5B is replaced by a source/drain feature 914B shown in FIG. 9.

In some embodiments, the source/drain features 914B includes a bottom dielectric layer 930 over the n-type well region NW1 and a doped epitaxial layer 934 over the bottom dielectric layer 930, such that the bottom dielectric layer 930 is sandwiched between the doped epitaxial layer 934 and the n-type well region NW1, as shown in FIG. 9. In some embodiments, the materials and methods used in forming the bottom dielectric layer 930 and the doped epitaxial layer 934 are the same as or similar to that of the bottom dielectric layer 330 and the doped epitaxial layer 334, respectively. In some embodiments, the top surface of the bottom dielectric layer 930 is lower than the bottom surface of the bottommost one of the nanostructures 310C/310D, and is higher than the top surface of the n-type well region NW1 that is an interface between the gate structure 306B/308B and the n-type well region NW1.

In the embodiments depicted in FIG. 9, the source/drain feature 914B is the source/drain feature connected to a non-high voltage power line (e.g., non-VDD power line). For example, in the embodiments where the semiconductor structure 300 includes the NAND device, the source/drain features 314A and 314C are connected to the VDD power line (e.g., the metal conductor 350G), and the source/drain contact 914B is connected to the non-VDD power line (e.g., the metal conductor 350E). In these embodiments, the drain-to-well capacitance and the gate-to-drain capacitance can be reduced by inserting the bottom dielectric layer 930 between the doped epitaxial layer 934 and the underlying n-type well region NW1, and thus the RC-delay of the device can be improved.

Figures 10, 11:
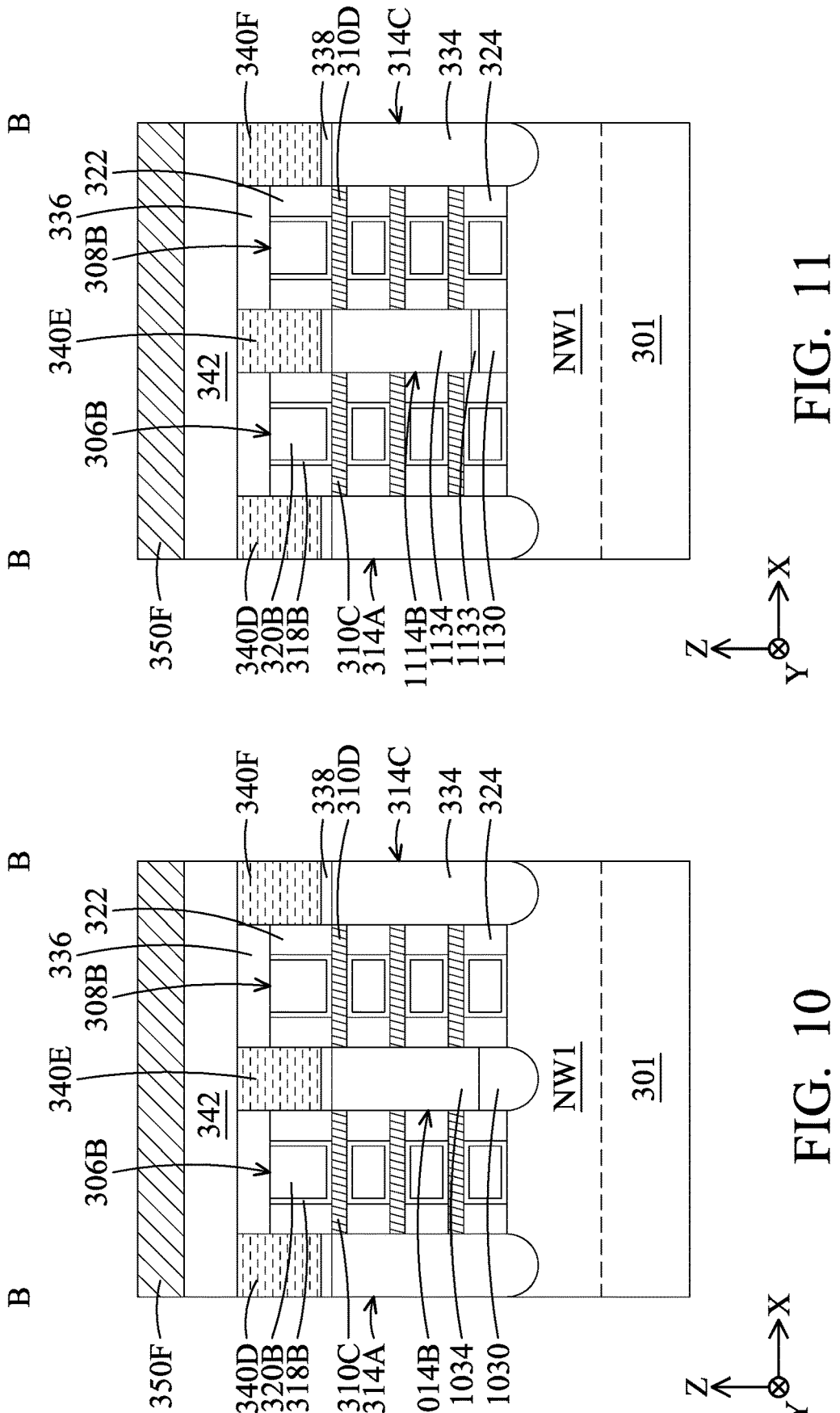
FIG. 10 illustrates a cross-sectional view of the semiconductor structure along a line B-B in FIG. 4, in accordance with some alternative embodiments of the present disclosure.
FIG. 11 illustrates a cross-sectional view of the semiconductor structure along a line B-B in FIG. 4, in accordance with some alternative embodiments of the present disclosure.

FIG. 10 is a cross-sectional view of the semiconductor structure 300 along the line B-B in FIG. 4 to illustrate alternative embodiments of the semiconductor structure 300. The structure shown in FIG. 10 may be similar to the structure shown in FIG. 5B described above, except the source/drain feature 314B shown in FIG. 5B is replaced by a source/drain feature 1014B shown in FIG. 10.

In some embodiments, the source/drain features 1014B includes a bottom dielectric layer 1030 over the n-type well region NW1 and a doped epitaxial layer 1034 over the bottom dielectric layer 1030, such that the bottom dielectric layer 1030 is between the doped epitaxial layer 1034 and the n-type well region NW1, as shown in FIG. 10. In some embodiments, the materials and methods used in forming the bottom dielectric layer 1030 and the doped epitaxial layer 1034 are the same as or similar to that of the bottom dielectric layer 330 and the doped epitaxial layer 334, respectively. In some embodiments, the bottom dielectric layer 1030 extends into the n-type well region NW1 and is in direct contact with the n-type well region NW1. In these embodiments, the top surface of the bottom dielectric layer 1030 is lower than the bottom surface of the bottommost one of the nanostructures 310C/310D, and is higher than the top surface of the n-type well region NW1 that is an interface between the gate structure 306B/308B and the n-type well region NW1. In these embodiments, the bottom dielectric layer 1030 may function the same as the bottom dielectric layer 930 shown in FIG. 9 described above.

FIG. 11 is a cross-sectional view of the semiconductor structure 300 along the line B-B in FIG. 4 to illustrate alternative embodiments of the semiconductor structure 300. The structure shown in FIG. 11 may be similar to the structure shown in FIG. 5B described above, except the source/drain feature 314B shown in FIG. 5B is replaced by a source/drain feature 1114B shown in FIG. 11.

In some embodiments, the source/drain feature 1114B includes a bottom dielectric layer 1130 over the n-type well region NW1, a doped epitaxial layer 1134 over the bottom dielectric layer 1130, and an air gap 1133 sandwiched between the bottom dielectric layer 1130 and the doped epitaxial layer 1134, such that the bottom dielectric layer 1130 and the air gap 1133 are between the doped epitaxial layer 1134 and the n-type well region NW1, as shown in FIG. 11. In some embodiments, the materials and methods used in forming the bottom dielectric layer 1130 and the doped epitaxial layer 1134 are the same as or similar to that of the bottom dielectric layer 330 and the doped epitaxial layer 334, respectively. In some embodiments, the top surface of the air gap 1133 is lower than the bottom surface of the bottommost one of the nanostructures 310C/310D, and the top surface of the bottom dielectric layer 1130 is higher than the top surface of the n-type well region NW1 that is an interface between the gate structure 306B/308B and the n-type well region NW1. In these embodiments, the bottom dielectric layer 1130 and the air gap 1133 may function the same as the bottom dielectric layer 930 shown in FIG. 9 described above.

Figures 12, 13A:
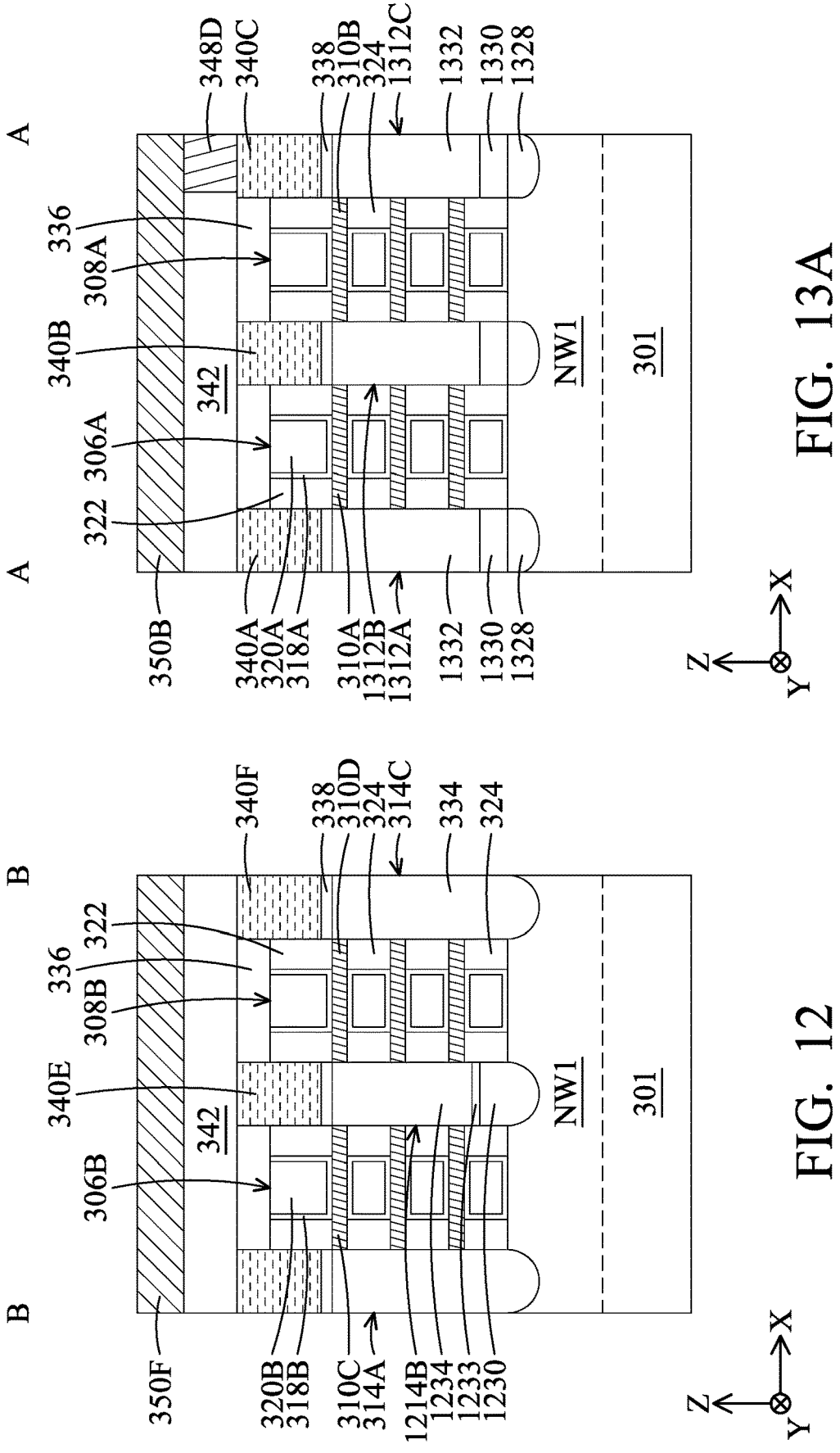
FIG. 12 illustrates a cross-sectional view of the semiconductor structure along a line B-B in FIG. 4, in accordance with some alternative embodiments of the present disclosure.
FIG. 13A illustrates a cross-sectional view of the semiconductor structure along a line A-A in FIG. 4, in accordance with some alternative embodiments of the present disclosure.

FIG. 12 is a cross-sectional view of the semiconductor structure 300 along the line B-B in FIG. 4 to illustrate alternative embodiments of the semiconductor structure 300. The structure shown in FIG. 12 may be similar to the structure shown in FIG. 5B described above, except the source/drain feature 314B shown in FIG. 5B is replaced by a source/drain feature 1214B shown in FIG. 12.

In some embodiments, the source/drain feature 1214B includes a bottom dielectric layer 1230 over the n-type well region NW1, a doped epitaxial layer 1234 over the bottom dielectric layer 1230, and an air gap 1233 sandwiched between the bottom dielectric layer 1230 and the doped epitaxial layer 1234, such that the bottom dielectric layer 1230 and the air gap 1233 are between the doped epitaxial layer 1234 and the n-type well region NW1, as shown in FIG. 12. In some embodiments, the materials and methods used in forming the bottom dielectric layer 1230 and the doped epitaxial layer 1234 are the same as or similar to that of the bottom dielectric layer 330 and the doped epitaxial layer 334, respectively. In some embodiments, the bottom dielectric layer 1230 extends into the n-type well region NW1 and is in direct contact with the n-type well region NW1. In these embodiments, the top surface of the air gap 1233 is lower than the bottom surface of the bottommost one of the nanostructures 310C/310D, and the top surface of the bottom dielectric layer 1230 is higher than the top surface of the n-type well region NW1 that is an interface between the gate structure 306B/308B and the n-type well region NW1. In these embodiments, the bottom dielectric layer 1230 and the air gap 1233 may function the same as the bottom dielectric layer 930 shown in FIG. 9 described above.

FIGS. 13A-13D are cross-sectional views of the semiconductor structure 300 in FIG. 4 to illustrate alternative embodiments of the semiconductor structure 300. FIGS. 13A, 13B, 13C, and 13D are taken along the lines A-A, B-B, D-D, and E-E in FIG. 4, respectively. The structure shown in FIGS. 13A-13D may be similar to the structure shown in FIGS. 5A, 5B, 5D, and 5E described above, except the source/drain features 312A-312C and 314A-314C shown in FIGS. 5A, 5D, and 5E are replaced by source/drain features 1312A-1312C and 1314A-1314C shown in FIGS. 13A-13D.

In some embodiments, each of the source/drain features 1312A-1312C includes an undoped epitaxial layer 1328 over the n-type well region NW1, a bottom dielectric layer 1330 over the undoped epitaxial layer 1328, and a doped epitaxial layer 1332 over the bottom dielectric layer 1330, such that the bottom dielectric layer 1330 and the undoped epitaxial layer 1328 are between the doped epitaxial layer 1332 and the n-type well region NW1, as shown in FIGS. 13A-13D. In some embodiments, each of the source/drain features 1314A-1314C includes an undoped epitaxial layer 1328 over the n-type well region NW1 and a doped epitaxial layer 1334 over the undoped epitaxial layer 1328, such that the undoped epitaxial layer 1328 is between the doped epitaxial layer 1334 and the n-type well region NW1, as shown in FIGS. 13A-13D. In some embodiments, the materials and methods used in forming the bottom dielectric layer 1330, the doped epitaxial layer 1332, and the doped epitaxial layer 1334 are the same as or similar to that of the bottom dielectric layer 330, the doped epitaxial layer 332, and the doped epitaxial layer 334, respectively.

In some embodiments, the undoped epitaxial layers 1328 extend into the n-type well region NW1 in the Z-direction by a depth that is in a range from about 5 nm to about 50 nm, and is in direct contact with the n-type well region NW1. In some embodiments, the undoped epitaxial layers 1328 are substantially free of dopants. The undoped epitaxial layers 1328 may include silicon, germanium, silicon germanium, other suitable semiconductor materials, or combinations thereof. In some embodiments, the undoped epitaxial layers 1328 include silicon that is substantially free of n-type dopants and p-type dopants. In some embodiments, the undoped epitaxial layers 1328 are epitaxially grown using an epitaxial growth such as VPE, MOCVD, MBE, although other deposition processes, such as CVD, LPCVD, PECVD, ALD, UHVCVD, RPCVD, combinations thereof, or the like, may also be utilized.

In some embodiments, the top surface of the bottom dielectric layer 1330 is lower than the bottom surface of the bottommost one of the nanostructures 310A/310B, and is higher than the top surface of the n-type well region NW1 that is an interface between the gate structure 306A/308A and the n-type well region NW1.

Figures 13D, 14:
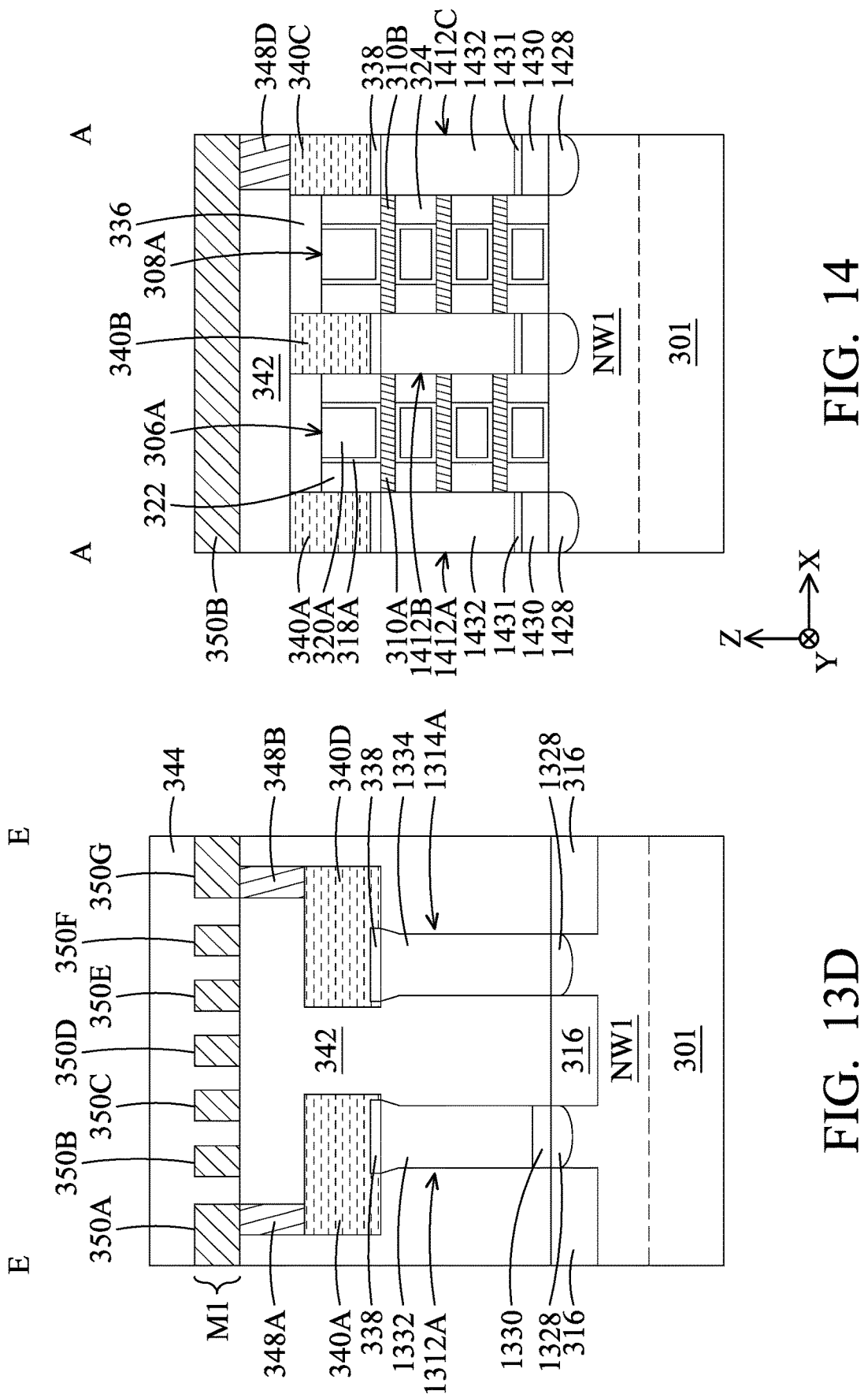
FIG. 13D illustrates a cross-sectional view of the semiconductor structure along a line E-E in FIG. 4, in accordance with some alternative embodiments of the present disclosure.
FIG. 14 illustrates a cross-sectional view of the semiconductor structure along a line A-A in FIG. 4, in accordance with some alternative embodiments of the present disclosure.

FIG. 14 is a cross-sectional view of the semiconductor structure 300 along the line A-A in FIG. 4 to illustrate alternative embodiments of the semiconductor structure 300. The structure shown in FIG. 14 may be similar to the structure shown in FIG. 13A described above, except the source/drain features 1312A-1312C shown in FIG. 13A are replaced by source/drain features 1412A-1412C shown in FIG. 14.

In some embodiments, each of the source/drain features 1412A-1412C includes an undoped epitaxial layer 1428 over the n-type well region NW1, a bottom dielectric layer 1430 over the undoped epitaxial layer 1428, an air gap 1431 over the bottom dielectric layer 1430, and a doped epitaxial layer 1432 over the air gap 1431, such that the bottom dielectric layer 1430, the air gap 1431, and the undoped epitaxial layer 1428 are between the doped epitaxial layer 1432 and n-type well region NW1, as shown in FIG. 14. In some embodiments, the materials and methods used in forming the undoped epitaxial layer 1428, the bottom dielectric layer 1430, and the doped epitaxial layer 1432 are the same as or similar to that of the undoped epitaxial layer 1328, the bottom dielectric layer 330, and the doped epitaxial layer 332, respectively. In some embodiments, the top surface of the air gap 1431 is lower than the bottom surface of the bottommost one of the nanostructures 310A/310B, and the top surface of the bottom dielectric layer 1430 is higher than the top surface of the n-type well region NW1 that is an interface between the gate structure 306A/308A and the n-type well region NW1.

Figures 13B, 13C:
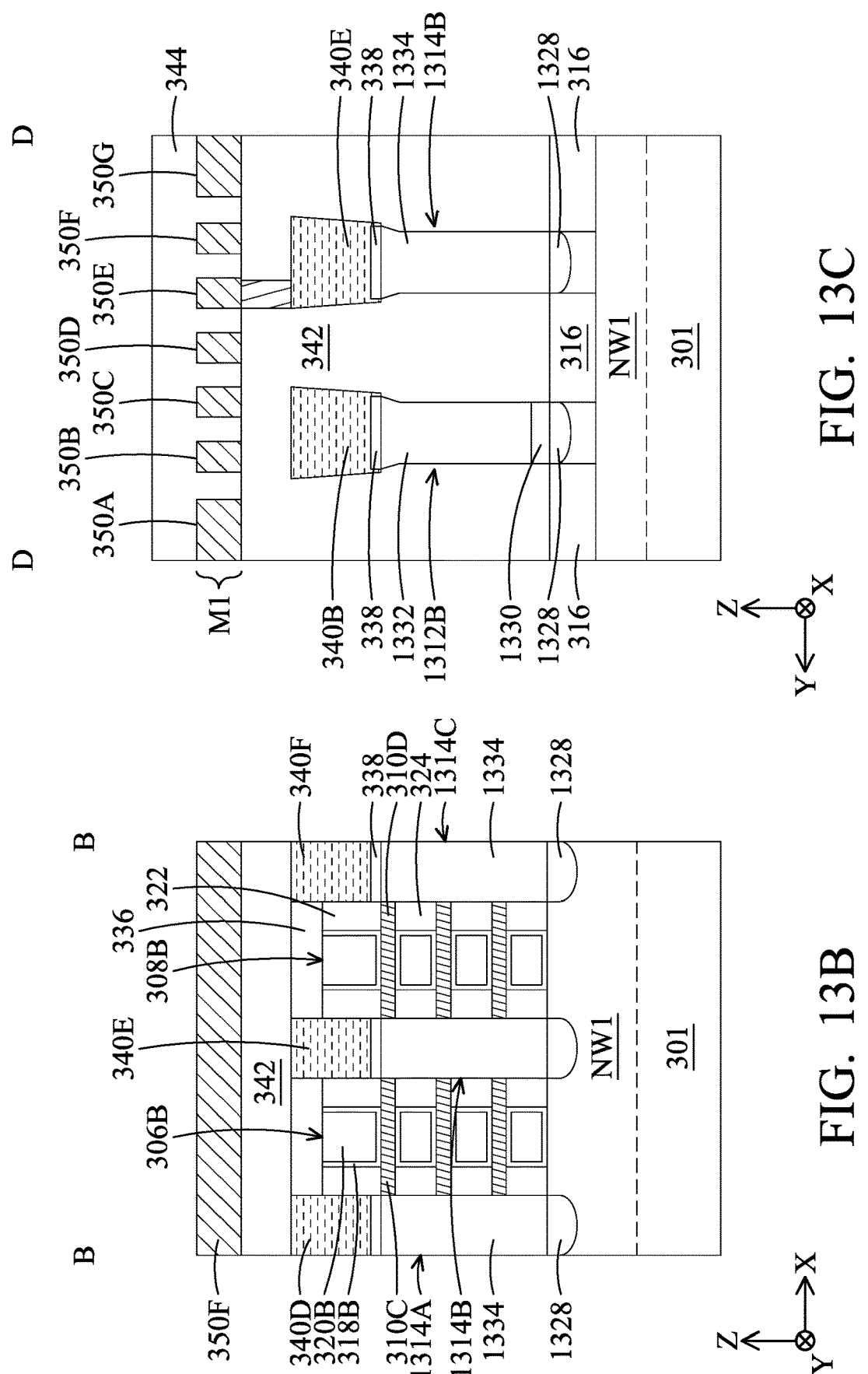
FIG. 13B illustrates a cross-sectional view of the semiconductor structure along a line B-B in FIG. 4, in accordance with some alternative embodiments of the present disclosure.
FIG. 13C illustrates a cross-sectional view of the semiconductor structure along a line D-D in FIG. 4, in accordance with some alternative embodiments of the present disclosure.
Figures 15, 16:
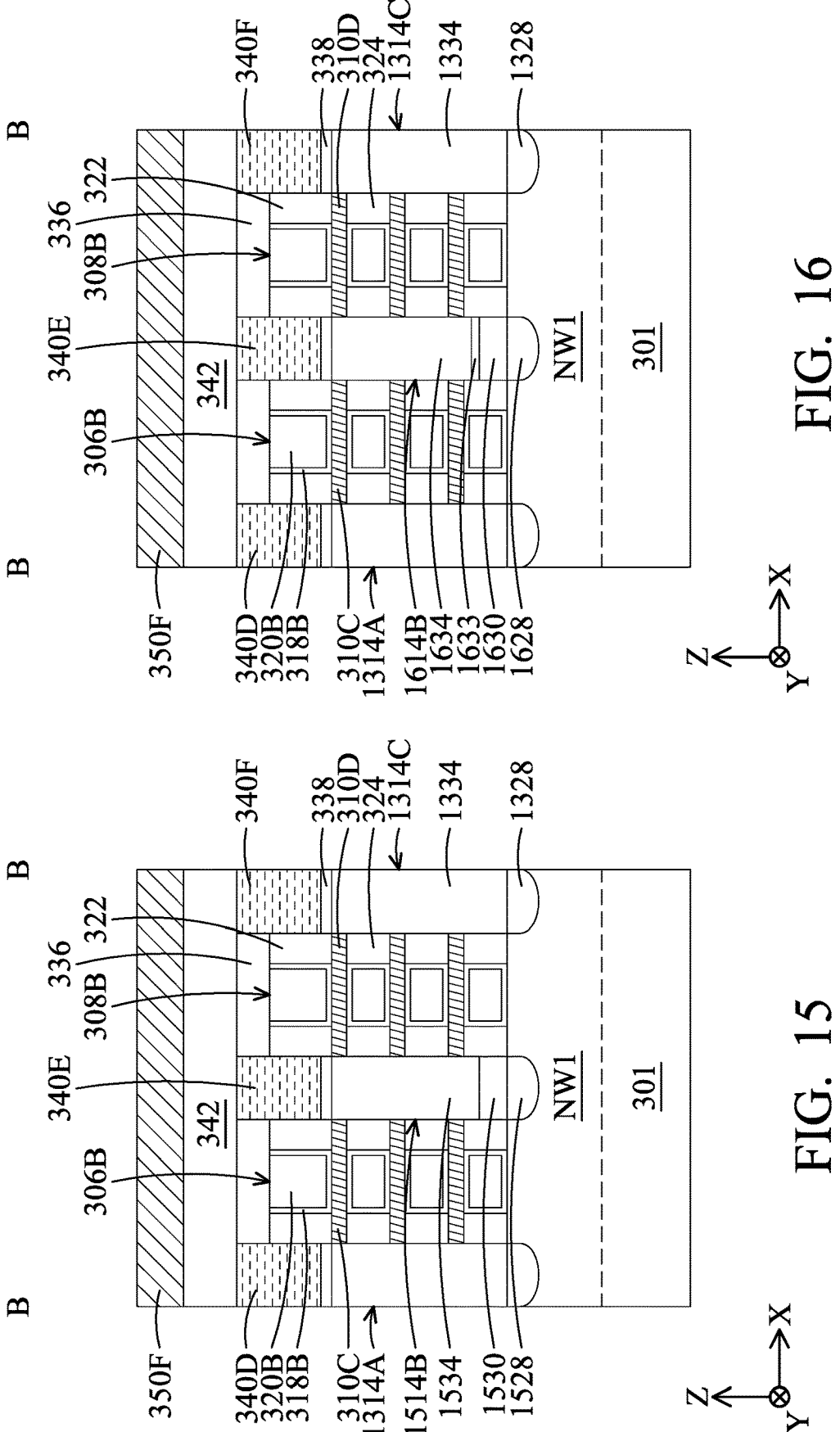
FIG. 15 illustrates a cross-sectional view of the semiconductor structure along a line B-B in FIG. 4, in accordance with some alternative embodiments of the present disclosure.
FIG. 16 illustrates a cross-sectional view of the semiconductor structure along a line B-B in FIG. 4, in accordance with some alternative embodiments of the present disclosure.

FIG. 15 is a cross-sectional view of the semiconductor structure 300 along the line B-B in FIG. 4 to illustrate alternative embodiments of the semiconductor structure 300. The structure shown in FIG. 15 may be similar to the structure shown in FIG. 13B described above, except the source/drain feature 1314B shown in FIG. 13B is replaced by a source/drain feature 1514B shown in FIG. 15.

In some embodiments, the source/drain features 1514B includes an undoped epitaxial layer 1528 over the n-type well region NW1, a bottom dielectric layer 1530 over the undoped epitaxial layer 1528, and a doped epitaxial layer 1534 over the bottom dielectric layer 1530, such that the bottom dielectric layer 1530 and the undoped epitaxial layer 1528 are between the doped epitaxial layer 1534 and the n-type well region NW1, as shown in FIG. 15. In some embodiments, the materials and methods used in forming the undoped epitaxial layer 1528, the bottom dielectric layer 1530, and the doped epitaxial layer 1534 are the same as or similar to that of the undoped epitaxial layer 1328, the bottom dielectric layer 330, and the doped epitaxial layer 334, respectively. In some embodiments, the top surface of the bottom dielectric layer 1530 is lower than the bottom surface of the bottommost one of the nanostructures 310C/310D, and is higher than the top surface of the n-type well region NW1 that is an interface between the gate structure 306B/308B and the n-type well region NW1. In these embodiments, the bottom dielectric layer 1530 may function the same as the bottom dielectric layer 930 shown in FIG. 9 described above.

FIG. 16 is a cross-sectional view of the semiconductor structure 300 along the line B-B in FIG. 4 to illustrate alternative embodiments of the semiconductor structure 300. The structure shown in FIG. 16 may be similar to the structure shown in FIG. 13B described above, except the source/drain feature 1314B shown in FIG. 13B is replaced by a source/drain feature 1614B shown in FIG. 16.

In some embodiments, the source/drain features 1614B includes an undoped epitaxial layer 1628 over the n-type well region NW1, a bottom dielectric layer 1630 over the undoped epitaxial layer 1628, an air gap 1633 over the bottom dielectric layer 1630, and a doped epitaxial layer 1634 over the air gap 1633, such that the air gap 1633, the bottom dielectric layer 1630, and the undoped epitaxial layer 1628 are between the doped epitaxial layer 1634 and the n-type well region NW1, as shown in FIG. 16. In some embodiments, the materials and methods used in forming the undoped epitaxial layer 1628, the bottom dielectric layer 1630, and the doped epitaxial layer 1634 are the same as or similar to that of the undoped epitaxial layer 1328, the bottom dielectric layer 330, and the doped epitaxial layer 334, respectively. In some embodiments, the top surface of the air gap 1633 is lower than the bottom surface of the bottommost one of the nanostructures 310C/310D, and the top surface of the bottom dielectric layer 1630 is higher than the top surface of the n-type well region NW1 that is an interface between the gate structure 306B/308B and the n-type well region NW1. In these embodiments, the bottom dielectric layer 1630 and the air gap 1633 may function the same as the bottom dielectric layer 930 shown in FIG. 9 described above.

Figure 17:
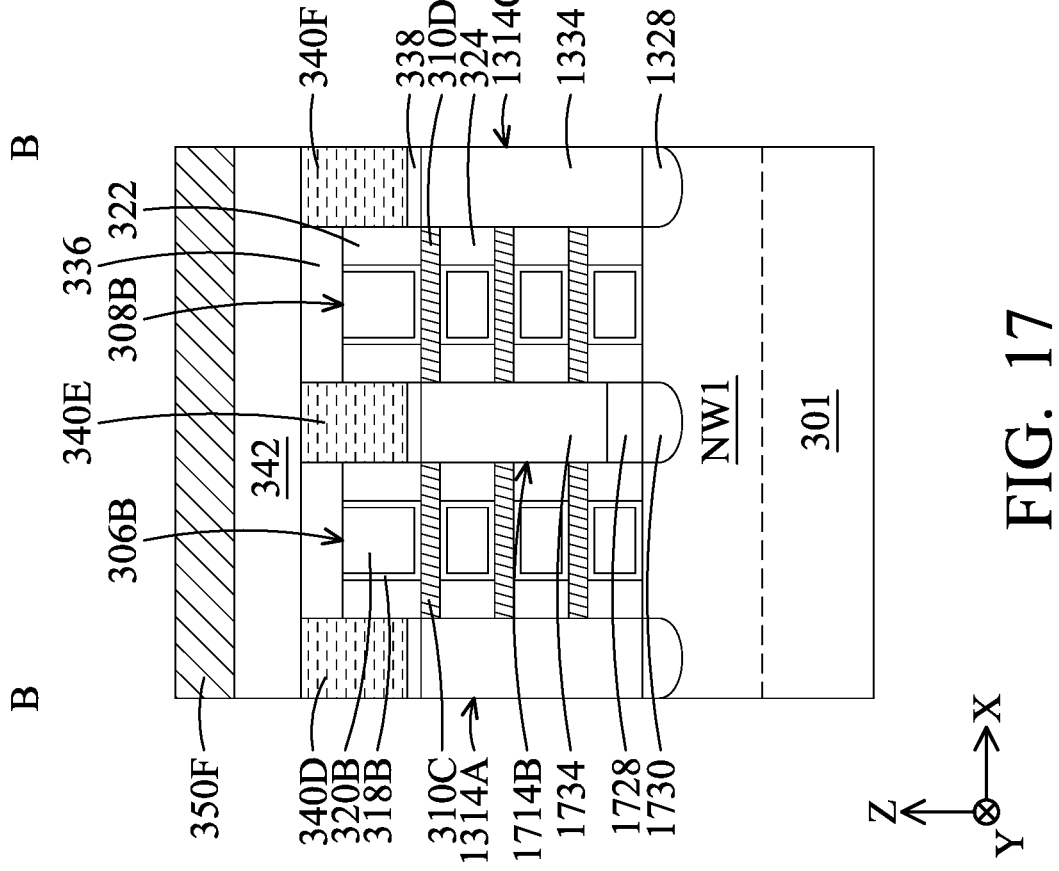
FIG. 17 illustrates a cross-sectional view of the semiconductor structure along a line B-B in FIG. 4, in accordance with some alternative embodiments of the present disclosure.

FIG. 17 is a cross-sectional view of the semiconductor structure 300 along the line B-B in FIG. 4 to illustrate alternative embodiments of the semiconductor structure 300. The structure shown in FIG. 17 may be similar to the structure shown in FIG. 13B described above, except the source/drain feature 1314B shown in FIG. 13B is replaced by a source/drain feature 1714B shown in FIG. 17.

In some embodiments, the source/drain features 1714B includes a bottom dielectric layer 1730 over the n-type well region NW1, a doped epitaxial layer 1734 over the undoped layer 1728, and an undoped layer 1728 sandwiched between the bottom dielectric layer 1730 and the doped epitaxial layer 1734, such that the bottom dielectric layer 1730 is between the undoped layer 1728 and the n-type well region NW1, as shown in FIG. 17. In some embodiments, the materials and methods used in forming the bottom dielectric layer 1730 and the doped epitaxial layer 1734 are the same as or similar to that of the bottom dielectric layer 330 and the doped epitaxial layer 334, respectively.

In some embodiments, the bottom dielectric layer 1730 extends into the n-type well region NW1 and is in direct contact with the n-type well region NW1. In these embodiments, the top surface of the undoped layer 1728 is lower than the bottom surface of the bottommost one of the nanostructures 310C/310D, and the top surface of the bottom dielectric layer 1730 is higher than the top surface of the n-type well region NW1 that is an interface between the gate structure 306B/308B and the n-type well region NW1. In these embodiments, the bottom dielectric layer 1730 may function the same as the bottom dielectric layer 930 shown in FIG. 9 described above. In some embodiments, the undoped layer 1728 may include silicon or silicon germanium. In these embodiments, the undoped layer 1728 may function to facilitate the epitaxial growth of doped epitaxial layer 1734, which is similar to that the undoped epitaxial layer 1328 may function to facilitate the epitaxial growth of doped epitaxial layer 1334. The undoped layer 1728 may be deposited using a deposition process such as ALD, CVD, or the like, although any suitable deposition process may be used.

Figure 18:
FIG. 18 illustrates a fragmentary diagrammatic top view (or layout) of a semiconductor structure in the logic region of the IC chip, in accordance with some alternative embodiments of the present disclosure.
Figure 18:
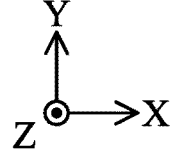

FIG. 18 illustrates a fragmentary diagrammatic top view (or layout) of a semiconductor structure 1800 that may be disposed in the logic region 20 of the IC chip 10, in accordance with some embodiments of the present disclosure. In some embodiments, the semiconductor structure 300 shown in FIG. 4 described above may be a first circuit of an integrated circuit, and the semiconductor structure 1800 shown in FIG. 18 may be a second circuit of the this integrated circuit.

Figures 19A, 19B:
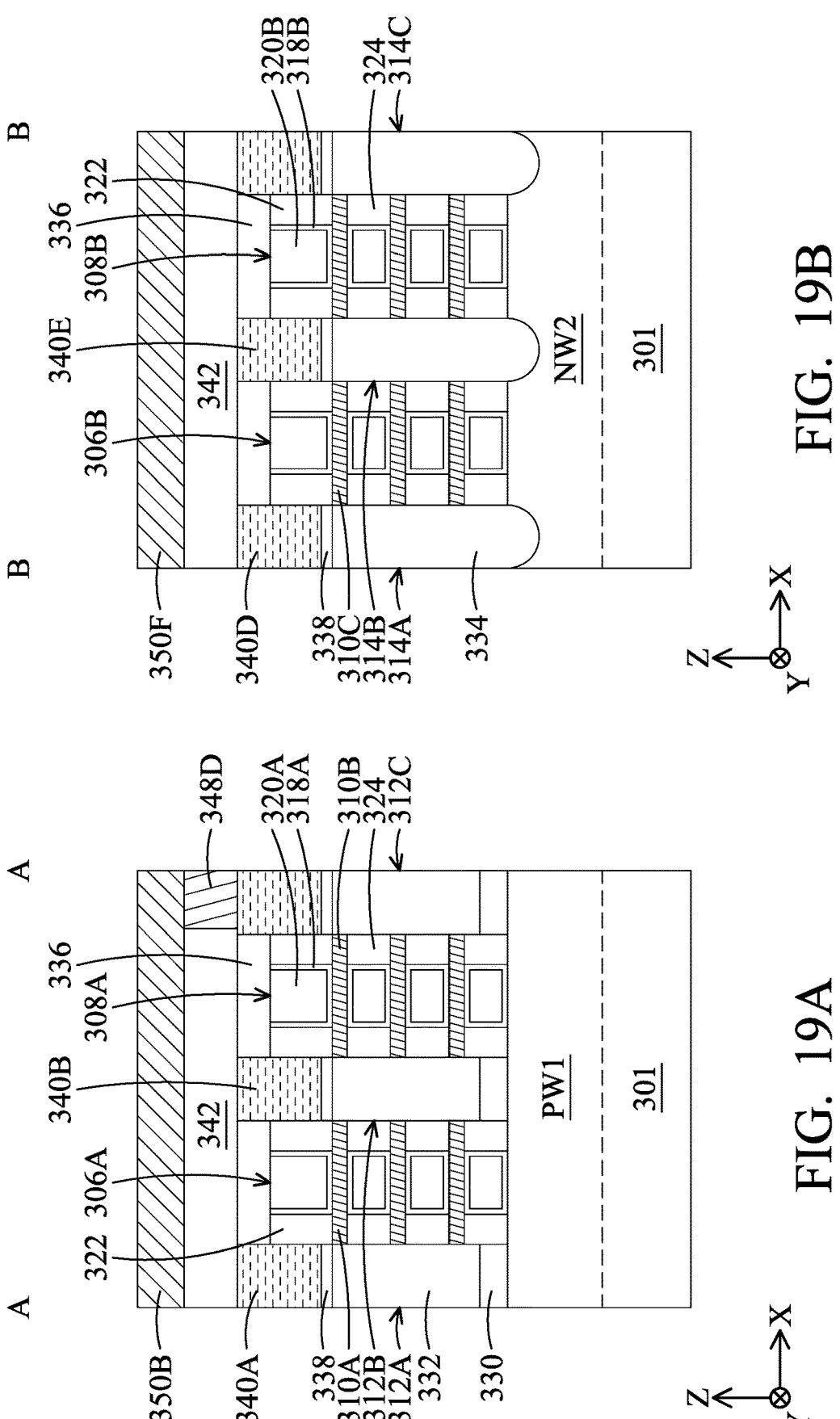
FIG. 19A illustrates a cross-sectional view of the semiconductor structure along a line A-A in FIG. 18, in accordance with some alternative embodiments of the present disclosure.
FIG. 19B illustrates a cross-sectional view of the semiconductor structure along a line B-B in FIG. 18, in accordance with some alternative embodiments of the present disclosure.
Figure 19C:
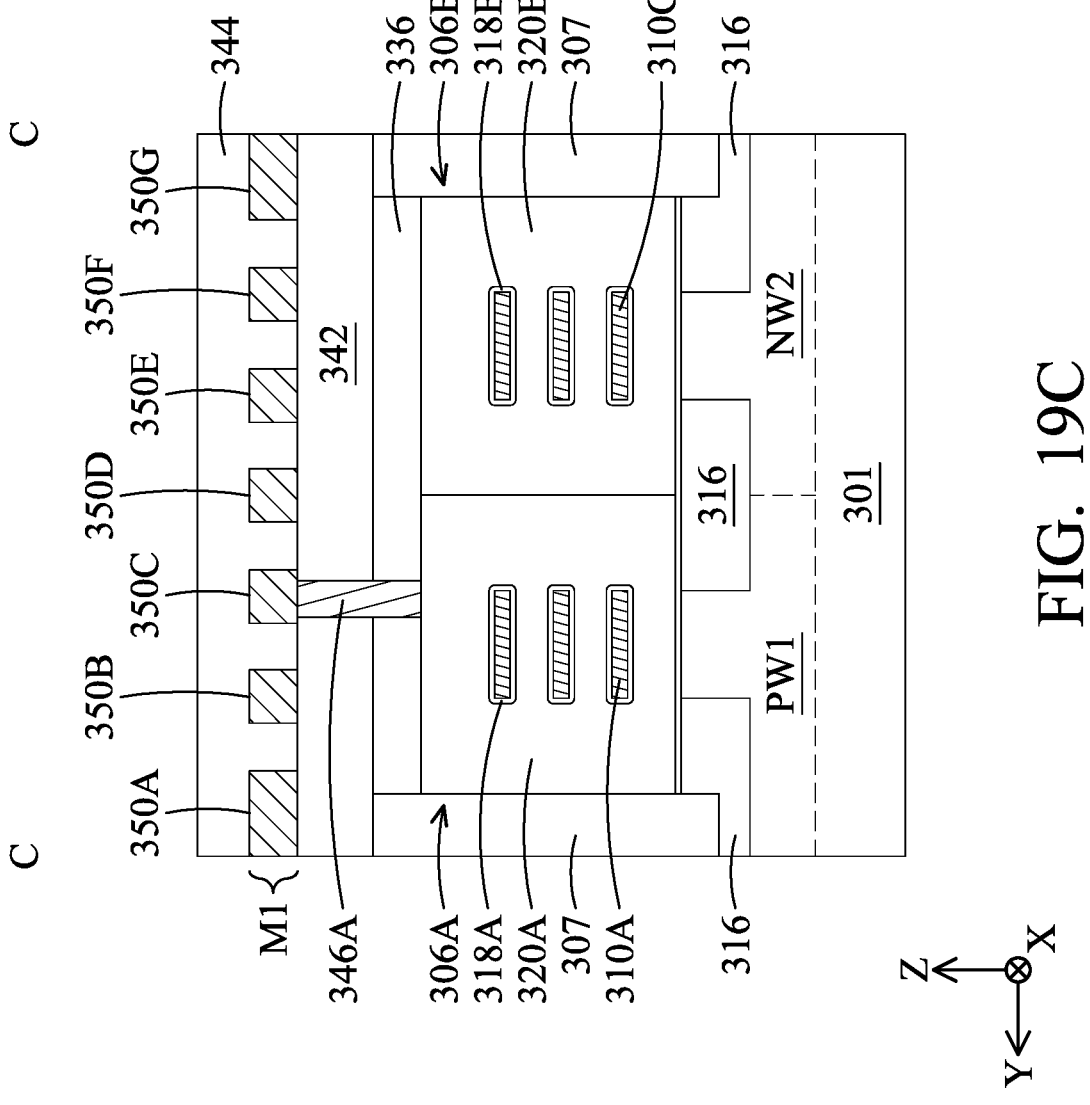
FIG. 19C illustrates a cross-sectional view of the semiconductor structure along a line C-C in FIG. 18, in accordance with some alternative embodiments of the present disclosure.
Figures 19D, 19E:
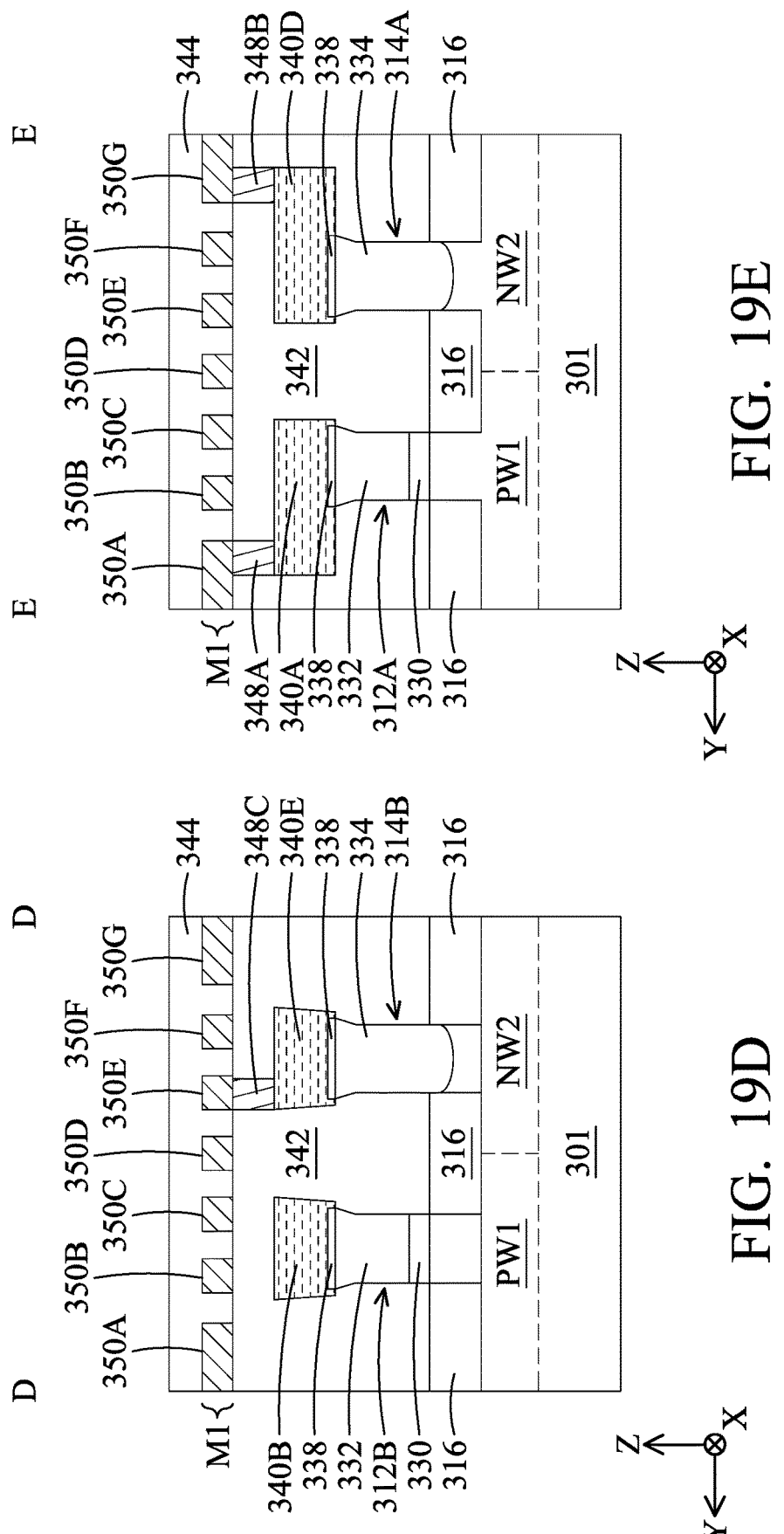
FIG. 19D illustrates a cross-sectional view of the semiconductor structure along a line D-D in FIG. 18, in accordance with some alternative embodiments of the present disclosure.
FIG. 19E illustrates a cross-sectional view of the semiconductor structure along a line E-E in FIG. 18, in accordance with some alternative embodiments of the present disclosure.

FIG. 19A illustrates an X-Z cross-sectional view of the semiconductor structure 1800 along a line A-A in FIG. 18, in accordance with some embodiments of the present disclosure. FIG. 19B illustrates an X-Z cross-sectional view of the semiconductor structure 1800 along a line B-B in FIG. 18, in accordance with some embodiments of the present disclosure. FIG. 19C illustrates a Y-Z cross-sectional view of the semiconductor structure 1800 along a line C-C in FIG. 18, in accordance with some embodiments of the present disclosure. FIG. 19D illustrates a Y-Z cross-sectional view of the semiconductor structure 1800 along a line D-D in FIG. 18, in accordance with some embodiments of the present disclosure. FIG. 19E illustrates a Y-Z cross-sectional view of the semiconductor structure 1800 along a line E-E in FIG. 18, in accordance with some embodiments of the present disclosure.

The semiconductor structure 1800 shown in FIGS. 18 and 19A-19E may be similar to the semiconductor structure 300 shown in FIGS. 4 and 5A-5E described above, except the n-type well region NW1 shown in FIGS. 4 and 5A-5E is replaced by a p-type well region PW1 and an n-type well region NW2 shown in FIGS. 18 and 19A-19E.

Referring to FIGS. 18 and 19A-19E, in the semiconductor structure 1800, the gate structures 306A, 308A and the active region 302 (including the nanostructures 310A-310B and the source/drain features 312A-312C) may be formed over the p-type well region PW1, and the gate structures 306B, 308B and the active region 304 (including the nanostructures 310C-310D and the source/drain features 314A-314C) may be formed over the n-type well region NW2. In the semiconductor structure 1800, the gate structure 306A, the nanostructures 310A, and the source/drain features 312A-312B may construct a third NMOSFET over the p-type well region PW1. In the semiconductor structure 1800, the gate structure 308A, the nanostructures 310B, and the source/drain features 312B-312C may construct a fourth NMOSFET over the p-type well region PW1. In the semiconductor structure 1800, the gate structure 306B, the nanostructures 310C, and the source/drain features 314A-314B may construct a third PMOSFET over the n-type well region NW2. In the semiconductor structure 1800, the gate structure 308B, the nanostructures 310D, and the source/drain features 314B-314C may construct a fourth PMOSFET over the n-type well region NW2.

As described above, in the semiconductor structure 300, the NMOSFETs (i.e., the first and second NMOSFETs described above) and the PMOSFETs (i.e., the first and second PMOSFETs described above) are formed over the same n-type well region (i.e., the n-type well region NW1). In contrast, in the semiconductor structure 1800, the NMOS-FETs and the PMOSFETs are formed over the different type of well regions. For example, in the semiconductor structure 1800, the third and fourth NMOSFETs are formed over the p-type well region PW1, and the third and fourth PMOS-FETs are formed over the n-type well region NW2. By combining the first and second circuits (i.e., the semiconductor structures 300 and 1800) in a single IC, the single IC may have two types of NMOSFETs. One type of NMOSFET is the NMOSFET formed over the n-type well region as shown in the semiconductor structure 300, and the other type of NMOSFET is the NMOSFET formed over the p-type well region as shown in the semiconductor structure 1800. The ratio of these two types of the NMOSFETs can be flexibly adjusted according to the design requirements. For example, if a region adjacent to a NMOSFET is configured to form a diode and thus need a p-well, this NMOSFET can be formed over a p-well that is formed with the p-well for diode at the same time or formed over the same p-well as the diode to simplify the process.

Although the source/drain features of the semiconductor structure 1800 are illustrated as source/drain features 312A-312C and 314A-314C, the source/drain features of the semiconductor structure 1800 may include other configurations. For example, the source/drain features of the semiconductor structure 1800 may be formed as the source/drain features 612A-612C, 712A-712C, 812A-812C, 914B, 1014B, 1114B, 1214B, 1312A-1312C, 1314A-1314C, 1412A-1412C, 1514B, 1614B, and 1714B as shown in FIGS. 6-17.

Figure 20:
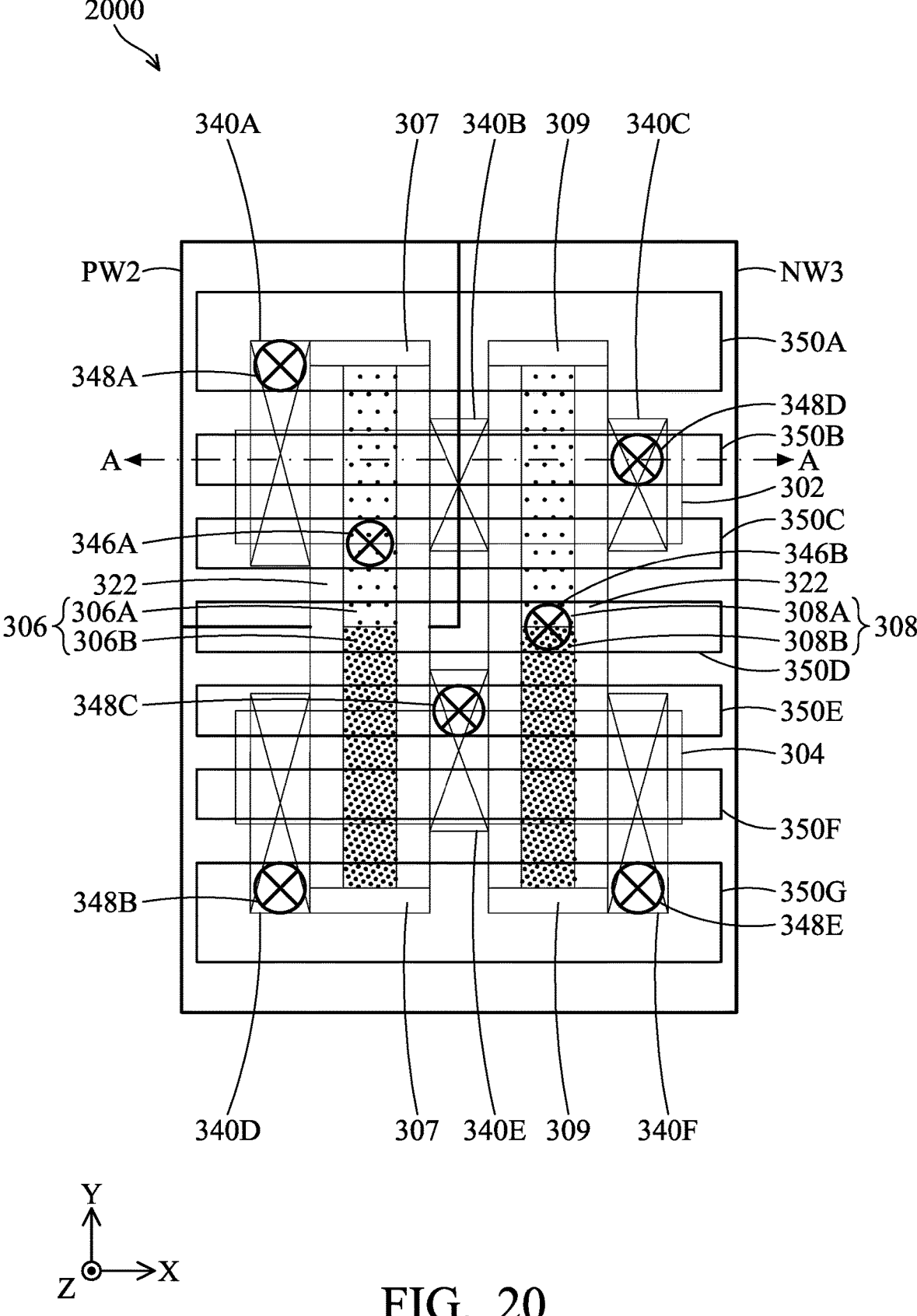
FIG. 20 illustrates a fragmentary diagrammatic top view (or layout) of a semiconductor structure in the logic region of the IC chip, in accordance with some alternative embodiments of the present disclosure.
Figure 21:
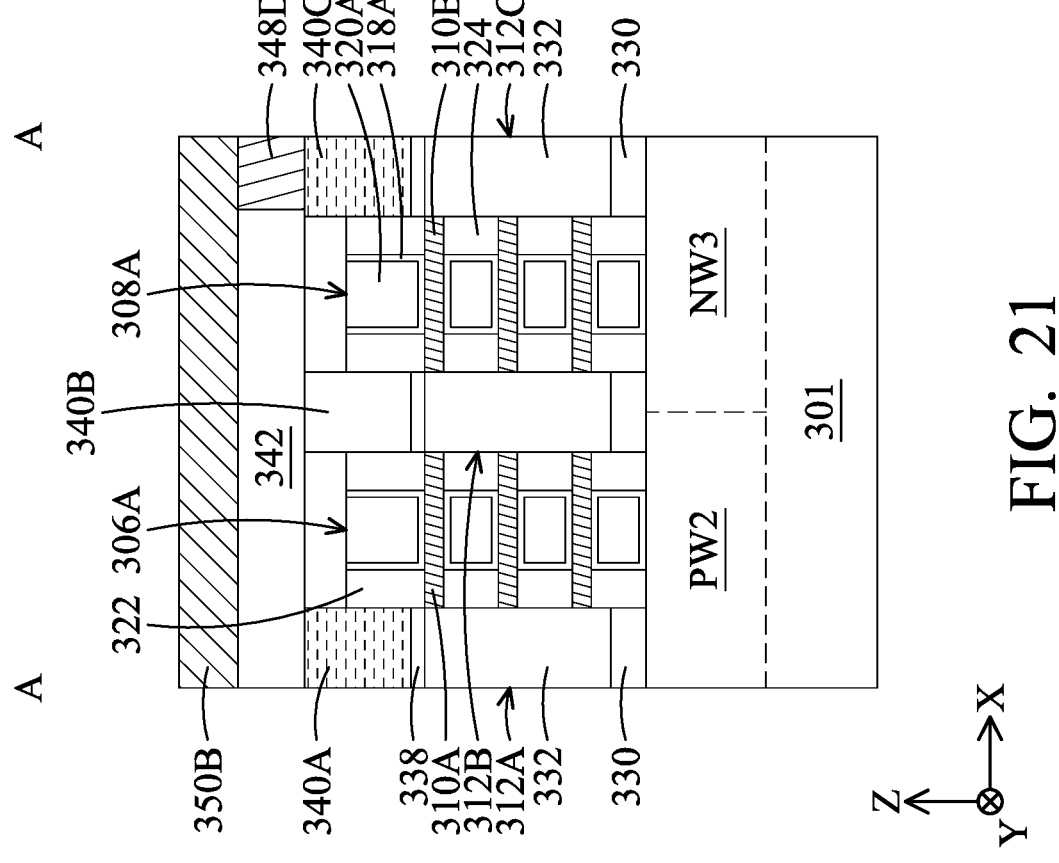
FIG. 21 illustrates a cross-sectional view of the semiconductor structure along a line A-A in FIG. 20, in accordance with some alternative embodiments of the present disclosure.

FIG. 20 illustrates a fragmentary diagrammatic top view (or layout) of a semiconductor structure 2000 that may be disposed in the logic region 20 of the IC chip 10, in accordance with some embodiments of the present disclosure. In some embodiments, the semiconductor structure 300 shown in FIG. 4 described above may be a first circuit of an integrated circuit, and the semiconductor structure 2000 shown in FIG. 20 may be a third circuit of the this integrated circuit. FIG. 21 illustrates an X-Z cross-sectional view of the semiconductor structure 2000 along a line A-A in FIG. 20, in accordance with some embodiments of the present disclosure.

The semiconductor structure 2000 shown in FIGS. 20 and 21 may be similar to the semiconductor structure 300 shown in FIGS. 4 and 5A-5E described above, except the n-type well region NW1 shown in FIGS. 4 and 5A-5E is replaced by a p-type well region PW2 and an n-type well region NW3 shown in FIGS. 20 and 21.

Referring to FIGS. 20 and 21, in the semiconductor structure 2000, the gate structures 306A and a part of the active region 302 (including the nanostructures 310A and the source/drain features 312A-312B) may be formed over the p-type well region PW2, the gate structures 308A and a part of the active region 302 (including the nanostructures 310B and the source/drain features 312B-312C) may be formed over the n-type well region NW3, and the gate structures 306B, 308B and the active region 304 (including the nanostructures 310C-310D and the source/drain features 314A-314C) may be formed over the n-type well region NW3.

In semiconductor structure 2000, the gate structure 306A, the nanostructures 310A, and the source/drain features 312A-312B may construct a fifth NMOSFET over the p-type well region PW2. In the semiconductor structure 2000, the gate structure 308A, the nanostructures 3101B, and the source/drain features 312B-312C may construct a sixth NMOSFET over the n-type well region NW3. In the semiconductor structure 2000, the gate structure 306B, the nanostructures 310C, and the source/drain features 314A-314B may construct a fifth PMOSFET over the n-type well region NW3. In the semiconductor structure 2000, the gate structure 308B, the nanostructures 310D, and the source/drain features 314B-314C may construct a sixth PMOSFET over the n-type well region NW3.

As described above, the NMOSFETs can be formed over the n-type well region by forming the bottom dielectric layer 330. Therefore the source/drain features of the semiconductor structure 2000 may be formed over n-type well region or the p-type well region. In some embodiments, the source/drain feature 312A is formed over the p-type well region PW2, the source/drain feature 312C is formed over the n-type well region NW3, and the source/drain feature 312B is formed over both of the p-type well region PW2 and the n-type well region NW3, as shown in FIG. 21. In other embodiments, the boundary between the p-type well region PW2 and n-type well region NW3 can be adjusted, such that the source/drain feature 312B is formed over the p-type well region PW2 or the n-type well region NW3.

As described above, in the semiconductor structure 300, the NMOSFETs (i.e., the first and second NMOSFETs described above) and the PMOSFETs (i.e., the first and second PMOSFETs described above) are formed over the same n-type well region (i.e., the n-type well region NW1). In contrast, in the semiconductor structure 2000, the NMOS-FETs and the PMOSFETs are formed over the different type of well regions. For example, in the semiconductor structure 2000, the fifth NMOSFET is formed over the p-type well region PW2, and the sixth NMOSFET and the third and fourth PMOSFETs are formed over the n-type well region NW3. By combining the first and third circuits (i.e., the semiconductor structures 300 and 2000) in a single IC, the single IC may have two types of NMOSFETs. One type of NMOSFET is formed over the n-type well region, and the other type of NMOSFET is formed over the p-type well region. The ratio of these two types of the NMOSFETs can be flexibly adjusted according to the design requirements.

Although the source/drain features of the semiconductor structure 2000 are illustrated as source/drain features 312A-312C and 314A-314C, the source/drain features of the semiconductor structure 2000 may include other configurations. For example, the source/drain features of the semiconductor structure 2000 may be formed as the source/drain features 612A-612C, 712A-712C, 812A-812C, 914B, 1014B, 1114B, 1214B, 1312A-1312C, 1314A-1314C, 1412A-1412C, 1514B, 1614B, and 1714B, as shown in FIGS. 6-17.

The following shows the formation of the semiconductor structure 300. FIGS. 22A to 30A are X-Z cross-sectional views of the semiconductor structure 300 at various fabrication stages along a line A-A of FIG. 4, in accordance with some embodiments of the present disclosure. FIGS. 22B to 30B are X-Z cross-sectional views of the semiconductor structure 300 at various fabrication stages along a line B-B of FIG. 4, in accordance with some embodiments of the present disclosure.

Figures 22A, 22B:
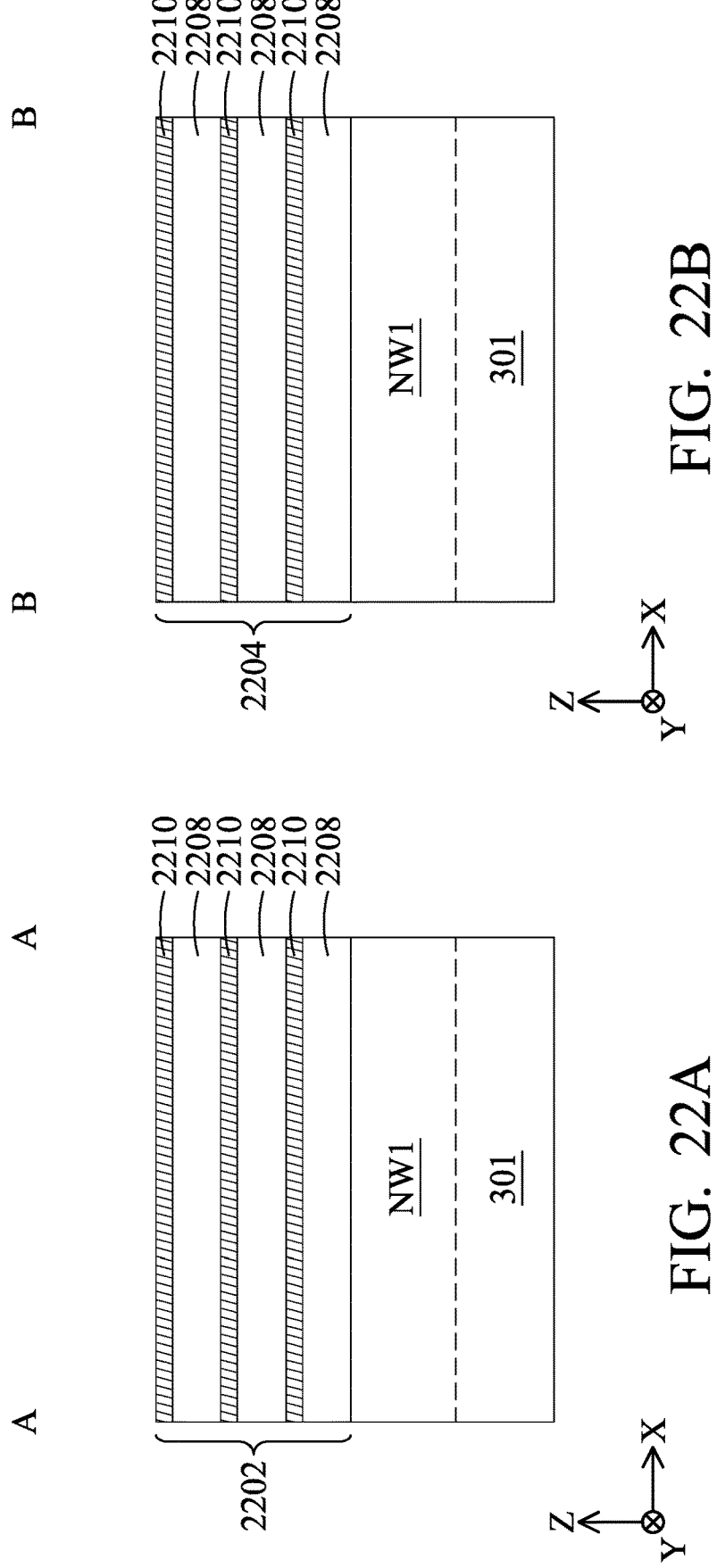
FIGS. 22A, 23A, 24A, 25A, 26A, 27A, 28A, 29A and 30A are X-Z cross-sectional views of the semiconductor structure at various fabrication stages along a line A-A of FIG. 4, in accordance with some embodiments of the present disclosure.
FIGS. 22B, 23B, 24B, 25B, 26B, 27B, 28B, 29B and 30B are X-Z cross-sectional views of the semiconductor structure at various fabrication stages along a line B-B of FIG. 4, in accordance with some embodiments of the present disclosure.

Referring to FIGS. 22A and 22B, the substrate 301 is provided, and the n-type well region NW1 is formed in or on the substrate 301, in accordance with some embodiments. In other embodiments, the substrate 301 may be formed to include other well regions, such as n-type well regions NW2, NW3 and p-type well regions PW1, PW2 described above. The materials and methods used in forming the substrate 301 and the various well regions (e.g., n-type well regions NW1, NW2, NW3 and p-type well regions PW1, PW2) have been discussed above, and are not repeated herein.

Still referring to FIGS. 22A and 22B, a stack including semiconductor layers 2208 and semiconductor layers 2210 are formed over the n-type well region NW1, and is then patterned into a fin structure 2202 and a fin structure 2204, in accordance with some embodiments. The fin structures 2202 and 2204 may be included in the active region 302 and 304, respectively.

The semiconductor layers 2208 and 2210 are alternately stacked in the Z-direction, and may have different semiconductor compositions. In some embodiments, semiconductor layers 2208 are formed of silicon germanium and semiconductor layers 2210 are formed of silicon. In these embodiments, the additional germanium content in the semiconductor layers 2208 allow selective removal or recess of the semiconductor layers 2208 without causing substantial damage to the semiconductor layers 2210, so that the semiconductor layers 2208 are also referred to as sacrificial layers. In some embodiments, the semiconductor layers 2208 and 2210 are epitaxially grown over or on the substrate 301 using an epitaxial growth such as VPE, MOCVD, MBE, although other deposition processes, such as CVD, LPCVD, ALD, UHVCVD, RPCVD, a combination thereof, or the like, may also be utilized. The semiconductor layers 2208 and the semiconductor layers 2210 are deposited alternately, one-after-another, to form the stack.

Then the stack including the semiconductor layers 2208 and 2210 is patterned into fin structures 2202 and 2204 over the n-type well region NW1. Each of the fin structures 2202 and 2204 includes the semiconductor layers 2208 and 2210 that are alternately stacked in the Z-direction. In some embodiments, although not shown in FIGS. 22A and 22B, after the formation of the fin structures 2202 and 2204, the isolation structures 316 described above are then formed over the substrate 301 and between the fin structures 2202 and 2204. The material and the method of forming the isolation structures 316 have been discussed above, and are not repeated herein.

Figures 23A, 23B:
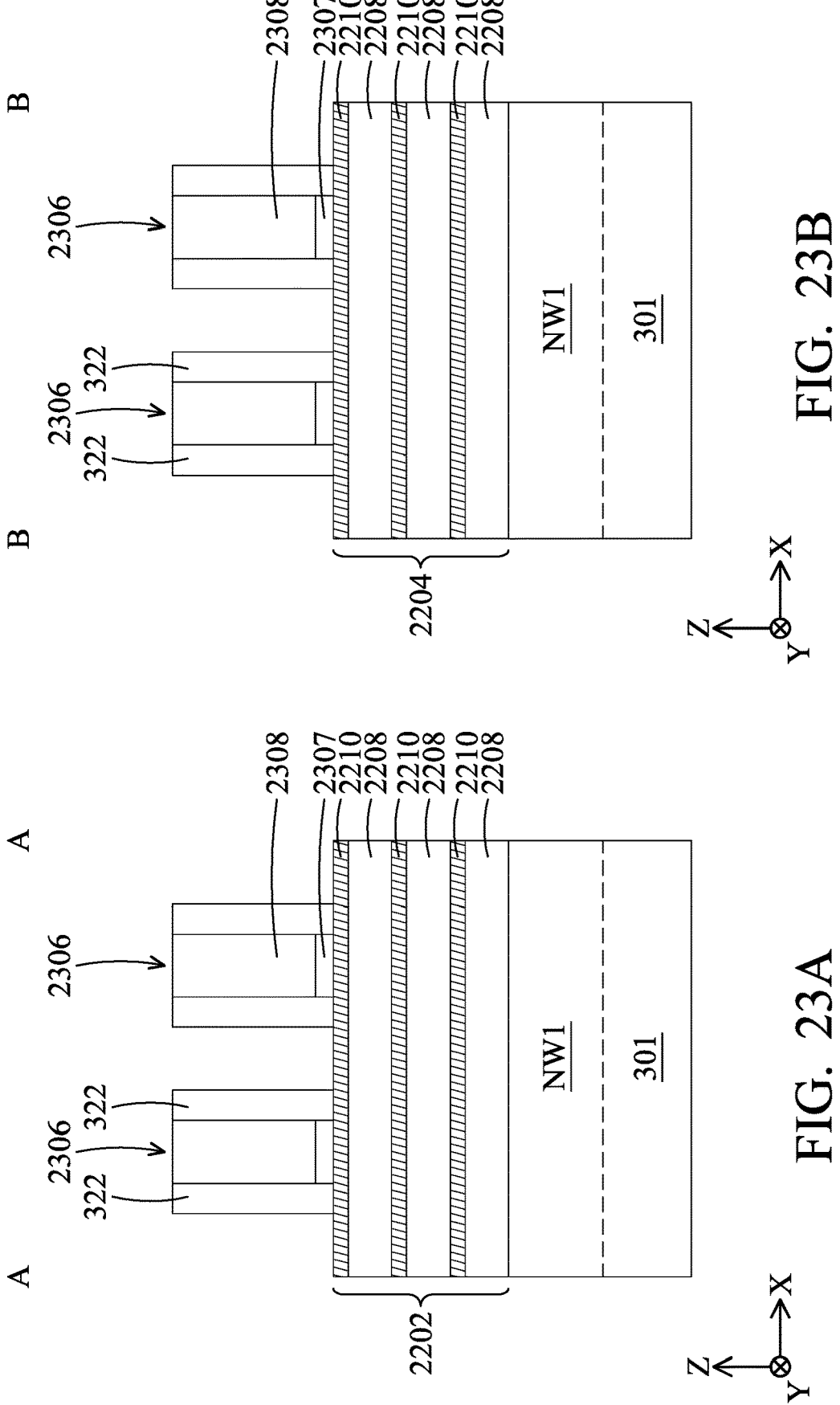

Referring to FIGS. 23A and 23B, dummy gate structures 2306 are formed over the fin structures 2202 and 2204, in accordance with some embodiments. In some embodiments, to form the dummy gate structures 2306, a dummy gate dielectric material for dummy gate dielectric layers 2307 is first formed over the fin structures 2202 and 2204. In some embodiments, the dummy gate dielectric layers 2307 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate electrode material for dummy gate electrodes 2308 is formed over the dummy gate dielectric material. The dummy gate electrode material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or a combination thereof. The dummy gate electrode material and/or the dummy gate dielectric material may be formed by way of a thermal oxidation process and/or a deposition process (e.g., PVD, CVD, PECVD, and ALD).

After the formation of the dummy gate dielectric material and the dummy gate electrode material, one or more etching processes may be performed to pattern the dummy gate electrode material for the dummy gate electrodes 2308 and the dummy gate dielectric material for the dummy gate dielectric layers 2307, thereby forming the dummy gate structures 2306 each having the dummy gate dielectric layer 2307 and the dummy gate electrode 2308. The dummy gate structures 2306 may undergo a gate replacement process through subsequent process to form metal gates (e.g., the gate structures 306A, 306B, 308A, and 308B), such as a high-k metal gate, as discussed in greater detail below.

Still referring to FIGS. 23A and 23B, after forming the dummy gate structures 2306, the gate spacers 322 are formed on sidewalls of the dummy gate structures 2306 and over the top surfaces of the fin structures 2202 and 2204. More specifically, the gate spacers 322 are formed on opposite sidewalls of the dummy gate structures 2306. In some embodiments, the gate spacers 322 may be formed by conformally depositing a spacer layer (containing the dielectric material) over the fin structures 2202, 2204 and dummy gate structures 2306, followed by an anisotropic etching process to remove top portions of the spacer layer from the top surfaces of the fin structures 2202, 2204 and dummy gate structures 2306. After the anisotropic etching process, portions of the spacer layer on the sidewall surfaces of the fin structures 2202, 2204 and the dummy gate structures 2306 substantially remain and become the gate spacers 322. In some embodiments, the anisotropic etching process is a dry (e.g., plasma) etching process. Additionally or alternatively, the formation of the gate spacers 322 may also involve chemical oxidation, thermal oxidation, ALD, CVD, and/or other suitable methods. The material of the gate spacers 322 have been discussed above, and are not repeated herein.

Figures 24A, 24B:
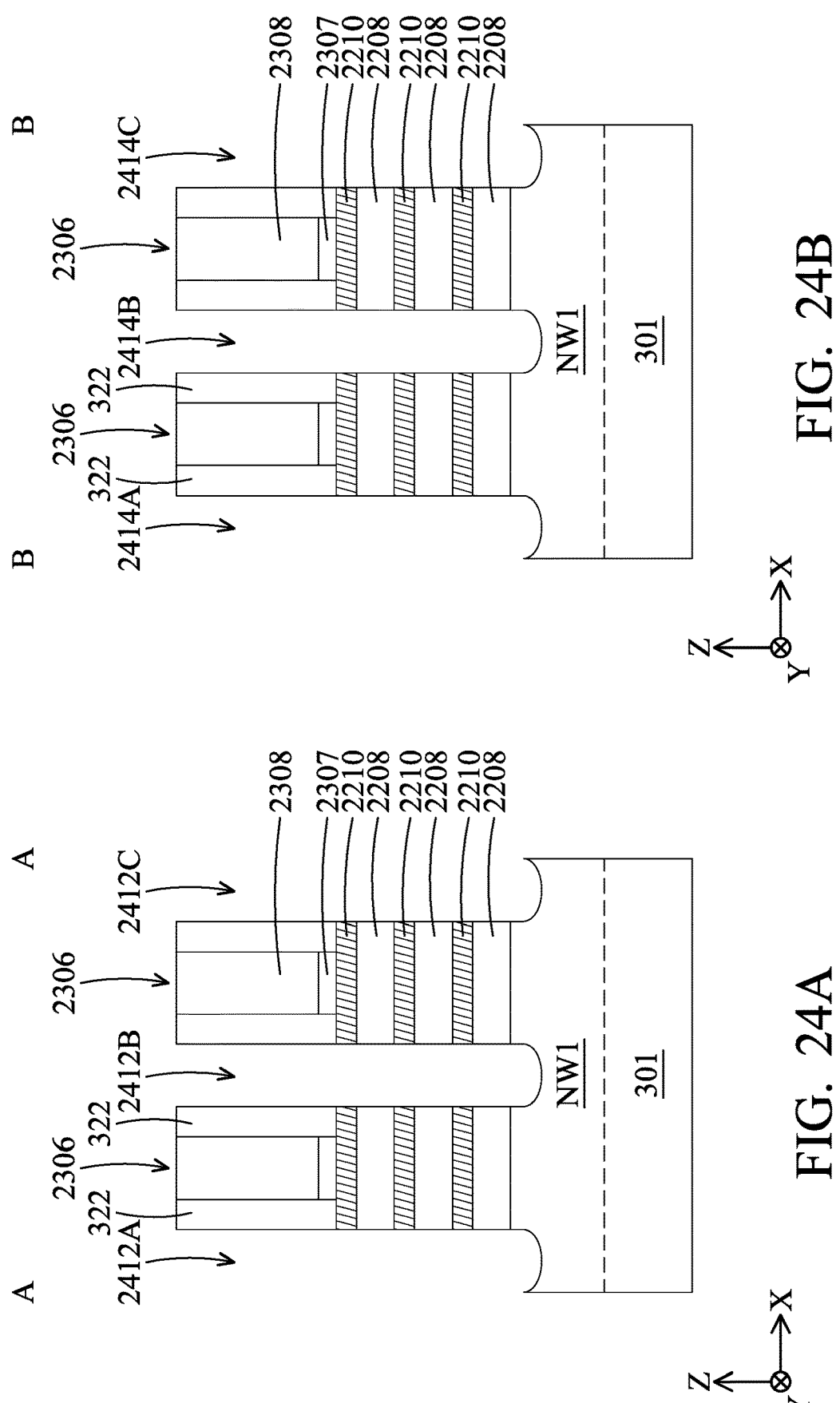

Referring to FIGS. 24A and 24B, the fin structure 2202 are recessed to form source/drain trenches 2412A-2412C in the fin structure 2202, and the fin structure 2204 are recessed to form source/drain trenches 2414A-2414C in the fin structure 2204. Specifically, the source/drain trenches 2412A-2412C and 2414A-2414C may be formed by performing one or more etching processes to remove portions of the semiconductor layers 2208, the semiconductor layers 2210, and the substrate 301 that do not vertically overlap or be covered by the dummy gate structures 2306 and the gate spacers 322. In some embodiments, a single etchant may be used to remove the semiconductor layers 2208, the semiconductor layers 2210, and the substrate 301. In other embodiments, multiple etchants may be used to perform the etching process.

In some embodiments, portions of the substrate 301 are etched, as shown in FIGS. 24A and 24B. In other words, the source/drain trenches 2412A-2412C and 2414A-2414C extend into the substrate 301 (i.e., extend into the n-type well region NW1), so that bottom surfaces of the source/drain trenches 2412A-2412C and 2414A-2414C are lower than the topmost surfaces of the substrate 301. In some embodiments, the source/drain trenches 2412A-2412C and 2414A-2414C extend into the substrate 301 by a depth that is in a range from about 5 nm to about 50 nm.

Figures 25A, 25B:
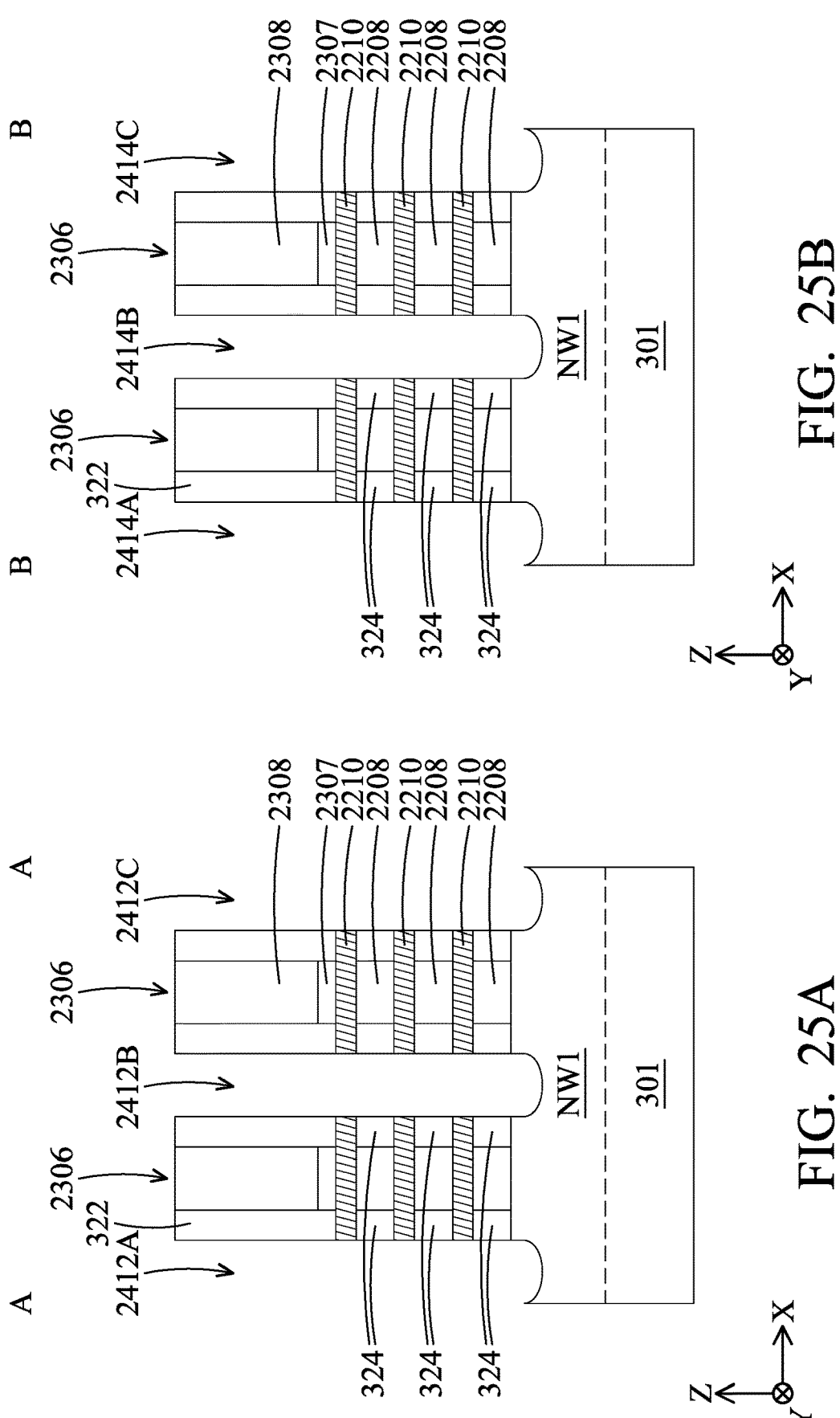

Referring to FIGS. 25A and 25B, the inner spacers 324 are formed under the gate spacers 322 and between the semiconductor layers 2210 as well as between the semiconductor layer 2210 and the substrate 301. In the formation of the inner spacers 324, the semiconductor layers 2208 exposed in the source/drain trenches 2412A-2412C and 2414A-2414C are partially recessed by a selective etching process, in accordance with some embodiments. Specifically, the selective etching process is performed that selectively etches the side portions of the semiconductor layers 2208 below the gate spacers 322 through the source/drain trenches 2412A-2412C and 2414A-2414C, with minimal (to no) etching of semiconductor layers 2210. After the selective etching process, inner spacer recesses are formed between the semiconductor layers 2210 as well as between the semiconductor layer 2210 and the substrate 301, below the gate spacers 322. The selective etching process is configured to laterally etch (e.g., along the X-direction) the semiconductor layers 2208 below the gate spacers 322. The selective etching process may be a dry etching process, a wet etching process, other suitable etching process, or combinations thereof.

After forming the inner spacer recesses, the inner spacers 324 may be formed to fill the inner spacer recesses. In some embodiments, sidewalls of the inner spacers 324 are aligned to sidewalls of the gate spacers 322 and the semiconductor layers 2210, as shown in FIGS. 25A and 25B. In some embodiments, in order to form the inner spacers 324, a deposition process is performed to form a spacer layer into the source/drain trenches 2412A-2412C and 2414A-2414C and the inner spacer recesses, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 2412A-2412C and 2414A-2414C. The deposition process is configured to ensure that the spacer layer fills the inner spacer recesses between the semiconductor layers 2210 as well as between the semiconductor layer 2210 and the substrate 301 under the gate spacers 322.

Then, an etching process is performed that selectively etches the spacer layer to form inner spacers 324 (as shown in FIGS. 25A and 25B) with minimal (to no) etching of the semiconductor layer 2210, the substrate 301, the dummy gate structures 2306, and the gate spacers 322. The material of the inner spacers 324 have been discussed above, and are not repeated herein.

Figures 26A, 26B:
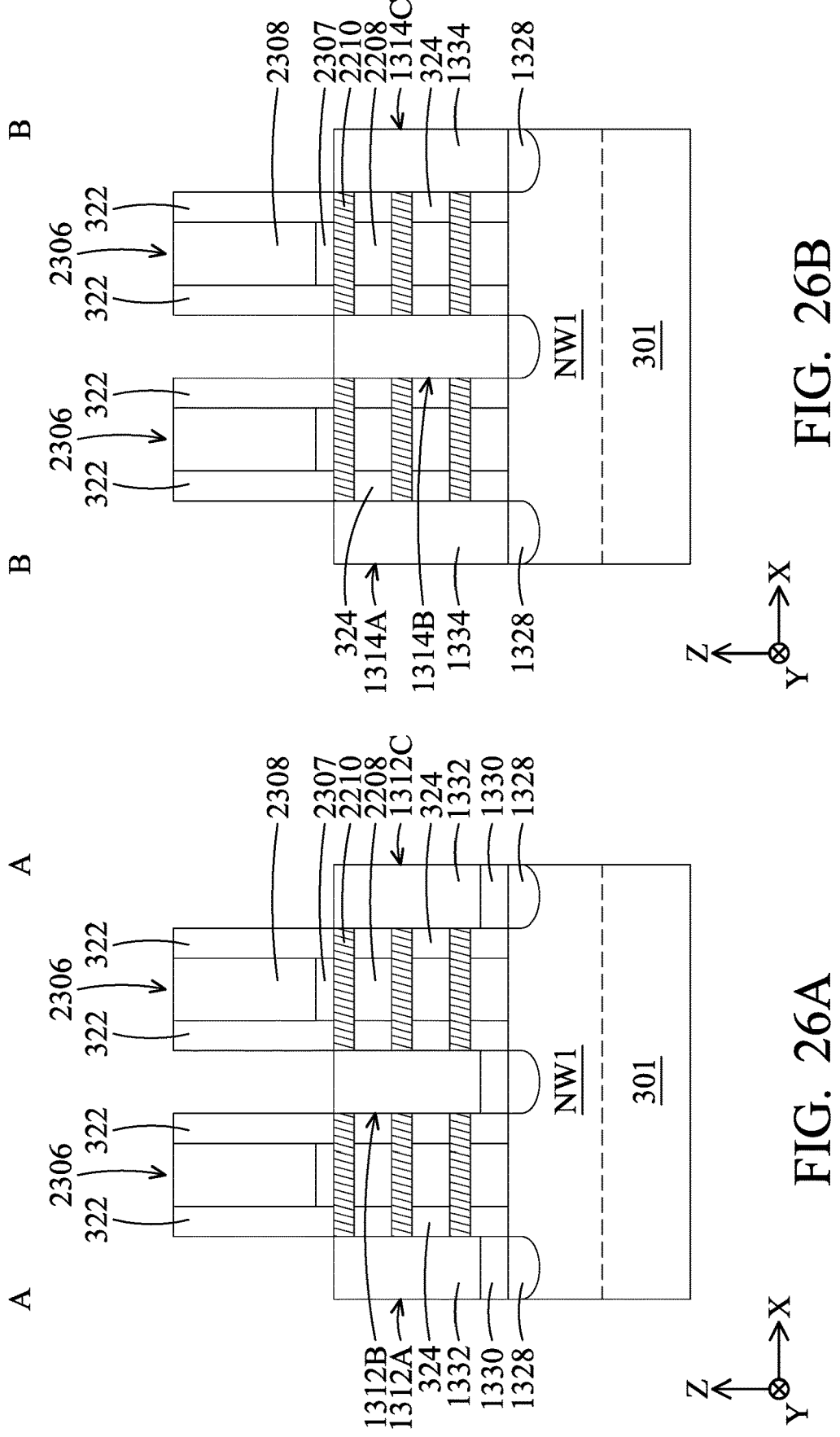

Referring to FIGS. 26A and 26B, the undoped epitaxial layers 1328 are formed in bottom portions of the source/drain trenches 2412A-2412C and 2414A-2414C, in accordance with some embodiments. The material and the method of forming the undoped epitaxial layers 1328 have been discussed above, and are not repeated herein.

Still referring to FIGS. 26A and 26B, the bottom dielectric layers 1330 are formed in each of the source/drain trenches 2412A-2412C and over the undoped epitaxial layers 1328, in accordance with some embodiments. In some embodiments, the bottom dielectric layers 1330 may be formed by depositing a dielectric material layer in the source/drain trenches 2412A-2412C and 2414A-2414C, followed by an isotropic etching process to remove the portions of the dielectric material layer on the sidewalls of the source/drain trenches 2412A-2412C and 2414A-2414C. After the isotropic etching process, the remaining portions of the dielectric material layer on the undoped epitaxial layers 1328 become the bottom dielectric layers 1330.

Still referring to FIGS. 26A and 26B, the doped epitaxial layers 1332 are formed in each of the source/drain trenches 2412A-2412C and the doped epitaxial layers 1334 are formed in each of the source/drain trenches 2414A-2414C, thereby forming the source/drain features 1312A-1312C and the source/drain features 1314A-1314C, respectively, in accordance with some embodiments. The materials and methods used in forming the doped epitaxial layers 1332 and 1334 have been discussed above, and are not repeated herein. In some embodiments, each of the source/drain features 1312A-1312C includes the undoped epitaxial layer 1328 over the n-type well region NW1, the bottom dielectric layer 1330 over the undoped epitaxial layer 1328, and the doped epitaxial layer 1332 over the bottom dielectric layer 1330, as shown in FIG. 26A. In some embodiments, each of the source/drain features 1314A-1314C includes the undoped epitaxial layer 1328 over the n-type well region NW1 and the doped epitaxial layer 1334 over the undoped epitaxial layer 1328, as shown in FIG. 26B.

In some embodiments, the formation of the undoped epitaxial layers 1328 is omitted, such that the bottom dielectric layers 1330 and the doped epitaxial layer 1334 are in direct contact with the n-type well region NW1. In these embodiments, the resulting structure is the same as or similar to the structures shown in FIGS. 5A, 5B, and 6. In some embodiments, the parameters of the epitaxial growth for the doped epitaxial layers 1332 are adjusted, such that air gaps are formed between the doped epitaxial layers 1332 and the bottom dielectric layers 1330. In these embodiments, the resulting structure is the same as or similar to the structures shown in FIGS. 7A, 8 and 14.

In some embodiments, an additional process is performed to form an additional bottom dielectric layer in the source/drain feature 1314B before forming the doped epitaxial layers 1334. For example, the additional bottom dielectric layer is formed on the undoped epitaxial layer 1328 in the source/drain trench 2414B, such that the additional bottom dielectric layer is sandwiched between the undoped epitaxial layer 1328 and the doped epitaxial layers 1334, and the resulting structure is the same as or similar to the structures shown in FIG. 15. For example, the additional bottom dielectric layer is formed in the source/drain trench 2414B, and the resulting structure is the same as or similar to the structures shown in FIGS. 9 and 10.

In some embodiments, an additional process is performed to form an additional bottom dielectric layer in the source/drain trench 2414B. For example, the additional bottom dielectric layer is formed in the source/drain trench 2414B and an undoped layer is formed on the additional bottom dielectric layer, such that the undoped layer is sandwiched between the additional bottom dielectric layer and the doped epitaxial layers 1334, and the resulting structure is the same as or similar to the structures shown in FIG. 17. In some embodiments, the parameters of the epitaxial growth for the doped epitaxial layers 1334 of the source/drain feature 1314B are adjusted, such that an air gap is formed in the source/drain feature 1314B. In these embodiments, the resulting structure is the same as or similar to the structures shown in FIGS. 11, 12 and 16.

Figures 27A, 27B:
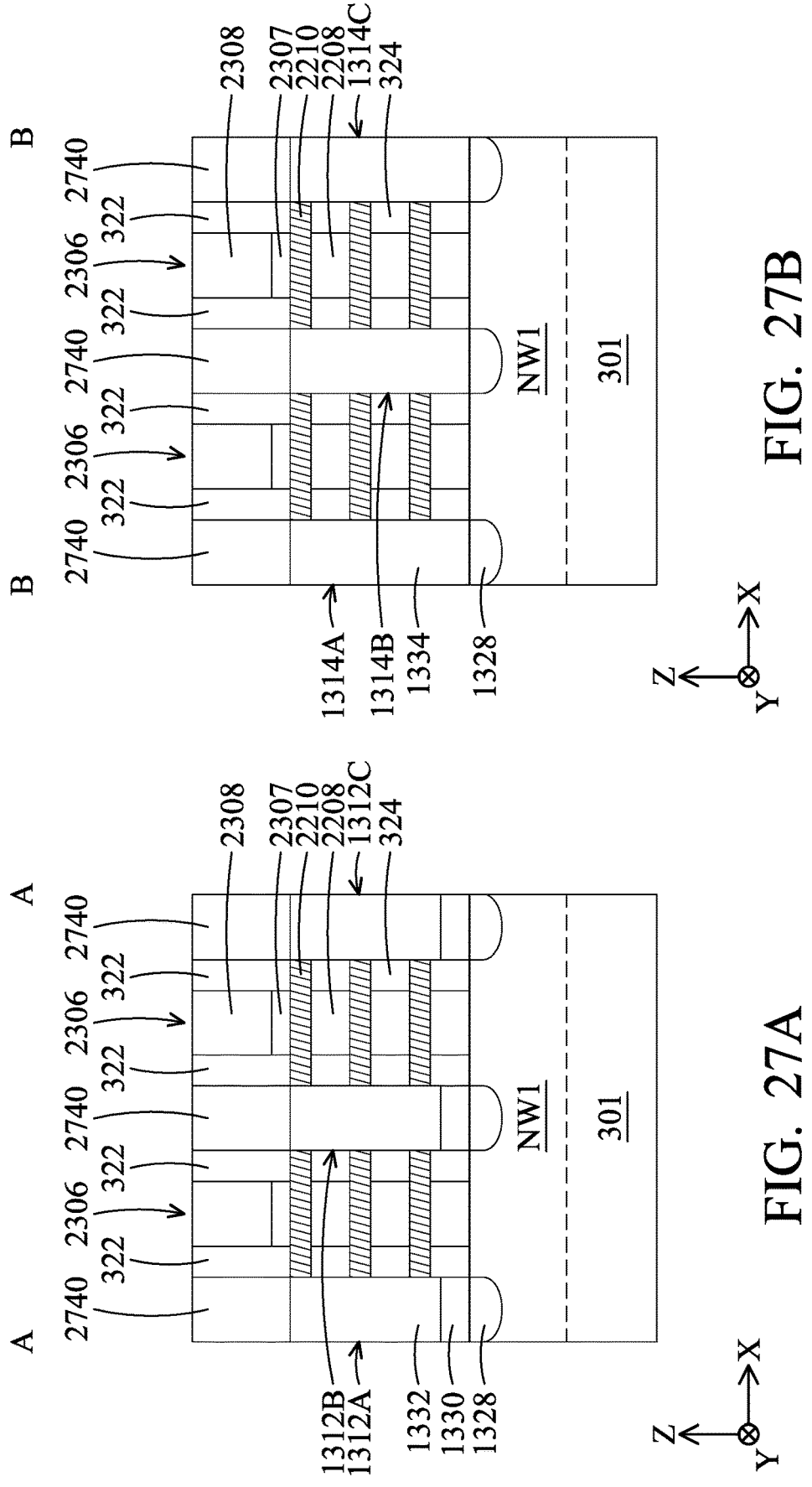

Referring to FIGS. 27A and 27B, an ILD layer 2740 is formed to fill the space between the gate spacers 322, in accordance with some embodiments. The ILD layer 2740 may include tetraethylorthosilicate (TEOS) formed oxide, un-doped silicate glass, or doped silicon oxide such as BPSG, FSG, PSG, BSG, a low-k dielectric material, other suitable dielectric material, or combinations thereof. The ILD layer 2740 may be formed by PECVD, FCVD (flowable CVD), or other suitable methods. Subsequent to the formation of the ILD layer 2740, a chemical mechanical polishing (CMP) process and/or other planarization process is performed on the ILD layer 2740 until the top surfaces of the dummy gate structures 2306 are exposed. In some embodiments, portions of the dummy gate electrode layers 2306 and the gate spacers are removed after the planarization process.

In some embodiments, before the formation of the ILD layer 2740, a contact etch stop layer (CESL) may be conformally formed on the sidewalls of the gate spacers 322 and over the top surfaces of the source/drain features 1312A-1312C and 1314A-1314C. The ILD layer 2740 is then formed over and between the CESL to fill the space between the CESL. The CESL includes a material that is different than ILD layer 2740. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s), and may be formed by CVD, PVD, ALD, or other suitable methods.

Figures 28A, 28B:
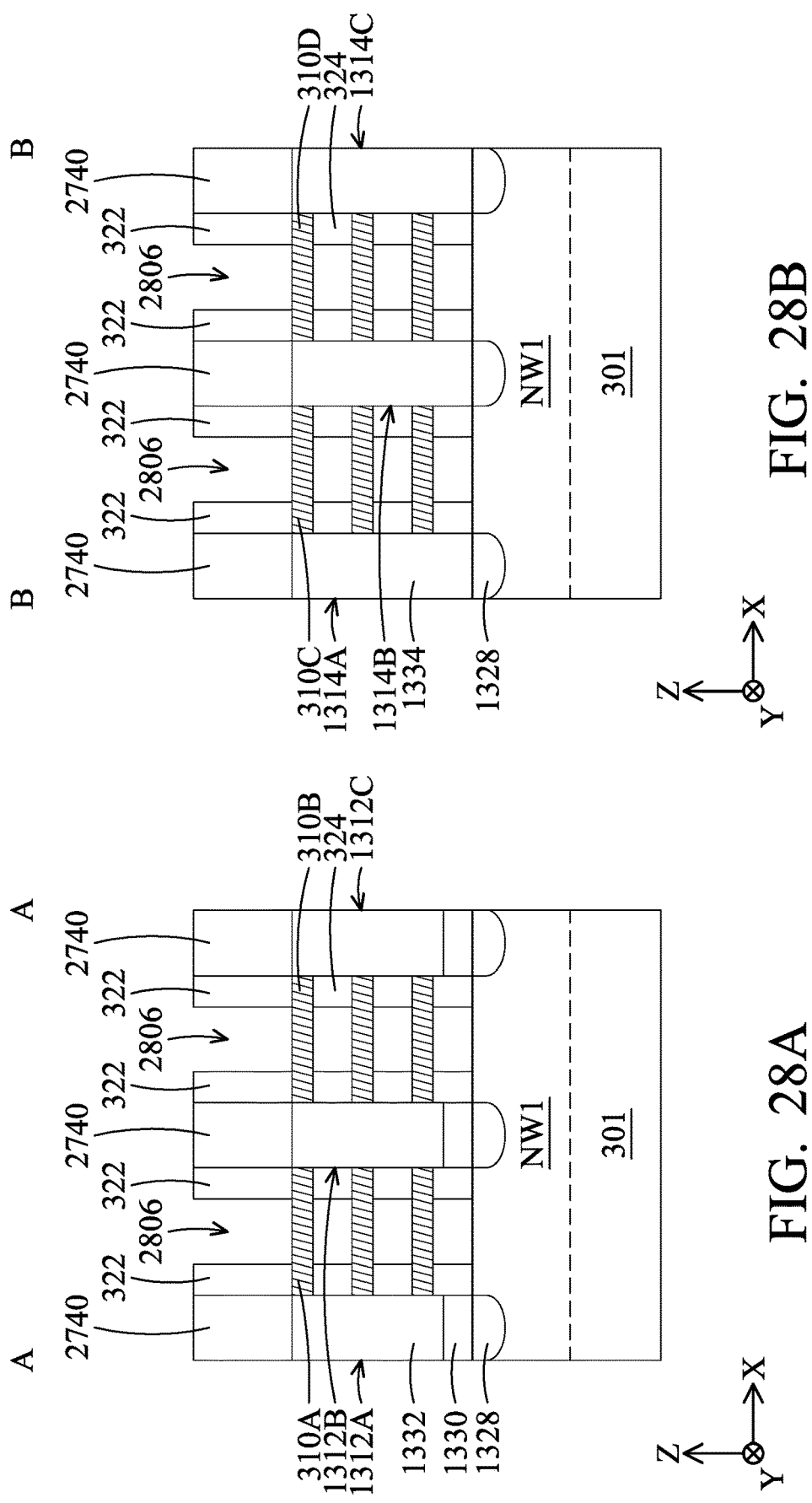

Referring to FIGS. 28A and 28B, the dummy gate structures 2306 are selectively removed through any suitable lithography and etching processes, in accordance with some embodiments. In some embodiments, the lithography process may include forming a photoresist layer (resist), exposing the resist to a pattern, performing a post-exposure bake process, and developing the resist to form a masking element, which exposes the region including the dummy gate structures 2306. Then, the dummy gate structures 2306 are selectively etched through the masking element. Etch selectivity may be achieved by selecting the appropriate etching chemicals, and the dummy gate structures 2306 may be removed without substantially affecting the gate spacers 322, the inner spacers 324, and the substrate 301. The removal of the dummy gate structures 2306 creates gate trenches 2806. The gate trenches 2806 expose the top surfaces of the topmost semiconductor layers 2210 underlies the dummy gate structures 2306.

Still referring to FIGS. 28A and 28B, the semiconductor layers 2208 are selectively removed through the gate trenches 2806, using a wet or dry etching process for example, in accordance with some embodiments. After the semiconductor layers 2208 are selectively removed, the semiconductor layers 2210 are exposed in the gate trenches 2806 to form the nanostructures 310A-310D. Such a process may also be referred to as a wire release process, a nanowire release process, a nanosheet release process, a nanowire formation process, a nanosheet formation process, or a nanowire formation process. The configurations of the nanostructures 310A-310D have been discussed above, and are not repeated herein.

Figures 29A, 29B:
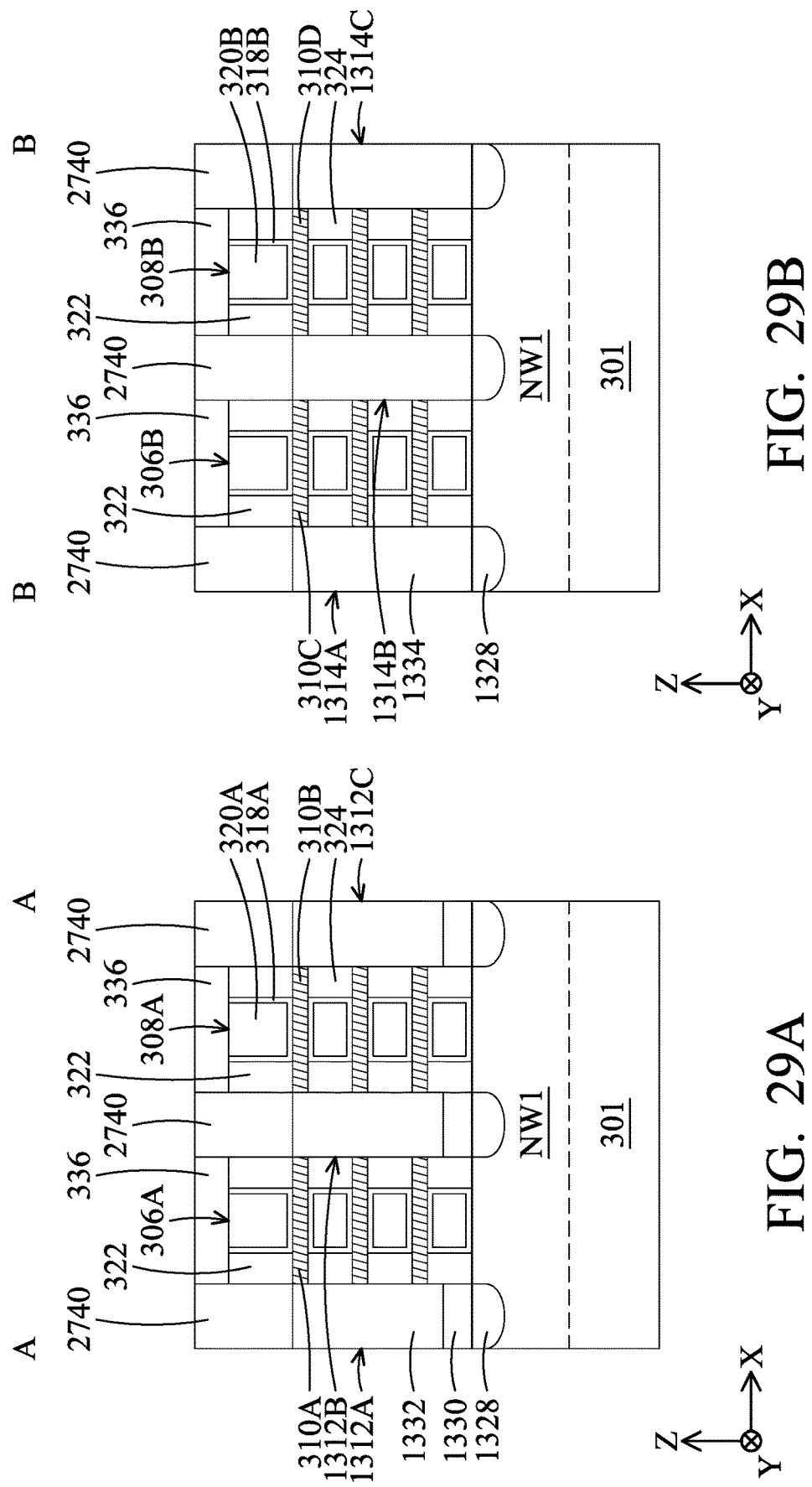

Referring to FIGS. 29A and 29B, the gate structures 306A, 306B, 308A, and 308B discussed above are formed in the gate trenches 2806, in accordance with some embodiments. In some embodiments, the gate structures 306A, 306B, 308A, and 308B wrap around each of the semiconductor layers 2210, that is, wrap around each of the nanostructures 310A-310D. In some embodiments, the gate structure 306A wraps around each of nanostructures 310A, the gate structure 308A wraps around each of nanostructures 3101B, the gate structure 306B wraps around each of nanostructures 310C, and the gate structure 308B wraps around each of nanostructures 310D.

In some embodiments, the gate structures 306A and 308A each has the gate dielectric layer 318A and the gate electrode layer 320A. The gate dielectric layers 318A wrap around each of the nanostructures 310A and 3101B, and the gate electrode layers 320A wrap around the gate dielectric layer 318A. In some embodiments, the gate structures 306B and 308B each has the gate dielectric layer 318B and the gate electrode layer 320B. The gate dielectric layers 318B wrap around each of the nanostructures 310C and 310D, and the gate electrode layers 320B wrap around the gate dielectric layer 318B. In some embodiments, the gate dielectric layers 318A and 318B are also formed on sidewalls of the inner spacers 324 and the gate spacers 322. The materials and methods used in forming the gate dielectric layers 318A, 318B and the gate electrode layers 320A, 320B have been discussed above, and are not repeated herein.

Still referring to FIGS. 29A and 29B, after forming the gate structures 306A, 306B, 308A, and 308B, portions of the gate structures 306A, 306B, 308A, and 308B and the gate spacers 322 are recessed, and the gate top dielectrics 336 discussed above are formed over the gate structures 306A, 306B, 308A, and 308B and the gate spacers 322.

Figures 30A, 30B:
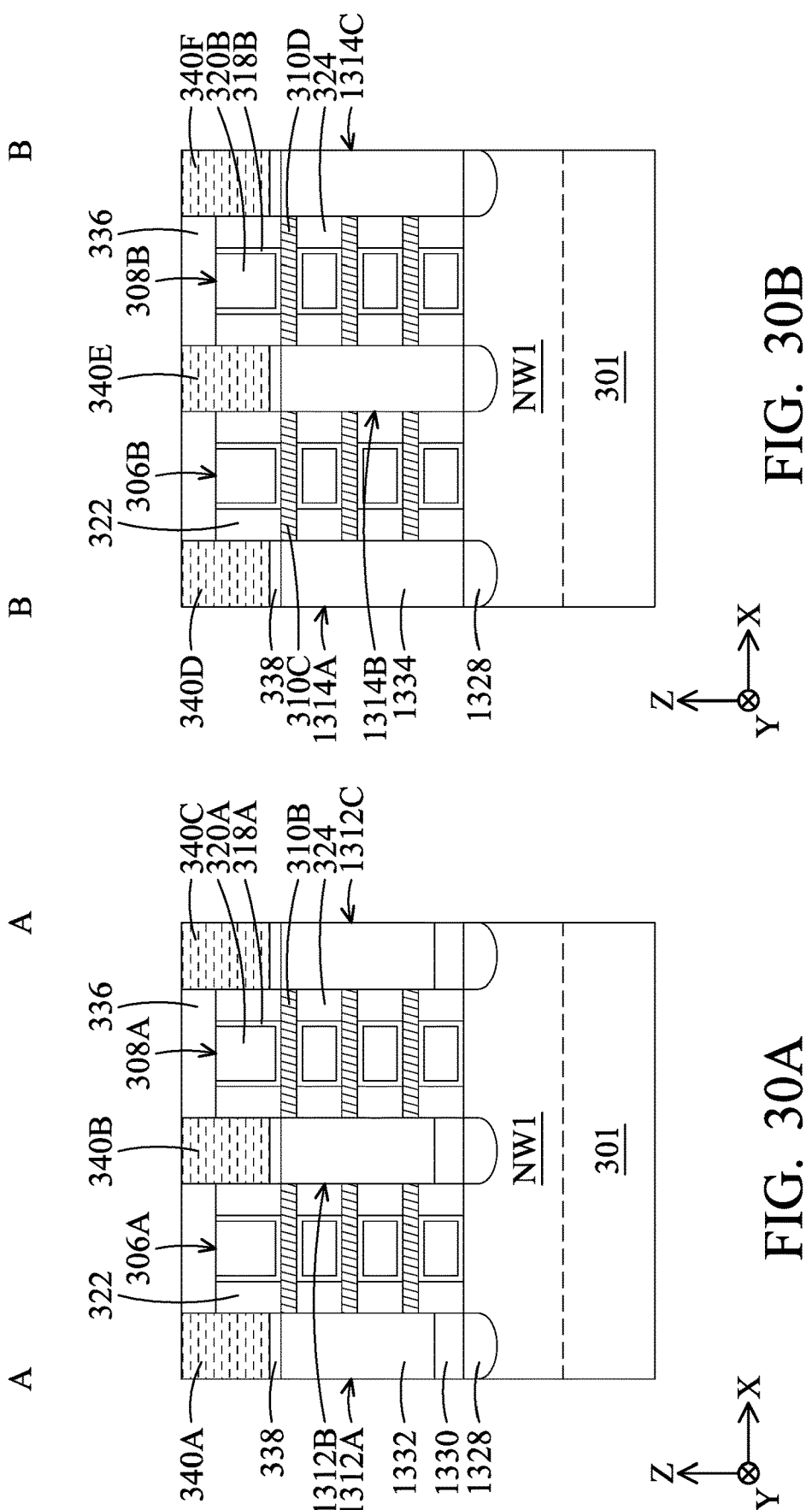

Referring to FIGS. 30A and 30B, the source/drain contacts 340 discussed above are formed in the ILD layer 2740, in accordance with some embodiments. In some embodiments, the source/drain contacts 340A, 340B, and 340C are over and electrically connected to the source/drain features 1312A, 1312B, and 1312C, respectively. In some embodiments, the source/drain contacts 340A and 340B are on the opposite sides of the gate structure 306A, and the source/drain contacts 340B and 340C are on the opposite sides of the gate structure 308A. In some embodiments, the source/drain contacts 340D, 340E, and 340F are over and electrically connected to the source/drain features 1314A, 1314B, and 1314C, respectively. In some embodiments, the source/drain contacts 340D and 340E are on the opposite sides of the gate structure 306B, and the source/drain contacts 340E and 340F are on the opposite sides of the gate structure 308B.

In some embodiments, additional features are formed between the source/drain features 1312A-1312C, 1314A-1314C and the source/drain contacts 340, such as the silicide layers 338 discussed above. As such, the transistors in the semiconductor structure 300 are formed.

After the operation shown in FIGS. 30A and 30B, the further processes may be performed to complete the semiconductor structure 300. After the further processes, the resulting structure may be the same as or similar to the structure shown in FIGS. 13A and 13B. For example, the ILD layer 342 may be formed over the structure shown in FIGS. 30A and 30B, and the gate vias 346A-346B and the source/drain vias 348A-348E may be formed in the ILD layer 342. For example, the IMD layer 344 may be formed over the ILD layer 342, and the metal layer M1 (e.g., the metal conductors 350A-350G) may be formed in the IMD layer 344.

The embodiments disclosed herein are related to semiconductor structures, and more particularly to semiconductor structures including NMOSFETs and PMOSFETs formed over the same well region, and the NMOSFETs further include bottom dielectric layers in the source/drain features. The present embodiments provide one or more of the following advantages. The NMOSFETs and PMOSFETs can be formed over the same well region instead of two well regions, and thus the well process can be simplified and the well isolation leakage can be prevented. Moreover, since the source/drain features of the NMOSFET are isolated from the underlying well region by the bottom dielectric layers, the off-state drain-to-bulk leakage current Iboff and the off-state drain-to-source leakage current Isoff can be reduced. In addition, the capacitance between source/drain feature and gate structure and the capacitance between source/drain feature and bulk (i.e., the substrate) can also be reduced. Furthermore, the source/drain features of the PMOSFETs that are connected to the non-high voltage lines may also include bottom dielectric layers, which can reduce the drain-to-well capacitance and the gate-to-drain capacitance, and improve the RC-delay of the device.

Thus, one of the embodiments of the present disclosure describes a semiconductor structure. The semiconductor structure includes a substrate; a well region disposed in the substrate, wherein the well region includes a first region and a second region; first nanostructures suspended over and vertically arranged over the first region; and second nanostructures suspended over and vertically arranged over the second region. The semiconductor structure further includes a gate structure, extending across the first region and the second region, and wrapped around each of the first nanostructures and each of the second nanostructures. The semiconductor structure further includes a first source/drain feature and a second source/drain feature, attached to opposite sides of the first nanostructures, wherein each of the first source/drain feature and the second source/drain feature includes a first bottom dielectric layer over the first region of the well region and a first doped epitaxial layer over the first bottom dielectric layer; and a third source/drain feature and a fourth source/drain feature, attached to opposite sides of the second nanostructures, wherein each of the third source/drain feature and the fourth source/drain feature includes a second doped epitaxial layer over the second region of the well region.

In some embodiments, the well region is an n-type well region, the first doped epitaxial layer is an n-type doped epitaxial layer, and the second doped epitaxial layer is a p-type doped epitaxial layer.

In some embodiments, a top surface of the first bottom dielectric layer is lower than a bottom surface of a bottom-most one of the first nanostructures and higher than a top surface of the well region.

In some embodiments, the first bottom dielectric layer extends into the well region and is in direct contact with the well region. In some embodiments, each of the first source/drain feature and the second source/drain feature further includes an air gap sandwiched between the first bottom dielectric layer and the first doped epitaxial layer.

In some embodiments, a thickness of the first bottom dielectric layer is in a range from about 2 nm to about 30 nm. In some embodiments, the second doped epitaxial layer of the third source/drain feature extends into the well region and is in direct contact with the well region.

In some embodiments, the fourth source/drain feature further includes a second bottom dielectric layer sandwiched between the second doped epitaxial layer and the well region.

In some embodiments, the fourth source/drain feature further includes a second air gap sandwiched between the second doped epitaxial layer and the second bottom dielectric layer.

In some embodiments, the gate structure includes a first gate portion wrapped around each of the first nanostructures and a second gate portion wrapped around each of the second nanostructures, the first gate portion includes a first work function material and the second gate portion includes a second work function material that is different from the first work function material.

In another of the embodiments, discussed is a semiconductor structure that includes a substrate and a first complementary metal-oxide-semiconductor (CMOS) device, wherein the first CMOS device includes a first transistor and a second transistor formed on an n-type well region of the substrate. The first transistor includes a first vertical stack including first nanostructures, wherein the first nanostructures are suspended over the n-type well region; first gate structure wrapped around each of the first nanostructures; and a first source/drain feature and a second source/drain feature attached to opposite sides of the first nanostructures, wherein each of the first source/drain feature and the second source/drain feature includes a first bottom dielectric layer and a first doped epitaxial layer over the first bottom dielectric layer. The second transistor includes a second vertical stack including second nanostructures, wherein the second nanostructures are suspended over the n-type well region; a second gate structure wrapped around each of the second nanostructures and engaging with the first gate structure; and a third source/drain feature and a fourth source/drain feature attached to opposite sides of the second nanostructures, wherein each of the third source/drain feature and the fourth source/drain feature includes a second doped epitaxial layer.

In some embodiments, the first doped epitaxial layer is an n-type doped epitaxial layer, and the second doped epitaxial layer is a p-type doped epitaxial layer.

In some embodiments, a top surface of the first bottom dielectric layer is lower than a bottom surface of a bottom-most one of the first nanostructures and higher than a top surface of the n-type well region.

In some embodiments, each of the first source/drain feature and the second source/drain feature further includes an air gap sandwiched between the first bottom dielectric layer and the first doped epitaxial layer.

In some embodiments, each of the first source/drain feature and the second source/drain feature further includes a first undoped epitaxial layer below the first bottom dielectric layer; and each of the third source/drain feature and the fourth source/drain feature further includes an second undoped epitaxial layer below the second doped epitaxial layer.

In some embodiments, the first undoped epitaxial layer and the second undoped epitaxial layer extend into the n-type well region and is in direct contact with the n-type well region.

In some embodiments, the fourth source/drain feature further includes a second bottom dielectric layer sandwiched between the second doped epitaxial layer and the second undoped epitaxial layer.

In some embodiments, the fourth source/drain feature further includes a second bottom dielectric layer extending into the n-type well region, and an undoped layer sandwiched between the second bottom dielectric layer and the second doped epitaxial layer.

In some embodiments, the semiconductor structure further includes a second CMOS device, wherein the second CMOS device includes a third transistor and a fourth transistor formed on the n-type well region of the substrate. The third transistor includes a third vertical stack including third nanostructures, wherein the third nanostructures are suspended over the n-type well region; a third gate structure wrapped around each of the third nanostructures; and the second source/drain feature and a fifth source/drain feature attached to opposite sides of the third nanostructures, wherein each of the first source/drain feature, the second source/drain feature, and the fifth source/drain feature includes a first undoped epitaxial layer, the first bottom dielectric layer, and the first doped epitaxial layer. The fourth vertical stack including fourth nanostructures, wherein the fourth nanostructures are suspended over the n-type well region; a fourth gate structure wrapped around each of the fourth nanostructures and engaging with the first third structure; and the fourth source/drain feature and a sixth source/drain feature attached to opposite sides of the fourth nanostructures, wherein each of the third source/drain feature, the fourth source/drain feature, and the sixth source/drain feature includes a second undoped epitaxial layer and the second doped epitaxial layer.

In some embodiments, the fourth source/drain feature is coupled to the fifth source/drain feature. The semiconductor device further includes a first metal conductor coupled to the first source/drain feature, and a second metal conductor coupled to the third source/drain feature and the sixth source/drain feature.

In some embodiments, the first metal conductor is a low voltage power line, and the second metal conductor is a high voltage power line.

In another of the embodiments, discussed is a semiconductor structure that includes a first circuit, the first circuit includes a first n-type well region; a first vertical stack including first nanostructures and a second vertical stack including second nanostructures, wherein the first nanostructures and the second nanostructures are suspended over the first n-type well region; and a first gate structure wrapped around each of the first nanostructures and a second gate structure wrapped around each of the second nanostructures, wherein the first gate structure is engaged with the second gate structure. The first circuit further includes a first source/drain feature and a second source/drain feature attached to opposite sides of the first nanostructures, wherein each of the first source/drain feature and the second source/drain feature includes a first bottom dielectric layer over the first n-type well region and a first doped epitaxial layer over the first bottom dielectric layer; and a third source/drain feature and a fourth source/drain feature attached to opposite sides of the second nanostructures, wherein each of the third source/drain feature and the fourth source/drain feature includes a second doped epitaxial layer over the first n-type well region.

In some embodiments, the semiconductor structure further includes a second circuit. The second circuit includes a p-type well region and a second n-type well region; a third vertical stack including third nanostructures that are suspended over the p-type well region; a fourth vertical stack including fourth nanostructures that are suspended over the second n-type well region; and a third gate structure wrapped around each of the third nanostructures and a fourth gate structure wrapped around each of the fourth nanostructures. The second circuit further includes a fifth source/drain feature and a sixth source/drain feature attached to opposite sides of the third nanostructures, wherein each of the fifth source/drain feature and the sixth source/drain feature includes the first bottom dielectric layer over the p-type well region and the first doped epitaxial layer over the first bottom dielectric layer; and a seventh source/drain feature and an eighth source/drain feature attached to opposite sides of the fourth nanostructures, wherein each of the seventh source/drain feature and the eighth source/drain feature includes the second doped epitaxial layer over the second n-type well region.

In some embodiments, the first doped epitaxial layer is an n-type doped epitaxial layer, and the second doped epitaxial layer is a p-type doped epitaxial layer.

In some embodiments, a top surface of the first bottom dielectric layer is lower than bottom surfaces of a bottommost one of the first nanostructures and a bottommost one of the third nanostructures, and higher than top surfaces of the first n-type well region and the p-type well region.

In some embodiments, each of the first source/drain feature, the second source/drain feature, the fifth source/drain feature, and the sixth source/drain feature further includes an air gap sandwiched between the first bottom dielectric layer and the first doped epitaxial layer.

In yet another of the embodiments, discussed is a method of forming a semiconductor structure. The method includes forming a well region in a substrate; forming a first fin structure and a second fin structure over the well region, wherein each of the first fin structure and the second fin structure includes first semiconductor layers and second semiconductor layers alternately stacked; and forming a first source/drain trench and a second source/drain trench in the first fin structure, and forming a third source/drain trench and a fourth source/drain trench in the second fin structure. The method further includes forming a first bottom dielectric layer in each of the first source/drain trench and the second source/drain trench; forming a first doped epitaxial layer over the first bottom dielectric layer in each of the first source/drain trench and the second source/drain trench; forming a second doped epitaxial layer in each of the third source/drain trench and the fourth source/drain trench; and forming a metal gate structure wrapped around each of the second semiconductor layers.

In some embodiments, the method further includes partially recessing the first semiconductor layers exposed in the first source/drain trench, the second source/drain trench, the third source/drain trench, and the fourth source/drain trench to form inner spacer recesses; and forming inner spacers in the inner spacer recesses.

In some embodiments, the first source/drain trench, the second source/drain trench, the third source/drain trench, and the fourth source/drain trench extend into the well region.

In some embodiments, the method further includes before forming the first bottom dielectric layer, forming a first undoped epitaxial layer in each of the first source/drain trench and the second source/drain trench; and before forming the second doped epitaxial layer, forming a second undoped epitaxial layer in each of the third source/drain trench and the fourth source/drain trench.

In some embodiments, the method further includes before forming the second doped epitaxial layer, forming a second bottom dielectric layer on the second undoped epitaxial layer in the fourth source/drain trench, such that the second bottom dielectric layer is sandwiched between the second undoped epitaxial layer and the second doped epitaxial layer.

In some embodiments, the method further includes before forming the second doped epitaxial layer, forming a second bottom dielectric layer in the fourth source/drain trench; and forming an undoped layer on the second bottom dielectric layer, such that the undoped layer is sandwiched between the second bottom dielectric layer and the second doped epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a well region, disposed in the substrate;
first nanostructures, suspended over and vertically arranged over the well region;
second nanostructures, suspended over and vertically arranged over the well region;
a gate structure, extending across the well region, and wrapped around each of the first nanostructures and each of the second nanostructures;
a first source/drain feature and a second source/drain feature, attached to opposite sides of the first nanostructures, wherein each of the first source/drain feature and the second source/drain feature comprises a first bottom dielectric layer over the well region and a first doped epitaxial layer over the first bottom dielectric layer; and
a third source/drain feature and a fourth source/drain feature, attached to opposite sides of the second nanostructures, wherein each of the third source/drain feature and the fourth source/drain feature comprises a second doped epitaxial layer over the well region.

2. The semiconductor structure of claim 1,
wherein the well region is an n-type well region;
wherein the first doped epitaxial layer is an n-type doped epitaxial layer; and
wherein the second doped epitaxial layer is a p-type doped epitaxial layer.

3. The semiconductor structure of claim 1, wherein a top surface of the first bottom dielectric layer is lower than a bottom surface of a bottommost one of the first nanostructures and higher than a top surface of the well region.

4. The semiconductor structure of claim 1, wherein the first bottom dielectric layer extends into the well region and is in direct contact with the well region.

5. The semiconductor structure of claim 1, wherein each of the first source/drain feature and the second source/drain feature further comprises an air gap sandwiched between the first bottom dielectric layer and the first doped epitaxial layer.

6. The semiconductor structure of claim 1, wherein the second doped epitaxial layer of the third source/drain feature extends into the well region and is in direct contact with the well region.

7. The semiconductor structure of claim 6, wherein the fourth source/drain feature further comprises a second bottom dielectric layer sandwiched between the second doped epitaxial layer and the well region.

8. The semiconductor structure of claim 7, wherein the fourth source/drain feature further comprises a second air gap sandwiched between the second doped epitaxial layer and the second bottom dielectric layer.

9. A semiconductor structure, comprising:
a substrate; and
a first complementary metal-oxide-semiconductor (CMOS) device, comprising a first transistor and a second transistor formed on an n-type well region of the substrate,
wherein the first transistor comprises:
a first vertical stack comprising first nanostructures, wherein the first nanostructures are suspended over the n-type well region;
a first gate structure, wrapped around each of the first nanostructures; and
a first source/drain feature and a second source/drain feature, attached to opposite sides of the first nanostructures, wherein each of the first source/drain feature and the second source/drain feature comprises a first bottom dielectric layer and a first doped epitaxial layer over the first bottom dielectric layer;
wherein the second transistor comprises:
a second vertical stack comprising second nanostructures, wherein the second nanostructures are suspended over the n-type well region;
a second gate structure, wrapped around each of the second nanostructures and engaging with the first gate structure; and
a third source/drain feature and a fourth source/drain feature, attached to opposite sides of the second nanostructures, wherein each of the third source/drain feature and the fourth source/drain feature comprises a second doped epitaxial layer.

10. The semiconductor structure of claim 9, wherein a top surface of the first bottom dielectric layer is lower than a bottom surface of a bottommost one of the first nanostructures and higher than a top surface of the n-type well region.

11. The semiconductor structure of claim 9, wherein each of the first source/drain feature and the second source/drain feature further comprises an air gap sandwiched between the first bottom dielectric layer and the first doped epitaxial layer.

12. The semiconductor structure of claim 9,
wherein each of the first source/drain feature and the second source/drain feature further comprises a first undoped epitaxial layer below the first bottom dielectric layer; and
wherein each of the third source/drain feature and the fourth source/drain feature further comprises a second undoped epitaxial layer below the second doped epitaxial layer.

13. The semiconductor structure of claim 12, wherein the first undoped epitaxial layer and the second undoped epitaxial layer extend into the n-type well region and is in direct contact with the n-type well region.

14. The semiconductor structure of claim 9, wherein the fourth source/drain feature further comprises a second bottom dielectric layer extending into the n-type well region, and an undoped layer sandwiched between the second bottom dielectric layer and the second doped epitaxial layer.

15. The semiconductor structure of claim 9, further comprising:

a second CMOS device, comprising a third transistor and a fourth transistor formed on the n-type well region of the substrate, wherein the third transistor comprises:

a third vertical stack comprising third nanostructures, wherein the third nanostructures are suspended over the n-type well region;

a third gate structure, wrapped around each of the third nanostructures; and the second source/drain feature and a fifth source/drain feature, attached to opposite sides of the third nanostructures, wherein each of the first source/drain feature, the second source/drain feature, and the fifth source/drain feature comprises a first undoped epitaxial layer, the first bottom dielectric layer, and the first doped epitaxial layer;

wherein the fourth transistor comprises:

a fourth vertical stack comprising fourth nanostructures, wherein the fourth nanostructures are suspended over the n-type well region;

a fourth gate structure, wrapped around each of the fourth nanostructures and engaging with the first third structure; and the fourth source/drain feature and a sixth source/drain feature, attached to opposite sides of the fourth nanostructures, wherein each of the third source/drain feature, the fourth source/drain feature, and the sixth source/drain feature comprises a second undoped epitaxial layer and the second doped epitaxial layer.

16. The semiconductor structure of claim 15, wherein the fourth source/drain feature is coupled to the fifth source/drain feature, and the semiconductor device further comprises:

a first metal conductor, coupled to the first source/drain feature; and a second metal conductor, coupled to the third source/drain feature and the sixth source/drain feature.

17. A semiconductor structure, comprising:

a first circuit, comprising:

a first n-type well region;

a first vertical stack comprising first nanostructures and a second vertical stack comprising second nanostructures, suspended over the first n-type well region;

a first gate structure wrapped around each of the first nanostructures and a second gate structure wrapped around each of the second nanostructures, wherein the first gate structure is engaged with the second gate structure;

a first source/drain feature and a second source/drain feature, attached to opposite sides of the first nanostructures, wherein each of the first source/drain feature and the second source/drain feature comprises a first bottom dielectric layer over the first n-type well region and a first doped epitaxial layer over the first bottom dielectric layer; and a third source/drain feature and a fourth source/drain feature, attached to opposite sides of the second nanostructures, wherein each of the third source/drain feature and the fourth source/drain feature comprises a second doped epitaxial layer over the first n-type well region.

18. The semiconductor structure of claim 17, further comprising:

a second circuit, comprising:

a p-type well region and a second n-type well region;

a third vertical stack comprising third nanostructures, suspended over the p-type well region;

a fourth vertical stack comprising fourth nanostructures, suspended over the second n-type well region;

a third gate structure wrapped around each of the third nanostructures and a fourth gate structure wrapped around each of the fourth nanostructures;

a fifth source/drain feature and a sixth source/drain feature, attached to opposite sides of the third nanostructures, wherein each of the fifth source/drain feature and the sixth source/drain feature comprises the first bottom dielectric layer over the p-type well region and the first doped epitaxial layer over the first bottom dielectric layer; and a seventh source/drain feature and an eighth source/drain feature, attached to opposite sides of the fourth nanostructures, wherein each of the seventh source/drain feature and the eighth source/drain feature comprises the second doped epitaxial layer over the second n-type well region.

19. The semiconductor structure of claim 18, wherein the first doped epitaxial layer is an n-type doped epitaxial layer; and wherein the second doped epitaxial layer is a p-type doped epitaxial layer.

20. The semiconductor structure of claim 19, wherein each of the first source/drain feature, the second source/drain feature, the fifth source/drain feature, and the sixth source/drain feature further comprises an air gap sandwiched between the first bottom dielectric layer and the first doped epitaxial layer.

* * * * *